US012610611B2

(12) United States Patent
Tsai et al.

(10) Patent No.: US 12,610,611 B2
(45) Date of Patent: Apr. 21, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Ya-Yi Tsai, Hsinchu (TW); Sheng-Yi Hsiao, Hsinchu (TW); Shu-Yuan Ku, Hsinchu (TW); Ryan Chia-Jen Chen, Hsinchu (TW); Tzu-Ging Lin, Kaohsiung (TW); Jih-Jse Lin, Taipei (TW); Yih-Ann Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 529 days.

(21) Appl. No.: 18/097,255

(22) Filed: Jan. 15, 2023

(65) Prior Publication Data

US 2023/0402455 A1     Dec. 14, 2023

Related U.S. Application Data

(60) Provisional application No. 63/408,576, filed on Sep. 21, 2022, provisional application No. 63/342,632, filed on May 17, 2022.

(51) Int. Cl.
| | |
|---|---|
| *H10D 84/83* | (2025.01) |
| *H10D 30/01* | (2025.01) |
| *H10D 30/62* | (2025.01) |
| *H10D 64/01* | (2025.01) |
| *H10D 84/01* | (2025.01) |
| *H10D 84/03* | (2025.01) |

(52) U.S. Cl.
CPC ......... *H10D 84/834* (2025.01); *H10D 30/024* (2025.01); *H10D 30/6211* (2025.01); *H10D 64/017* (2025.01); *H10D 84/0151* (2025.01); *H10D 84/0158* (2025.01); *H10D 84/038* (2025.01)

(58) Field of Classification Search
CPC ........... H10D 84/0151; H10D 84/0188; H10D 30/024; H10D 30/6211; H10D 84/834; H10D 84/0158
See application file for complete search history.

(56) References Cited

U.S. PATENT DOCUMENTS 11,114,549 B2     9/2021   Chen et al.
2019/0305099 A1*  10/2019  Jo ..................... H01L 21/76224
(Continued)

OTHER PUBLICATIONS

U.S. Appl. No. 17/837,833, filed Jun. 10, 2022.

*Primary Examiner* — Tuan A Hoang
(74) *Attorney, Agent, or Firm* — NZ Carr Law Office

(57) ABSTRACT

A semiconductor device structure, along with methods of forming such, are described. The structure includes a fin disposed over a semiconductor substrate, and the fin has a first width. The structure further includes an isolation region disposed around the fin, a gate electrode disposed over the fin and the isolation region, and a fill material disposed in the gate electrode. The fill material is in contact with a top surface of a portion of the semiconductor substrate, the top surface has at least a portion having a substantially flat cross-section, and the portion of the top surface has a second width substantially greater than the first width.

20 Claims, 61 Drawing Sheets

(56) References Cited

U.S. PATENT DOCUMENTS

| | | | |
|---|---|---|---|
| 2020/0044070 A1* | 2/2020 | Wang ..................... | H10D 30/62 |
| 2020/0176318 A1* | 6/2020 | Jang .................. | H01L 21/76224 |
| 2021/0165137 A1* | 6/2021 | Raymond ............ | G02B 5/0268 |

* cited by examiner

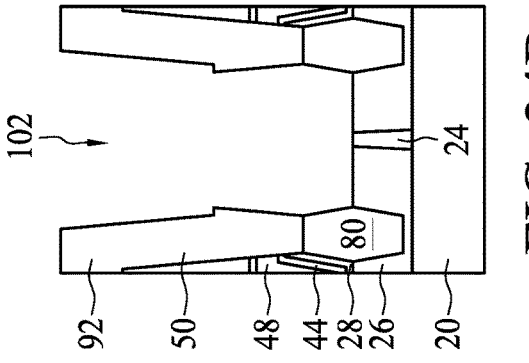
FIG. 24A
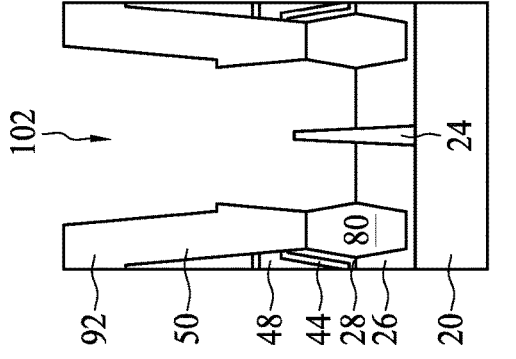
FIG. 24B
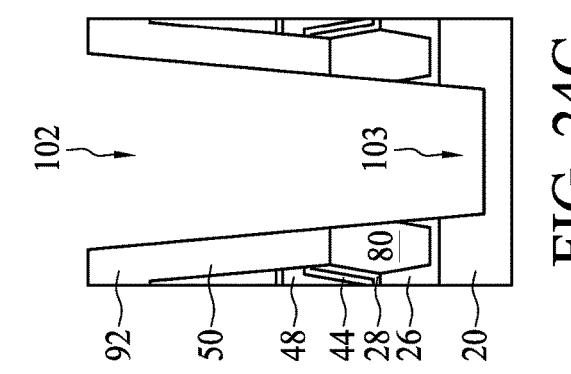
FIG. 24C
FIG. 24D

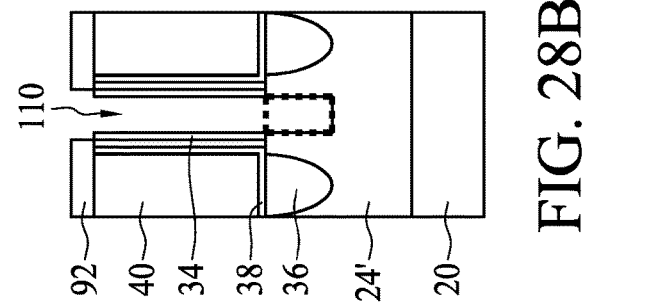
FIG. 28B
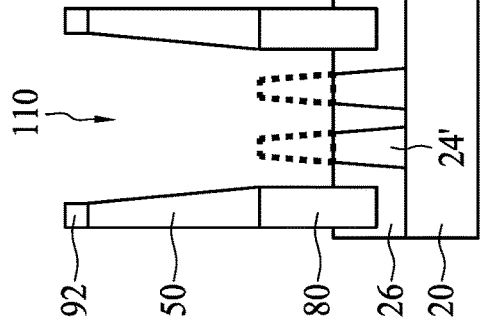
FIG. 28A
FIG. 29B
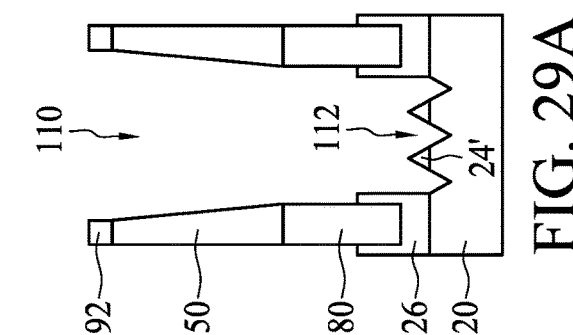
FIG. 29A

SEMICONDUCTOR DEVICE STRUCTURE AND METHODS OF FORMING THE SAME

CROSS-REFERENCE TO RELATED APPLICATIONS

This application claims priority to U.S. Provisional Application Ser. No. 63/342,632 filed May 17, 2022 and U.S. Provisional Application Ser. No. 63/408,579 filed Sep. 21, 2022, which are incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 2, 3A-B, 4A-D, 5A-C, 6A-C, 7A-C, 8A-C, 9A-C, 10A-C, 11A-C, 12A-C, 13A-C, 14A-C, 15A-C, and 16A-C are various views of respective intermediate structures at intermediate stages in an example process of forming a semiconductor device structure including one or more FinFETs, in accordance with some embodiments.

FIGS. 17A-21A are perspective views of respective intermediate structures at intermediate stages in an example process of forming a semiconductor device structure including one or more FinFETs, in accordance with some embodiments.

FIGS. 17B-21B are cross-sectional views of respective intermediate structures at intermediate stages in the example process of FIGS. 17A-21A, in accordance with some embodiments.

FIGS. 17C-21C are cross-sectional views of respective intermediate structures at intermediate stages in the example process of FIGS. 17A-21A, in accordance with some embodiments.

FIGS. 24A-D are cross-sectional views of respective intermediate structures at intermediate stages in the example process of FIGS. 17A-21A, in accordance with alternative embodiments.

FIGS. 26A-29A are cross-sectional views of respective intermediate structures at intermediate stages in an example process, in accordance with some embodiments.

FIGS. 26B-29B are cross-sectional views of respective intermediate structures at intermediate stages in the example process of FIGS. 26A-29A, in accordance with some embodiments.

DETAILED DESCRIPTION

Figures 1, 2:
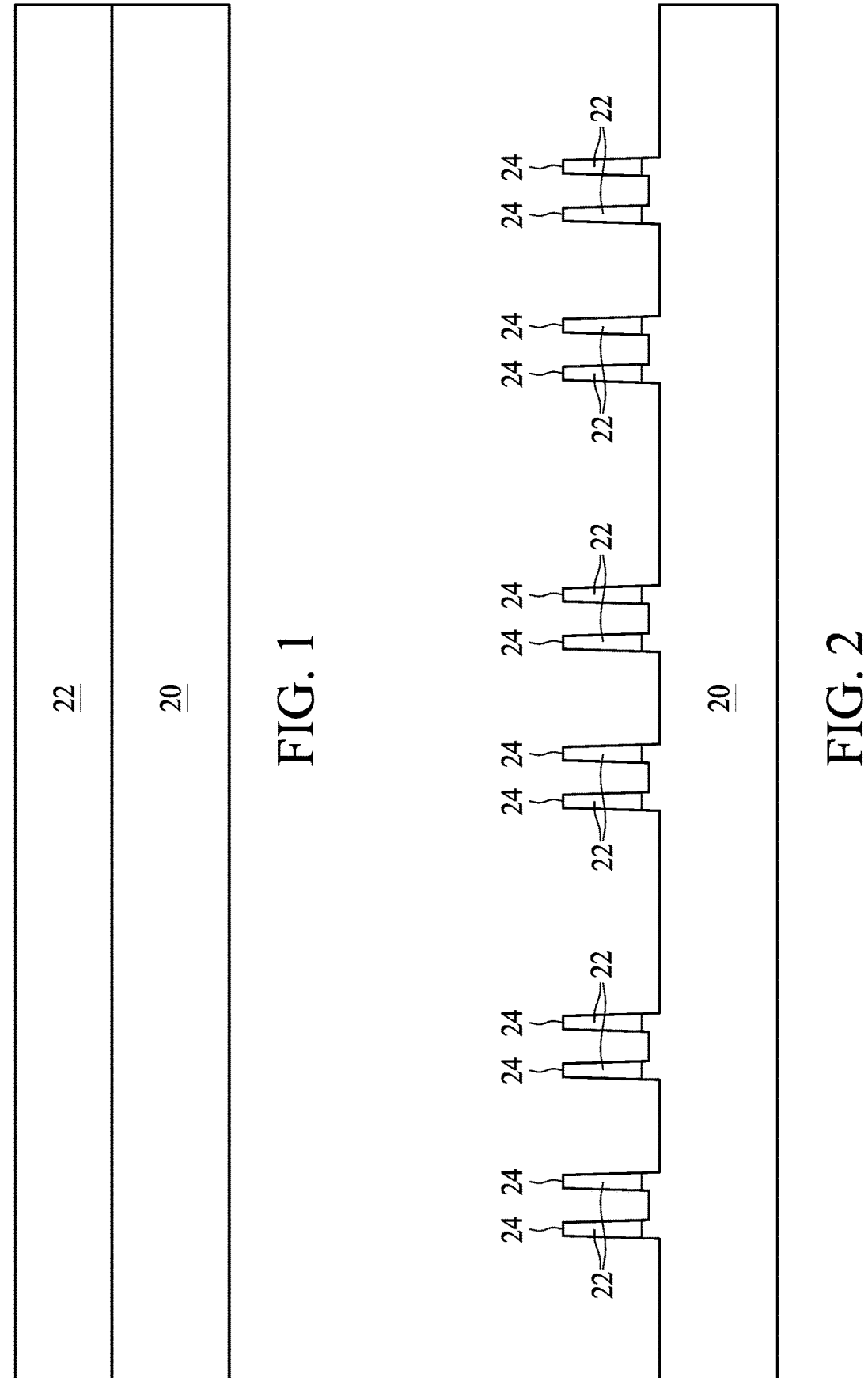

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Methods of cutting fins in a semiconductor device structure, such as Fin Field-Effect Transistors (FinFETs), are described herein. Generally, a fin cut process is performed after a dummy gate or a replacement gate structure has been formed and cut. The fin cut process can include removing one or more fins, the isolation region disposed around the fins, and the portion of a semiconductor substrate located under the isolation region. By removing the portion of the semiconductor substrate located under the isolation region around the one or more fins, current leakage via the portion of the semiconductor substrate is substantially reduced.

Example embodiments described herein are described in the context of FinFETs. Implementations of some aspects of the present disclosure may be used in other processes and/or in other devices. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

In some instances, in the described embodiments, various losses, e.g., in height, to the illustrated structures may occur during processing. These losses may not be expressly shown in the figures or described herein, but a person having ordinary skill in the art will readily understand how such losses may occur. Such losses may occur as a result of a planarization process such as a chemical mechanical polish (CMP), an etch process when, for example, the structure realizing the loss is not the primary target of the etching, and other processes.

FIGS. 1, 2, 3A-B, 4A-D, and 5A-C through 16A-C are various views of respective intermediate structures during intermediate stages in an example process of forming a semiconductor device structure including one or more Fin-FETs, in accordance with some embodiments. FIG. 1 illustrates, in a cross-sectional view, a semiconductor substrate 20 with a stressed semiconductor layer 22 formed thereover. The semiconductor substrate 20 may be or include a bulk semiconductor substrate, a semiconductor-on-insulator (SOI) substrate, or the like, which may be doped (e.g., with a p-type or an n-type dopant) or undoped. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor substrate may include an elemental semiconductor such as silicon (Si) and germanium (Ge); a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or a combination thereof.

The stressed semiconductor layer 22 can have a compressive stress or a tensile stress. In some examples, the stressed semiconductor layer 22 is stressed as a result of heteroepitaxial growth on the semiconductor substrate 20. For example, heteroepitaxial growth generally includes epitaxially growing a grown material having a natural lattice constant that is different from the lattice constant of the substrate material at the surface on which the grown material is epitaxially grown. Pseudomorphically growing the grown material on the substrate material can result in the grown material having a stress. If the natural lattice constant of the grown material is greater than the lattice constant of the substrate material, the stress in the grown material can be compressive, and if the natural lattice constant of the grown material is less than the lattice constant of the substrate material, the stress in the grown material can be tensile. For example, pseudomorphically growing SiGe on relaxed silicon can result in the SiGe having a compressive stress, and pseudomorphically growing SiC on relaxed silicon can result in the SiC having a tensile stress.

The stressed semiconductor layer 22 can be or include silicon, silicon germanium ($Si_{1-x}Ge_x$, where x can be between approximately 0 and 100), silicon carbide, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. Further, the stressed semiconductor layer 22 can be epitaxially grown using metal-organic chemical vapor deposition (MOCVD), molecular beam epitaxy (MBE), liquid phase epitaxy (LPE), vapor phase epitaxy (VPE), selective epitaxial growth (SEG), the like, or a combination thereof on the semiconductor substrate 20. A thickness of the stressed semiconductor layer 22 can be in a range from about 30 nm to about 50 nm.

FIG. 2 illustrates, in a cross-sectional view, the formation of fins 24 in the stressed semiconductor layer 22 and/or semiconductor substrate 20. In some examples, a mask (e.g., a hard mask) is used in forming the fins 24. For example, one or more mask layers are deposited over the stressed semiconductor layer 22, and the one or more mask layers are then patterned into the mask. In some examples, the one or more mask layers may include or be silicon nitride, silicon oxynitride, silicon carbide, silicon carbon nitride, the like, or a combination thereof, and may be deposited by chemical vapor deposition (CVD), physical vapor deposition (PVD), atomic layer deposition (ALD), or another deposition technique. The one or more mask layers may be patterned using photolithography. For example, a photo resist can be formed on the one or more mask layers, such as by using spin-on coating, and patterned by exposing the photo resist to light using an appropriate photomask. Exposed or unexposed portions of the photo resist may then be removed depending on whether a positive or negative resist is used. The pattern of the photo resist may then be transferred to the one or more mask layers, such as by using a suitable etch process, which forms the mask. The etch process may include a reactive ion etch (RIE), neutral beam etch (NBE), inductive coupled plasma (ICP) etch, the like, or a combination thereof. The etch process may be anisotropic. Subsequently, the photo resist is removed in an ashing or wet strip processes, for example.

Using the mask, the stressed semiconductor layer 22 and/or semiconductor substrate 20 may be etched such that trenches are formed between neighboring pairs of fins 24 and such that the fins 24 protrude from the semiconductor substrate 20. In some embodiments, each fin 24 has a height ranging from about 115 nm to about 120 nm. The etch process may include a RIE, NBE, ICP etch, the like, or a combination thereof. The etch process may be anisotropic. The trenches may be formed to a depth in a range from about 80 nm to about 150 nm from the top surface of the stressed semiconductor layer 22. In some embodiments, the trench between a pair of fins 24 may be substantially shallower than the trench between neighboring pairs of fins 24 due to the loading effect, as shown in FIG. 2. In some embodiments where the trenches have different depths, the different depths may not be explicitly illustrated.

Although examples described herein are in the context of stress engineering for the fins 24 (e.g., the fins 24 include respective portions of the stressed semiconductor layer 22), other examples may not implement such stress engineering. For example, the fins 24 may be formed from a bulk semiconductor substrate (e.g., semiconductor substrate 20) without a stressed semiconductor layer. Also, the stressed semiconductor layer 22 may be omitted from subsequent figures; this is for clarity of the figures. In some embodiments where such a stress semiconductor layer is implemented for stress engineering, the stressed semiconductor layer 22 may be present as part of the fins 24 even if not explicitly illustrated; and in some embodiments where such a stress semiconductor layer is not implemented for stress engineering, the fins 24 may be formed from the semiconductor substrate 20.

Figure 3A:
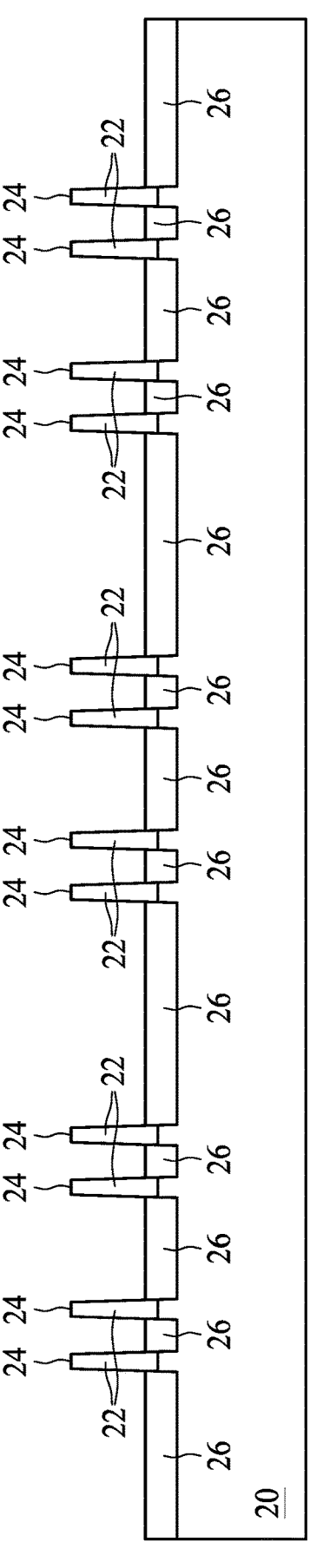
Figure 3B:
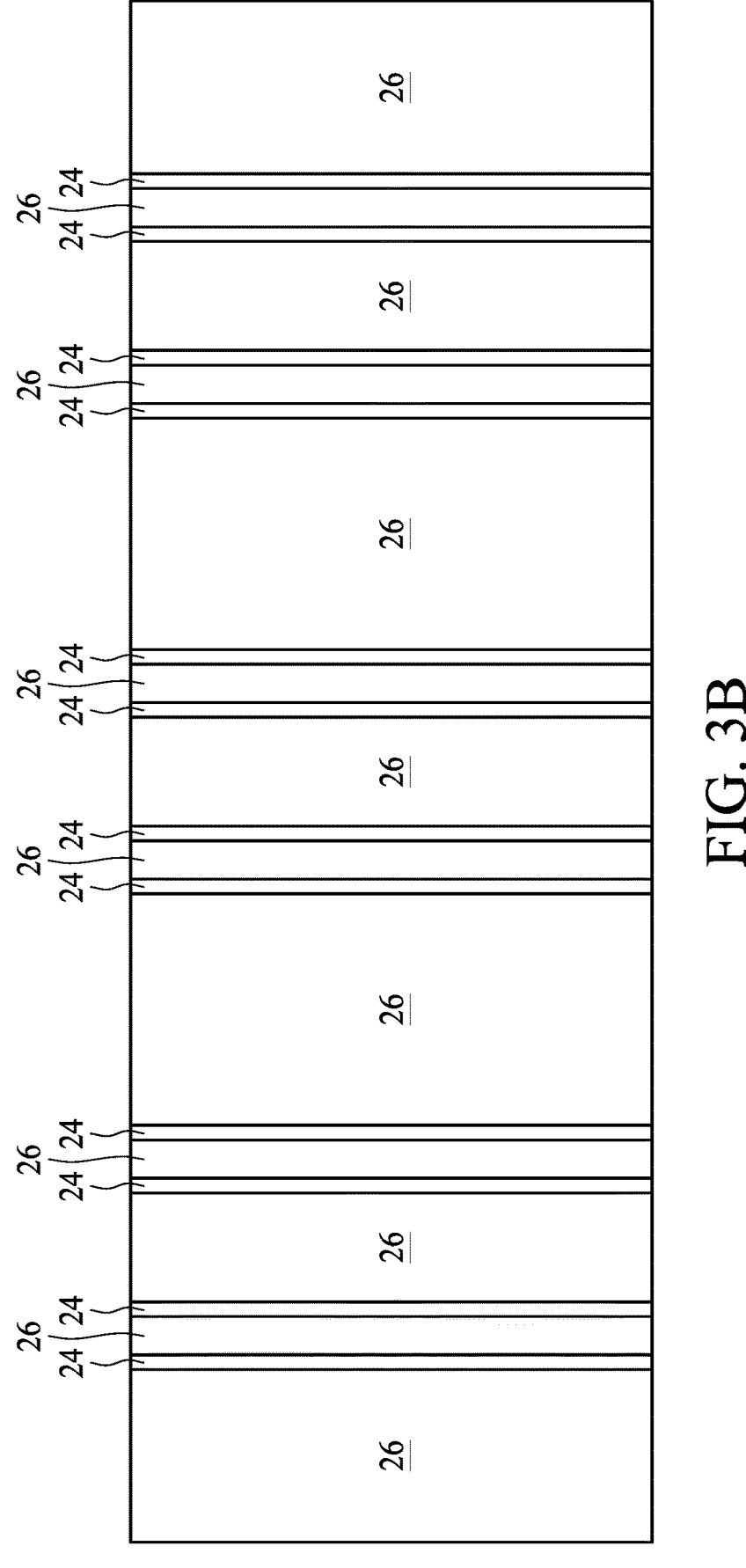

FIGS. 3A and 3B illustrate, in a cross-sectional view and top view, respectively, the formation of isolation regions 26, each in a corresponding trench. The isolation regions 26 may include or be an insulating material, such as an oxide (such as silicon oxide), a nitride, the like, or a combination thereof, and the insulating material may be formed by a high density plasma CVD (HDP-CVD), a flowable CVD (FCVD) (e.g., a CVD-based material deposition in a remote plasma system and post curing to make it convert to another material, such as an oxide), the like, or a combination thereof. Other insulating materials formed by any acceptable process may be used. In the illustrated embodiment, the isolation regions 26 include silicon oxide that is formed by a FCVD process. A planarization process, such as a CMP, may remove any excess insulating material and any remaining mask (e.g., used to form the trenches and the fins 24) to form coplanar top surfaces of the insulating material and the fins 24. The insulating material may then be recessed to form the isolation regions 26. The insulating material is recessed such that the fins 24 protrude from between neighboring isolation regions 26, which may, at least in part, thereby delineate the fins 24 as active areas on the semiconductor substrate 20. The insulating material may be recessed using an acceptable dry or wet etch process, such as one that is selective to the material of the insulating material. Further, top surfaces of the isolation regions 26 may have a flat surface as illustrated, a convex surface, a concave surface (such as dishing), or a combination thereof, which may result from an etch process. As illustrated in the top view of FIG. 3B, the fins 24 extend longitudinally across the semiconductor substrate 20. The fins 24 may have a height in a range from about 30 nm to about 50 nm from top surfaces of respective neighboring isolation regions 26. For example, the interface between the stressed semiconductor layer 22 and the semiconductor substrate 20 corresponding to each fin 24 can be below top surfaces of the isolation regions 26.

A person having ordinary skill in the art will readily understand that the processes described with respect to FIGS. 1 through 3A-B are just examples of how fins 24 may be formed. In other embodiments, a dielectric layer can be formed over a top surface of the semiconductor substrate 20; trenches can be etched through the dielectric layer; homoepitaxial structures can be epitaxially grown in the trenches (e.g., without stress engineering); and the dielectric layer can be recessed such that the homoepitaxial structures protrude from the dielectric layer to form fins. In still other embodiments, heteroepitaxial structures can be used for the fins. For example, the fins 24 can be recessed (e.g., after planarizing the insulating material of the isolation regions 26 and before recessing the insulating material), and a material different from the fins may be epitaxially grown in their place. In an even further embodiment, a dielectric layer can be formed over a top surface of the semiconductor substrate 20; trenches can be etched through the dielectric layer; heteroepitaxial structures can be epitaxially grown in the trenches using a material different from the semiconductor substrate 20 (e.g., with stress engineering); and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. Still further, it may be advantageous to epitaxially grow a material for an n-type device different from the material in for a p-type device.

Figure 4A:
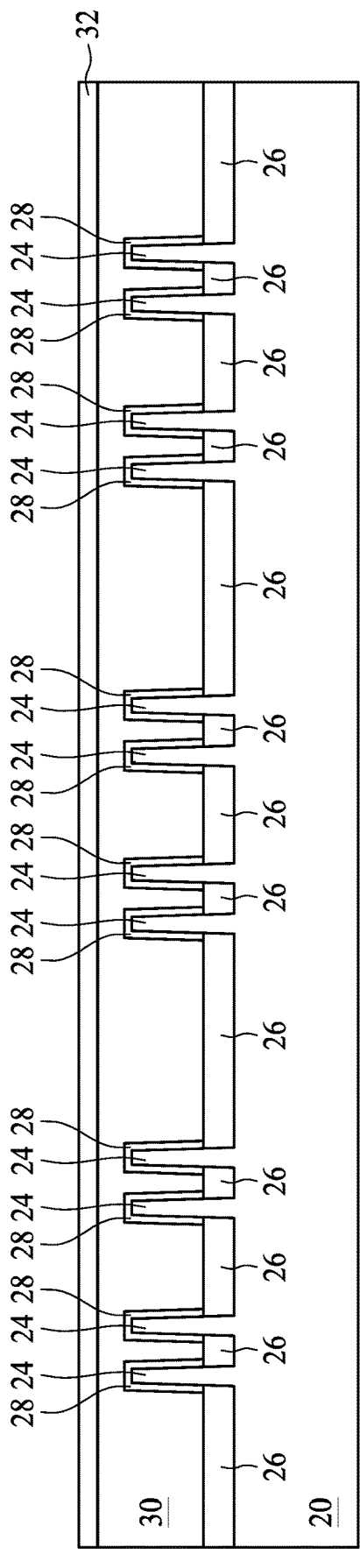
Figure 4B:
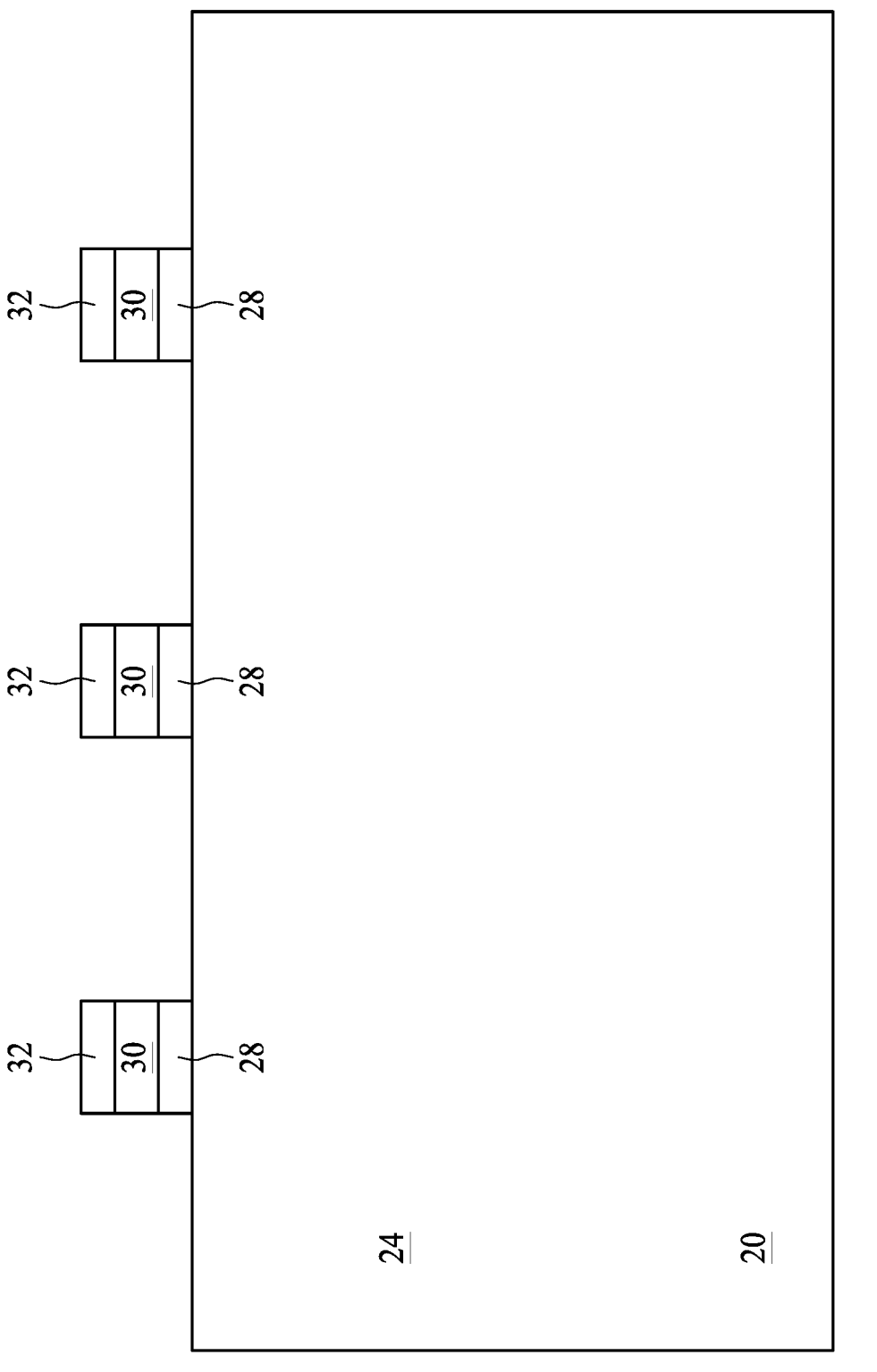
Figure 4C:
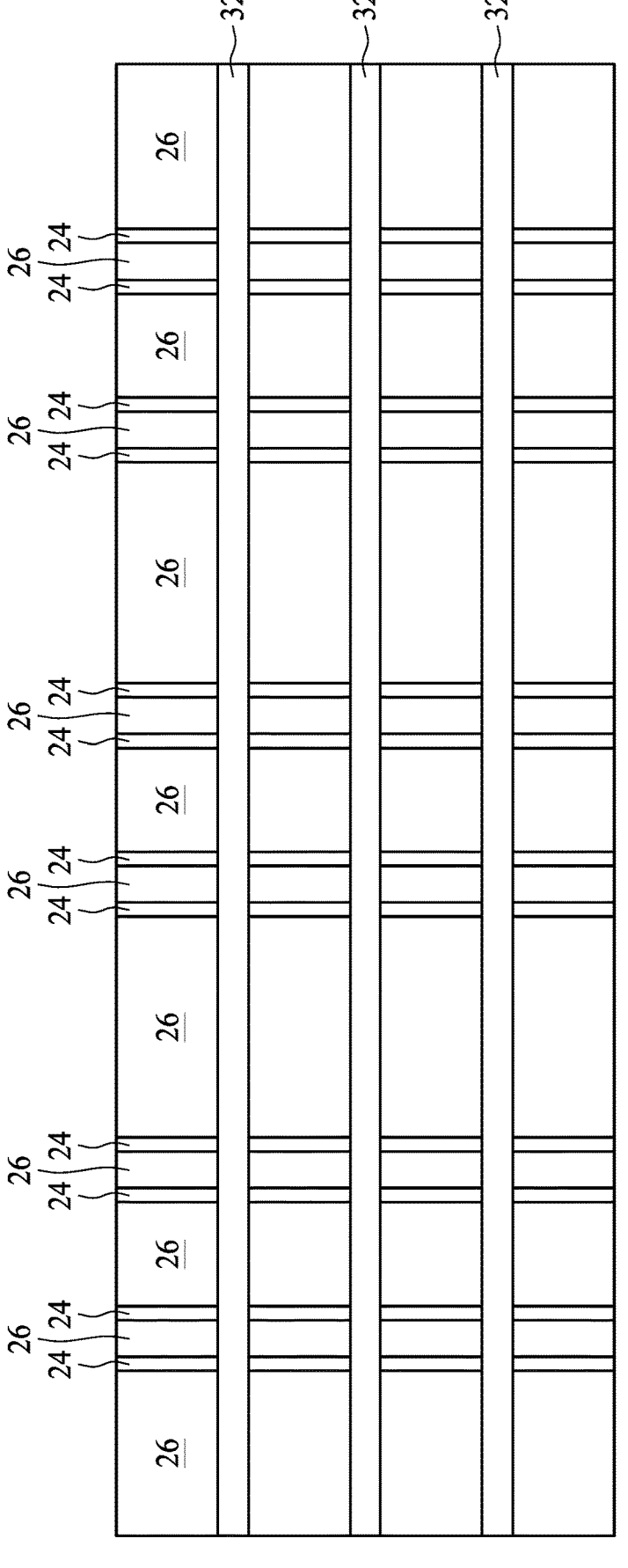
Figure 4D:
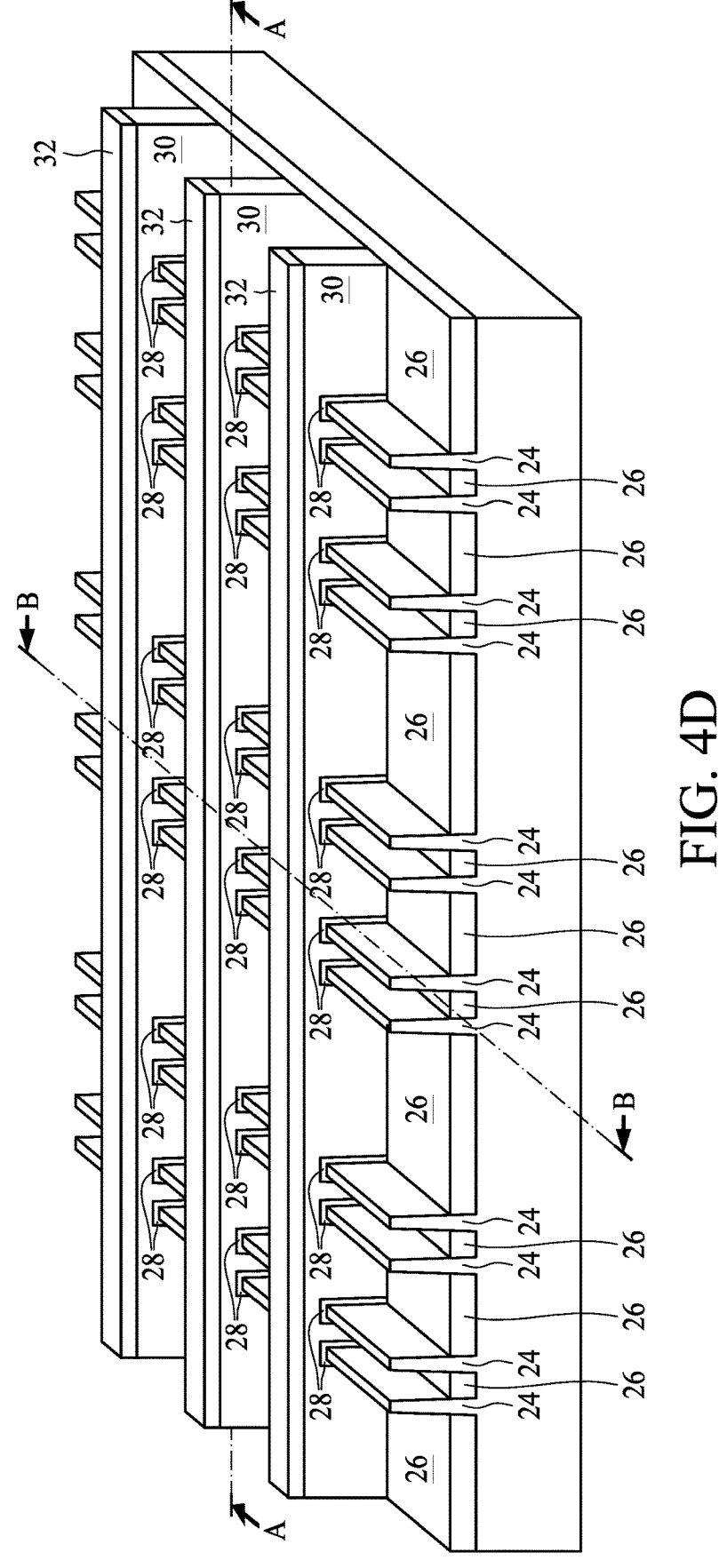

FIGS. 4A, 4B, 4C and 4D illustrate the formation of dummy gate stacks on the fins 24. FIGS. 4A and 4B illustrate cross-sectional views; FIG. 4C illustrates a top view; and FIG. 4D illustrates a perspective view. FIG. 4D illustrates cross-sections A-A and B-B. FIGS. 1, 2, 3A, 4A, and the following figures (up to FIGS. 16A-C) ending with an "A" designation illustrate cross-sectional views at various instances of processing corresponding to cross-section A-A, and FIG. 4B and the following figures (up to FIGS. 16A-C) ending with a "B" designation illustrate cross-sectional views at various instances of processing corresponding to cross-section B-B. In some figures, some reference numbers of components or features illustrated therein may be omitted to avoid obscuring other components or features; this is for ease of depicting the figures.

The dummy gate stacks are over and extend laterally perpendicularly to the fins 24. Each dummy gate stack, or more generally, gate structure, includes one or more interfacial dielectrics 28, a dummy gate 30, and a mask 32. The one or more interfacial dielectrics 28, dummy gates 30, and mask 32 for the dummy gate stacks may be formed by sequentially forming respective layers, and then patterning those layers into the dummy gate stacks. For example, a layer for the one or more interfacial dielectrics 28 may include or be silicon oxide, silicon nitride, the like, or multilayers thereof, and may be thermally and/or chemically grown on the fins 24, as illustrated, or conformally deposited, such as by plasma-enhanced CVD (PECVD), ALD, or another deposition technique. A layer for the dummy gates 30 may include or be silicon (e.g., polysilicon) or another material deposited by CVD, PVD, or another deposition technique. A layer for the mask 32 may include or be silicon nitride, silicon oxynitride, silicon carbon nitride, the like, or a combination thereof, deposited by CVD, PVD, ALD, or another deposition technique. The layers for the mask 32, dummy gates 30, and one or more interfacial dielectrics 28 may then be patterned, for example, using photolithography and one or more etch processes, like described above, to form the mask 32, dummy gate 30, and one or more interfacial dielectrics 28 for each dummy gate stack.

In some embodiments, after forming the dummy gate stacks, lightly doped drain (LDD) regions (not specifically illustrated) may be formed in the fins 24. For example, dopants may be implanted into the fins 24 using the dummy gate stacks as masks. Example dopants for the LDD regions can include or be, for example, boron for a p-type device and phosphorus or arsenic for an n-type device, although other dopants may be used. The LDD regions may have a dopant concentration in a range from about $10^{15}$ cm$^{-1}$ to about $10^{17}$ cm$^{-3}$.

The cross-section A-A is along a gate stack through which a cut will be made in subsequent figures and description. The cross-section B-B is along a fin 24 (e.g., along a channel direction in the fin 24) through which a cut will be made in subsequent figures and description. Cross-sections A-A and B-B are perpendicular to each other.

Figure 5A:
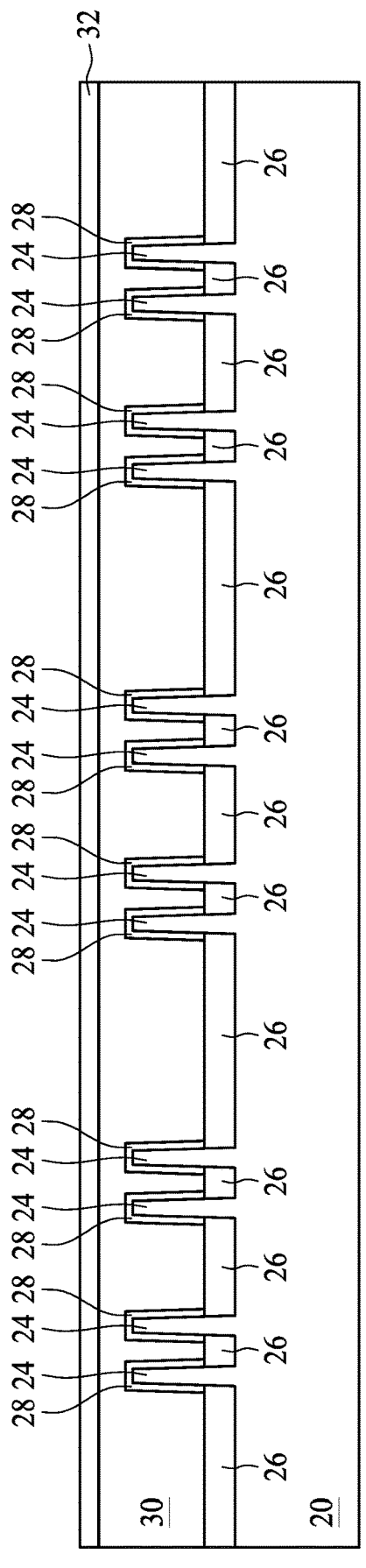
Figure 5B:
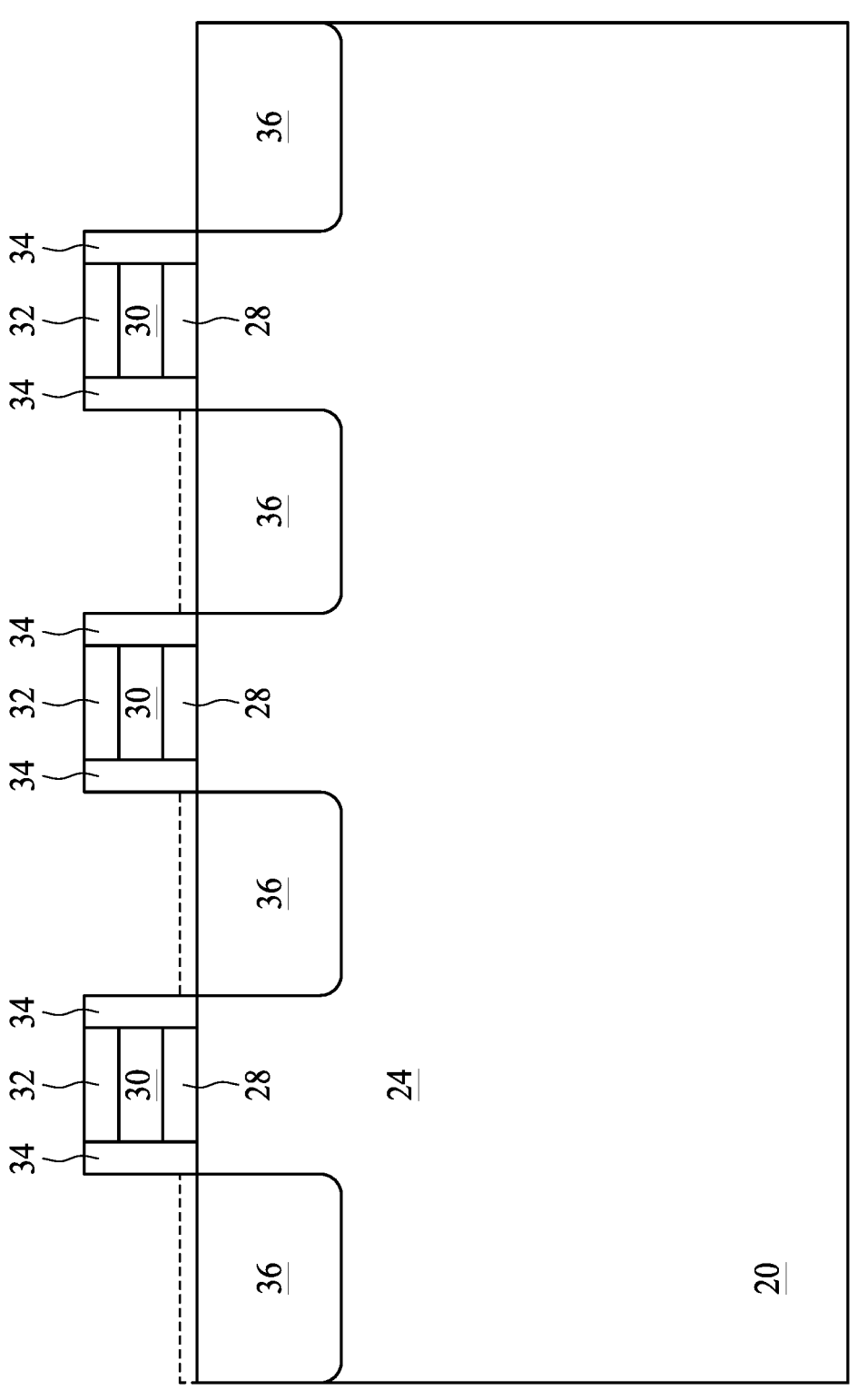
Figure 5C:
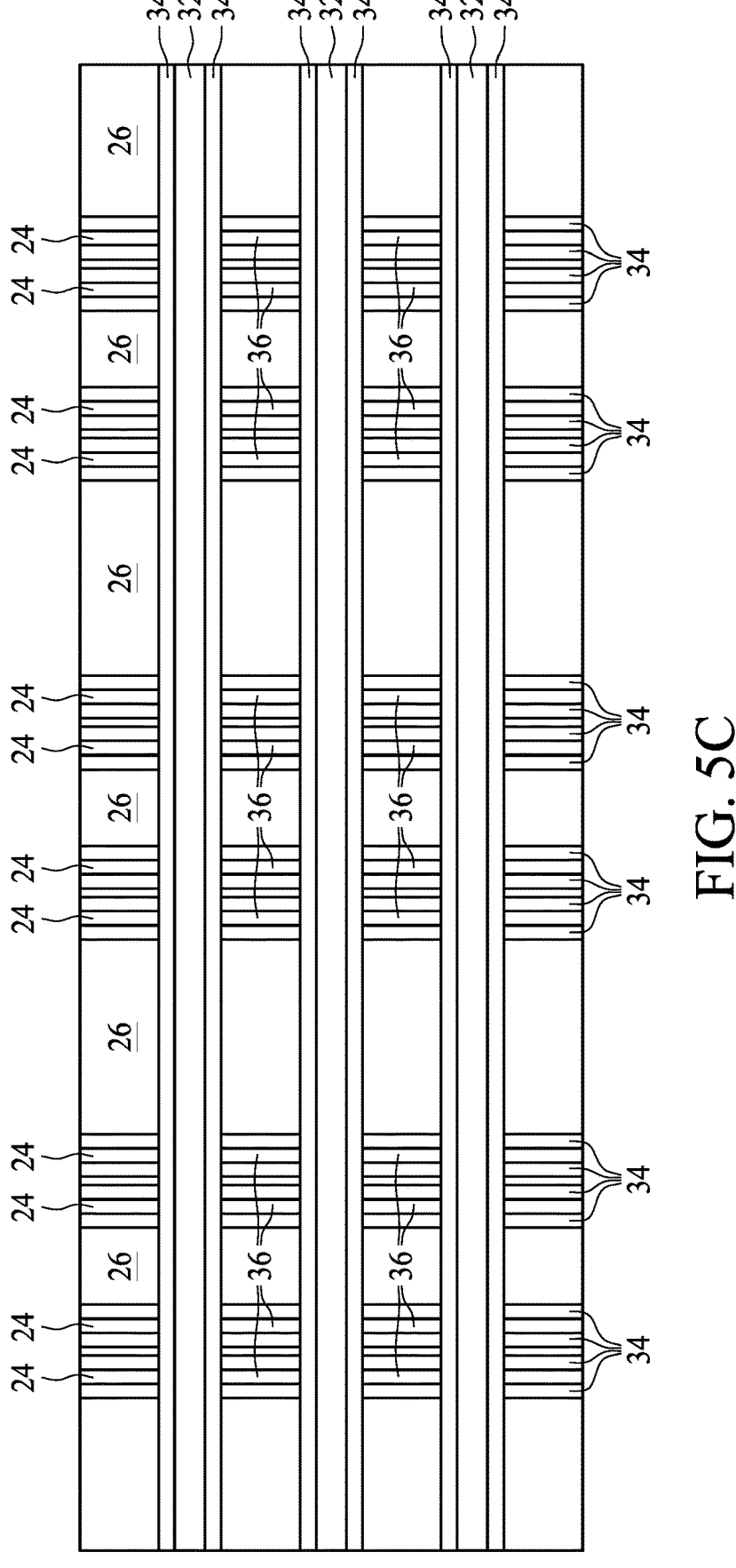

FIGS. 5A, 5B, and 5C illustrate the formation of gate spacers 34. Gate spacers 34 are formed along sidewalls of the dummy gate stacks (e.g., sidewalls of the one or more interfacial dielectrics 28, dummy gates 30, and masks 32) and over the fins 24. Additionally, residual gate spacers 34 may be formed along exposed sidewalls of the fins 24, as illustrated in the figures. The gate spacers 34 may be formed by conformally depositing one or more layers for the gate spacers 34 and anisotropically etching the one or more layers, for example. The one or more layers for the gate spacers 34 may include or be silicon nitride, silicon oxynitride, silicon carbon nitride, silicon oxycarbide, the like, multi-layers thereof, or a combination thereof, and the etch process can include a RIE, NBE, or another etch process.

Source/drain regions 36 are then formed in the fins 24. Recesses for source/drain regions are formed in the fins 24 on opposing sides of the dummy gate stacks. The recessing can be by an etch process. The etch process can be isotropic or anisotropic, or further, may be selective with respect to one or more crystalline planes of the stressed semiconductor layer 22 and/or semiconductor substrate 20. Hence, the recesses can have various cross-sectional profiles based on the etch process implemented. The etch process may be a dry etch process, such as a RIE, NBE, or the like, or a wet etch process, such as using tetramethyalammonium hydroxide (TMAH), ammonium hydroxide (NH$_4$OH), or another etchant. The recesses may extend to a depth in a range from about 0 nm to about 80 nm from respective top surfaces of the fins 24 into the fins 24. For example, the recesses may, in some instances, not extend below a level of top surfaces of neighboring isolation regions 26 and/or below the inter-face between the stressed semiconductor layer 22 and the semiconductor substrate 20; although in other instances, the recesses may extend below a level of top surfaces of neighboring isolation regions 26 and/or the interface.

Epitaxy source/drain regions 36 are formed in the recesses in the fins 24. The epitaxy source/drain regions 36 may include or be silicon germanium (Si$_{1-x}$Ge$_x$, where x can be between approximately 0 and 100), silicon carbide, silicon phosphorus, silicon carbon phosphorus, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. The epitaxy source/drain regions 36 may be formed in the recesses by epitaxially growing a material in the recesses, such as by MOCVD, MBE, LPE, VPE, SEG, the like, or a combination thereof. Due to blocking by the isolation regions 26 and/or residual gate spacers 34 depending on the depth of the recess in which the epitaxy source/drain region 36 is formed, epitaxy source/drain regions 36 may be first grown vertically in recesses, during which time the epitaxy source/drain regions 36 do not grow horizontally. After the recesses within the isolation regions 26 and/or residual gate spacers 34 are fully filled, the epitaxy source/drain regions 36 may grow both vertically and horizontally to form facets, which may correspond to crystalline planes of the semiconductor substrate 20. Epitaxy source/drain regions 36 may be raised in relation to the fin 24, as illustrated by dashed lines in FIG. 5B. In some examples, different materials are used for epitaxy source/drain regions for p-type devices and n-type devices. Appropriate masking during the recessing or epitaxial growth may permit different materials to be used in different devices. In this disclosure, a source region and a drain region are interchangeably used, and the structures thereof are substantially the same. Furthermore, source/drain region(s) may refer to a source or a drain, individually or collectively dependent upon the context.

Figure 6A:
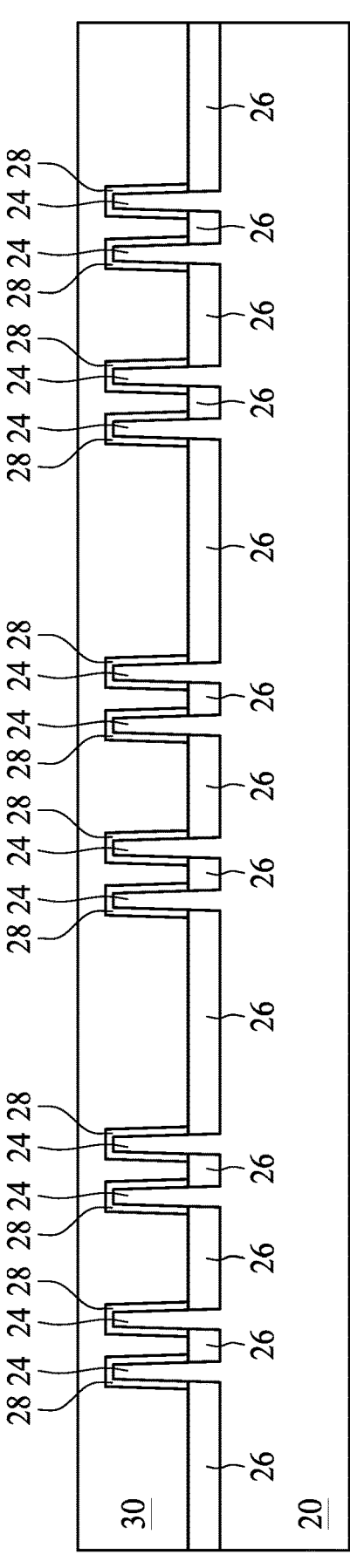
Figure 6B:
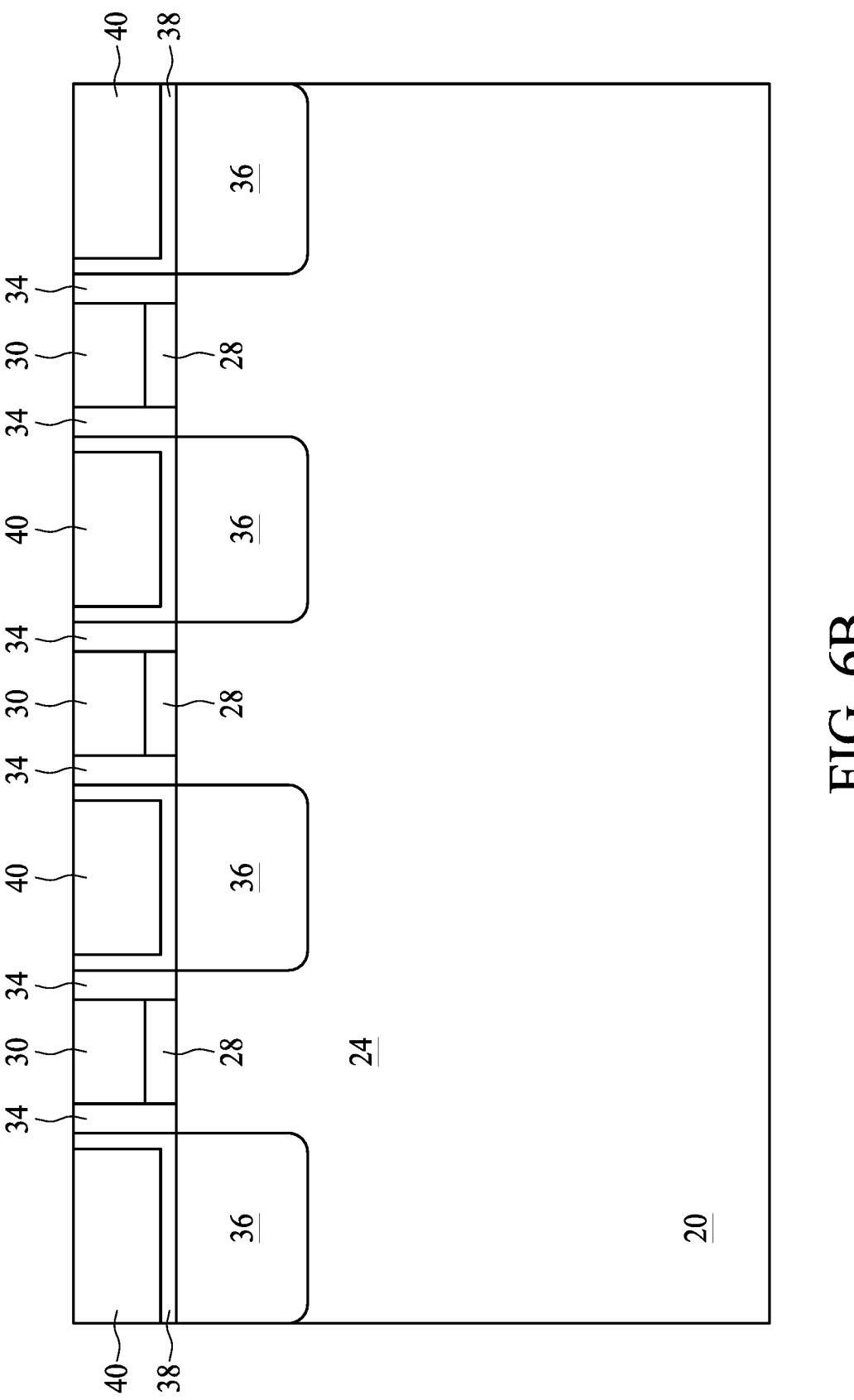
Figure 6C:
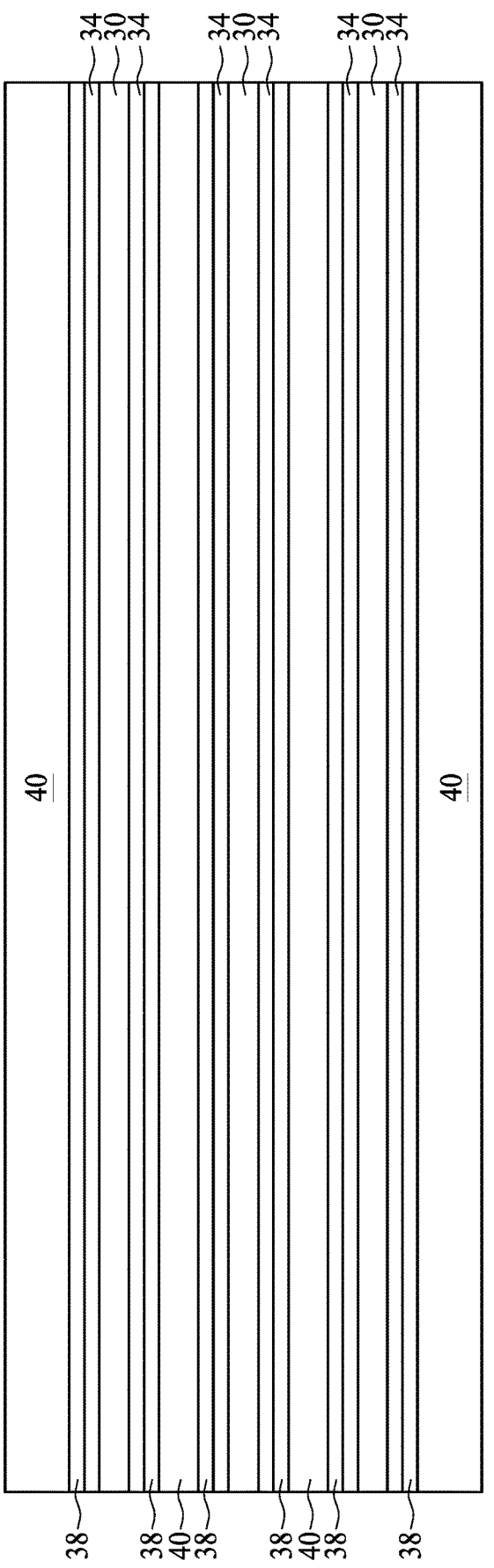

FIGS. 6A, 6B, and 6C illustrate the formation of a contact etch stop layer (CESL) 38 and an interlayer dielectric (ILD) 40. The CESL 38 may be conformally deposited over the fins 24, dummy gate stacks, gate spacers 34, and isolation regions 26. The CESL 38 may include or be silicon nitride, silicon carbon nitride, silicon carbon oxide, carbon nitride, the like, or a combination thereof, and may be deposited by CVD, PECVD, ALD, or another deposition technique. The ILD 40 is deposited over the CESL 38. The ILD 40 may include or be silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), SiOxCy, Spin-On-Glass, Spin-On-Polymers, silicon carbon material, a compound thereof, a composite thereof, the like, or a combination thereof. The ILD 40 may be deposited by spin-on, CVD, FCVD, PECVD, PVD, or another deposition technique.

The CESL 38 and ILD 40 are formed with top surfaces coplanar with top surfaces of the dummy gates 30. A planarization process, such as a CMP, may be performed to level the top surfaces of the ILD 40 and CESL 38 with the top surfaces of the dummy gates 30. The CMP may also remove the mask 32 (and, in some instances, upper portions of the gate spacers 34) on the dummy gates 30. Accordingly, top surfaces of the dummy gates 30 are exposed through the ILD 40 and CESL 38.

Figure 7A:
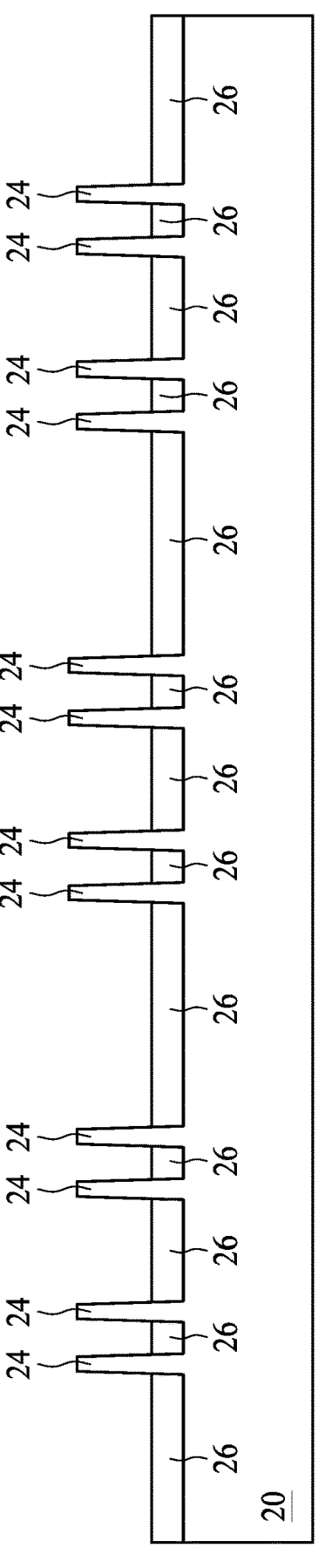
Figure 7B:
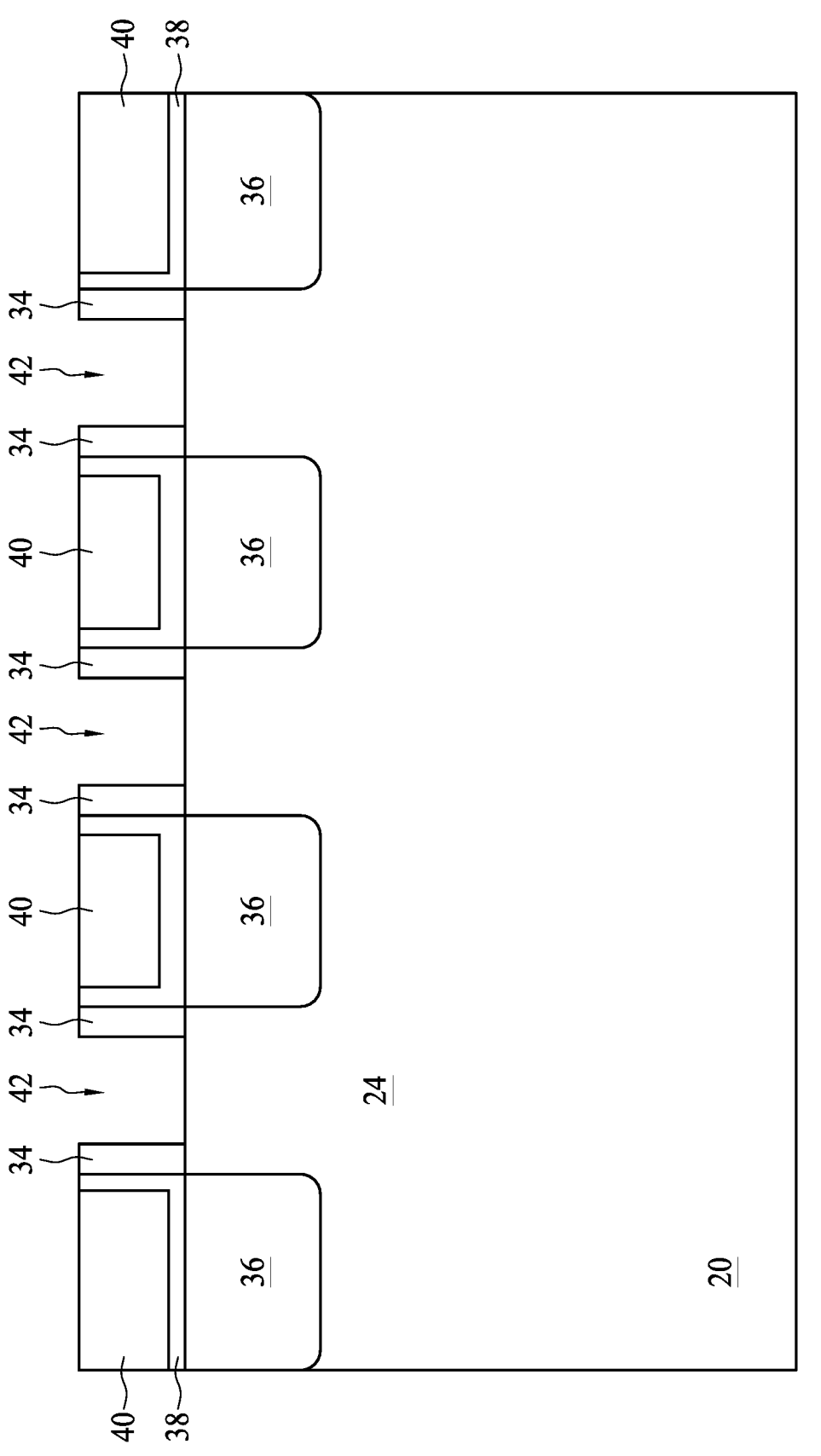
Figure 7C:
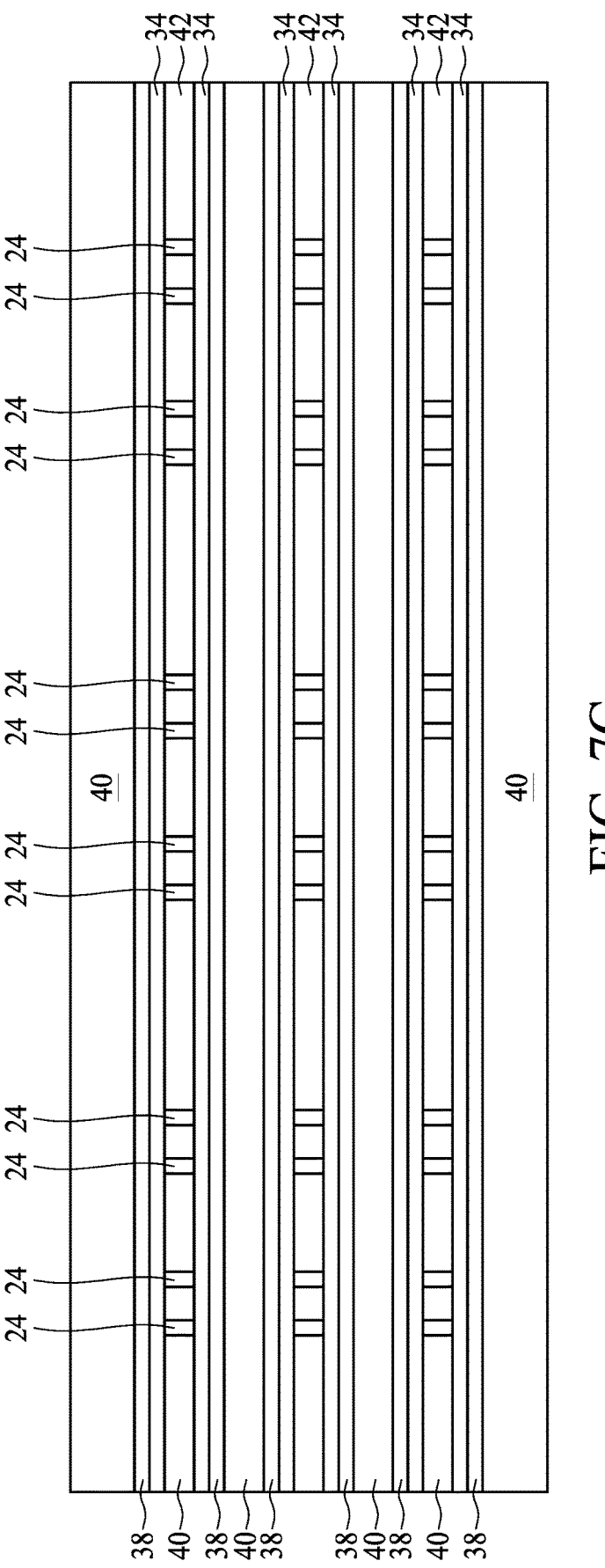

FIGS. 7A, 7B, and 7C illustrate the removal of the dummy gate stacks. The dummy gates 30 and one or more interfacial dielectrics 28 are removed, such as by one or more etch processes. The dummy gates 30 may be removed by an etch process selective to the dummy gates 30, wherein the one or more interfacial dielectrics 28 act as ESLs, and subsequently, the one or more interfacial dielectrics 28 can be removed by a different etch process selective to the one or more interfacial dielectrics 28. The etch processes can be, for example, a RIE, NBE, a wet etch process, or another etch process. Recesses 42 are formed between gate spacers 34 where the dummy gate stacks are removed, and channel regions of the fins 24 are exposed through the recesses 42. In some embodiments, the interfacial dielectrics 28 are not removed.

Figure 8A:
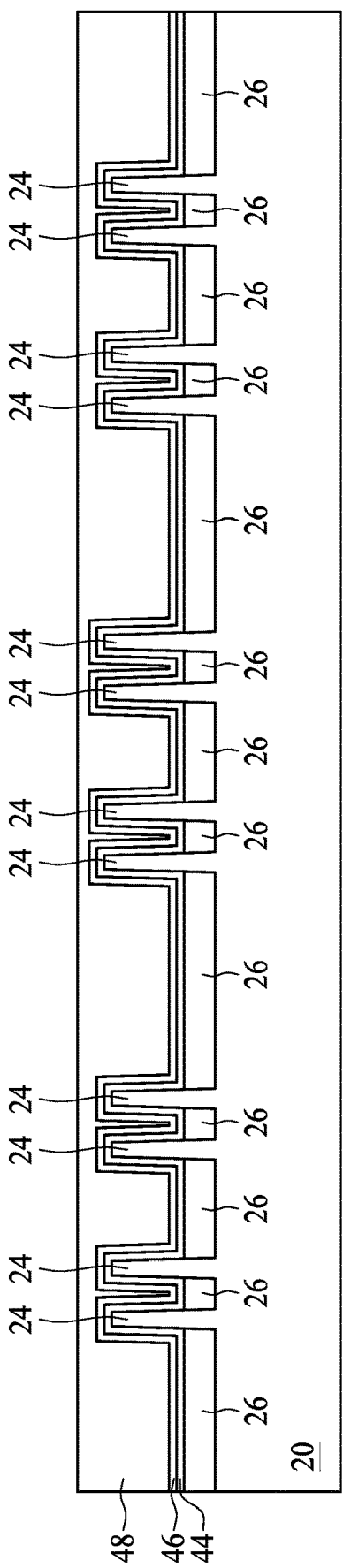
Figure 8B:
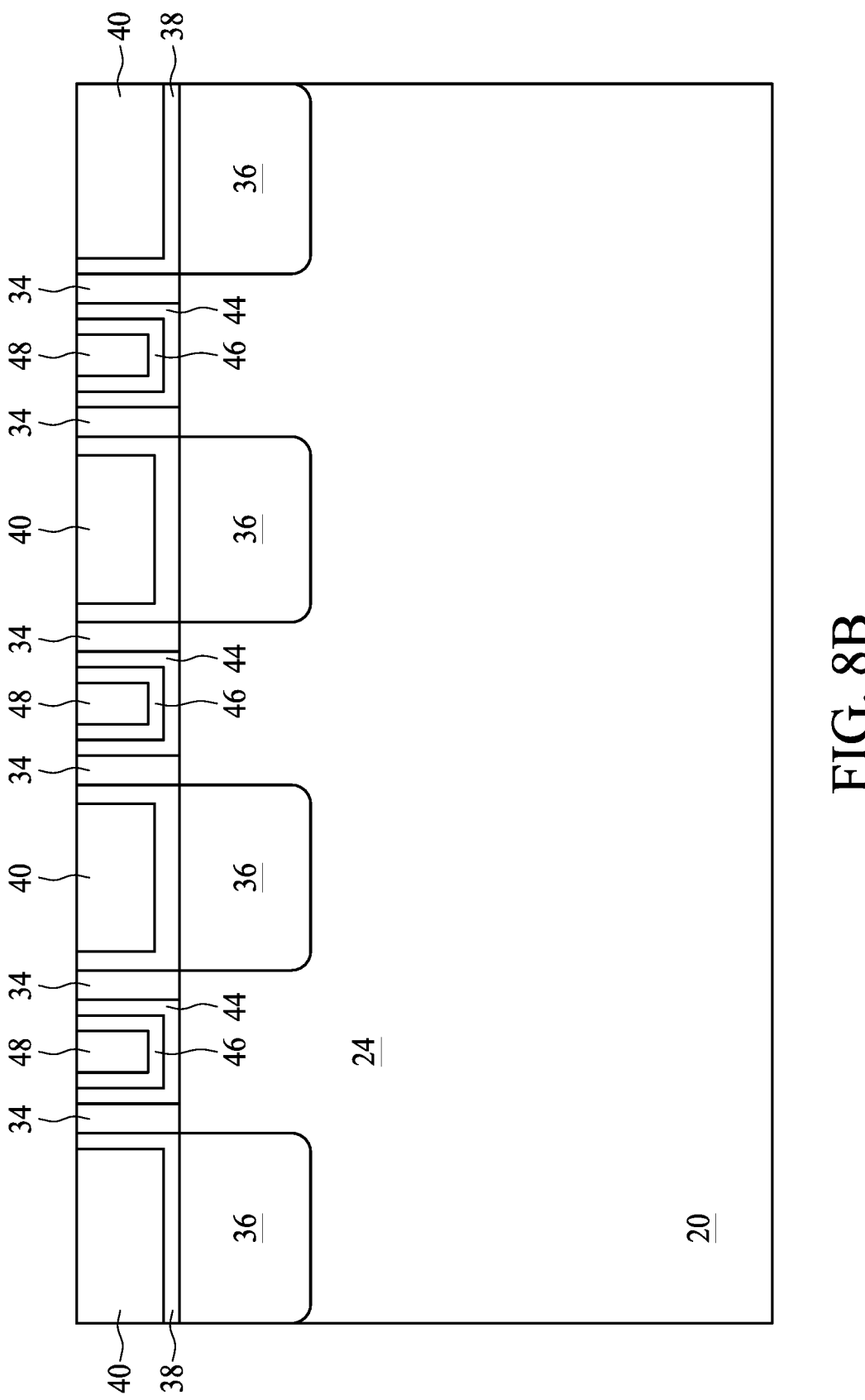
Figure 8C:
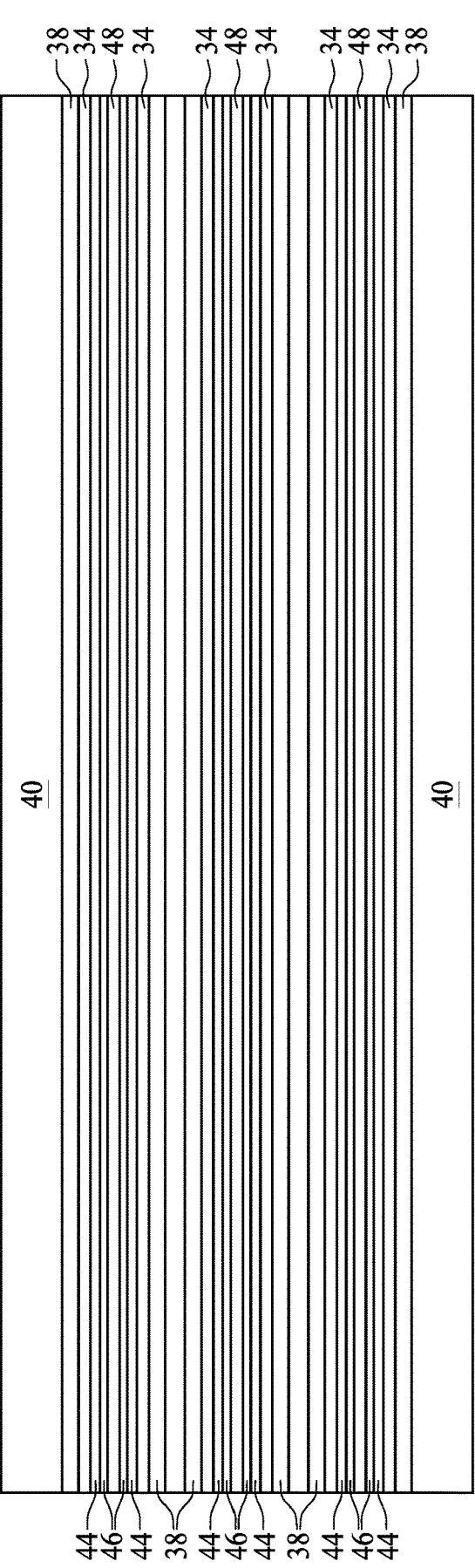

FIGS. 8A, 8B, and 8C illustrate the formation of replacement gate structures in the recesses 42. The replacement gate structures each include a gate dielectric layer 44, one or more optional conformal layers 46, and a gate electrode 48.

The gate dielectric layer 44 is conformally deposited in the recesses 42 (e.g., on top surfaces of the isolation regions 26, sidewalls and top surfaces of the fins 24 (or the inter-facial dielectrics 28 if not removed) along the channel regions, and sidewalls of the gate spacers 34) and on the top surfaces of the gate spacers 34, the CESL 38, and ILD 40. The gate dielectric layer 44 can be or include silicon oxide, silicon nitride, a high-k dielectric material, multilayers thereof, or other dielectric material. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof. The gate dielectric layer 44 can be deposited by ALD, PECVD, MBD, or another deposition technique.

Then, the one or more optional conformal layers 46 can be conformally (and sequentially, if more than one) deposited on the gate dielectric layer 44. The one or more optional conformal layers 46 can include one or more work-function tuning layers. The one or more work-function tuning layer may include or be a nitride, silicon nitride, carbon nitride, aluminum nitride, aluminum oxide, and/or aluminum carbide of titanium and/or tantalum; a carbide of tungsten; cobalt; platinum; the like; or a combination thereof; and may be deposited by ALD, PECVD, MBD, or another deposition technique.

A layer for the gate electrodes 48 is formed over the gate dielectric layer 44 and, if implemented, the one or more optional conformal layers 46. The layer for the gate electrodes 48 can fill remaining recesses 42 where the dummy gate stacks were removed. The layer for the gate electrodes 48 may be or include a metal-containing material such as tungsten, cobalt, aluminum, ruthenium, copper, multi-layers thereof, a combination thereof, or the like. The layer for the gate electrodes 48 can be deposited by ALD, PECVD, MBD, PVD, or another deposition technique.

Portions of the layer for the gate electrodes 48, one or more optional conformal layers 46, and gate dielectric layer 44 above the top surfaces of the ILD 40, CESL 38, and gate spacers 34 are removed. For example, a planarization process, like a CMP, may remove the portions of the layer for the gate electrodes 48, one or more optional conformal layers 46, and gate dielectric layer 44 above the top surfaces of the ILD 40, CESL 38, and gate spacers 34. Each replacement gate structure including the gate electrode 48, one or more optional conformal layers 46, and gate dielectric layer 44 may therefore be formed as illustrated in FIG. 8A-C.

Figure 9A:
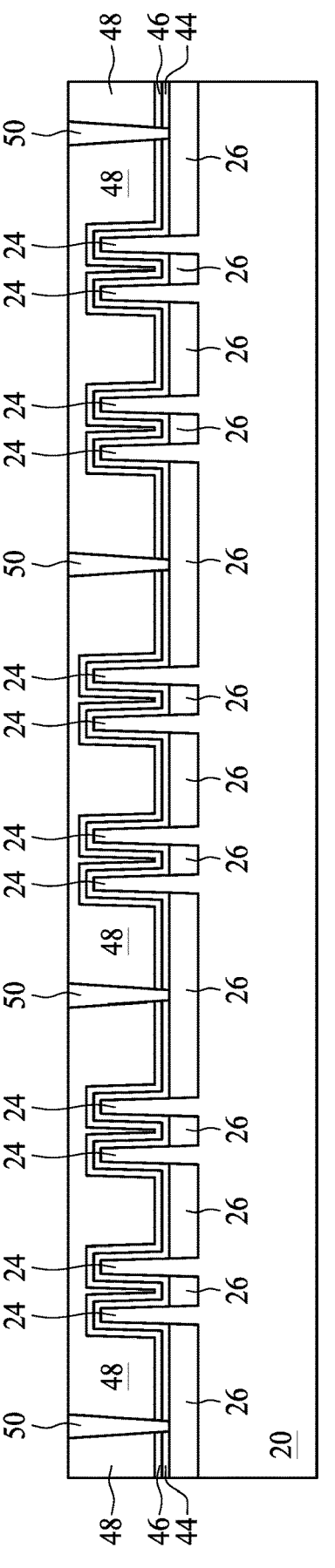
Figure 9B:
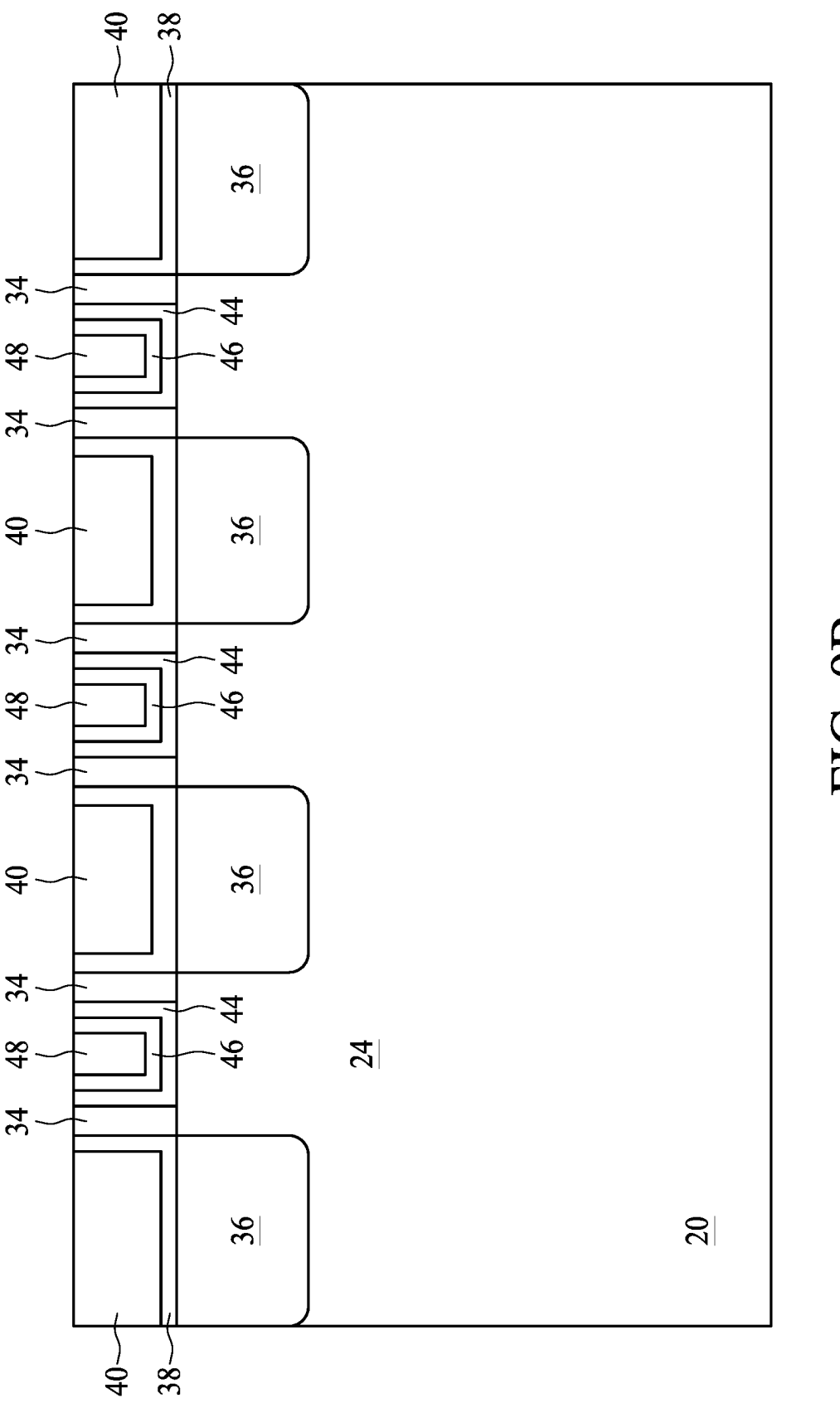
Figure 9C:
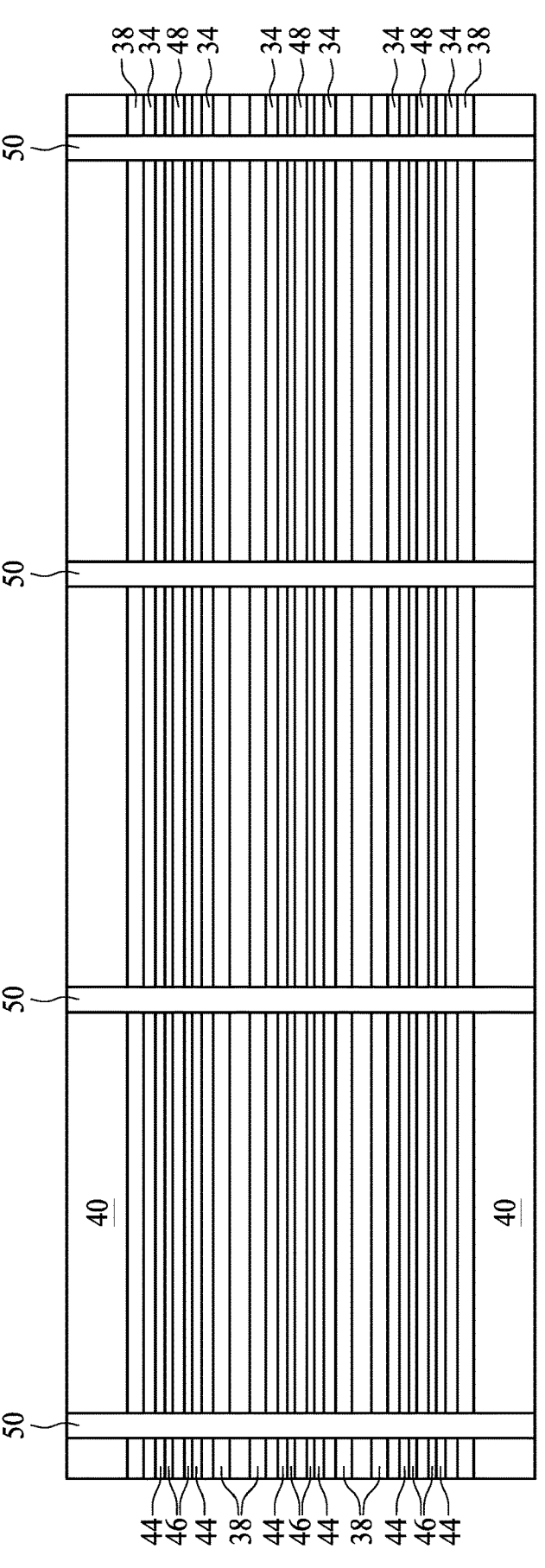

FIGS. 9A, 9B, and 9C illustrate the cutting of the replacement gate structures. The cutting of the replacement gate structures forms gate cut-fill structures 50 that extend laterally perpendicularly to the replacement gate structures and dissect the replacement gate structures. As indicated below, in some examples, the gate cut-fill structure 50 is an insulating material, and hence, portions of a replacement gate structure that were integral before the cutting of the replacement gate structure can be made to be electrically isolated sections from each other because of the gate cut-fill structure 50.

In some examples, a mask (e.g., a hard mask) is used to cut the replacement gate structures. For example, one or more mask layers are deposited over the replacement gate structures, gate spacers 34, CESL 38, and ILD 40, and the one or more mask layers are then patterned into the mask. In some examples, the one or more mask layers may include or be silicon nitride, silicon oxynitride, silicon carbide, silicon carbon nitride, the like, or a combination thereof, and may be deposited by CVD, PVD, ALD, or another deposition technique. The one or more mask layers may be patterned using photolithography and etch processes, as previously described. The mask can have mask openings extending in a direction laterally perpendicular to and intersecting the replacement gate structures.

Using the mask, the replacement gate structures, gate spacers 34, CESL 38, and ILD 40 may be etched such that trenches are formed in the replacement gate structures. The trenches can extend to a depth to and/or into the corresponding isolation regions 26, e.g., through the gate electrodes 48, one or more optional conformal layers 46, and gate dielectric layer 44. In some embodiments, the trenches are extended into the isolation regions 26 to expose portions of the semiconductor substrate 20. The etch process may include a RIE, NBE, ICP etch, the like, or a combination thereof. The etch process may be anisotropic. An insulating material for the gate cut-fill structures 50 is deposited in the trenches in the replacement gate structures. In some examples, each of the gate cut-fill structures 50 may be a single insulating material, and in other examples, the gate cut-fill structures 50 may include multiple different insulating materials, such as in a multi-layered configuration. In some examples, the insulating material may include or be silicon oxide, silicon nitride, silicon oxynitride, silicon carbide, silicon carbon nitride, the like, or a combination thereof, and may be deposited by CVD, PVD, ALD, or another deposition technique. Portions of the insulating material for the gate cut-fill structures 50 and the mask above the top surface of the ILD 40, CESL 38, gate spacers 34, and replacement gate structures are removed. For example, a planarization process, like a CMP, may remove the portions of the insulating material for the gate cut-fill structures 50 and the mask above the top surface of the ILD 40, CESL 38, gate spacers 34, and replacement gate structures, and top surfaces of the gate cut-fill structures 50 may be coplanar with the top surfaces of the ILD 40, CESL 38, gate spacers 34, and replacement gate structures. The gate cut-fill structures 50 therefore electrically isolate sections of the replacement gate structures that were cut from each other. As illustrated in FIG. 9A, with the replacement gate structures being cut after the replacement gate structures are formed (e.g., deposited), the gate dielectric layer 44 and/or one or more optional conformal layers 46 do not extend vertically along a sidewall of the gate cut-fill structures 50. Although the gate cut-fill structures 50 are illustrated in FIG. 9A as having a positive taper profile (e.g., sidewalls of components abutting the gate cut-fill structures 50 have angles with the bottom surfaces of the components adjoining the sidewalls is less than 90 degrees interior to those components, respectively), the gate cut-fill structures 50 may have a vertical profile (e.g., angels that are 90 degrees) or a re-entrant profile (e.g., angles that are greater than 90 degrees). The etching to form the trenches in which the gate cut-fill structures 50 are formed may cause such profiles to be formed.

Figure 10A:
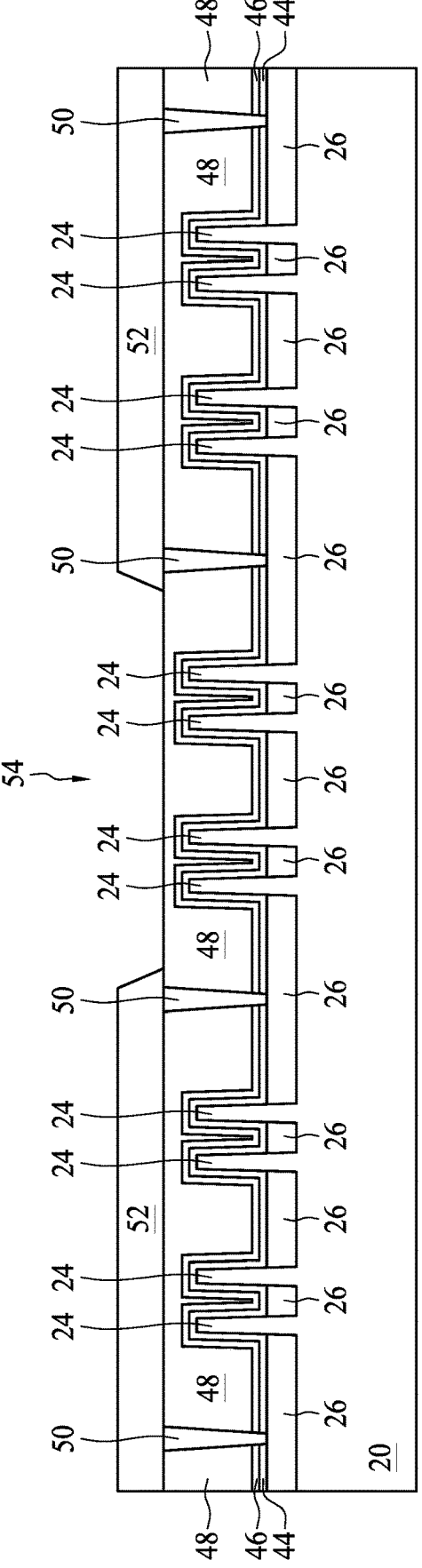
Figure 10B:
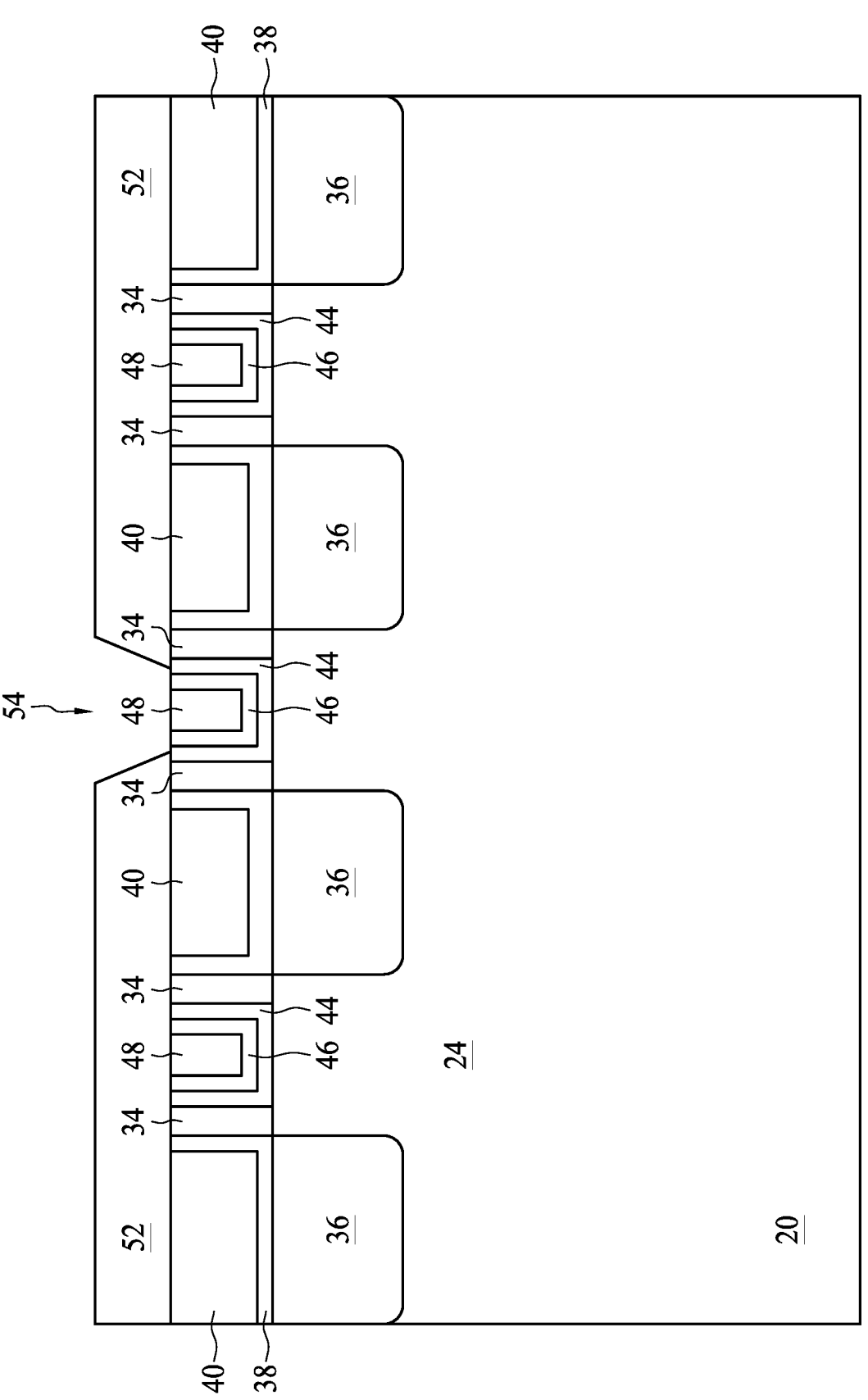
Figure 10C:
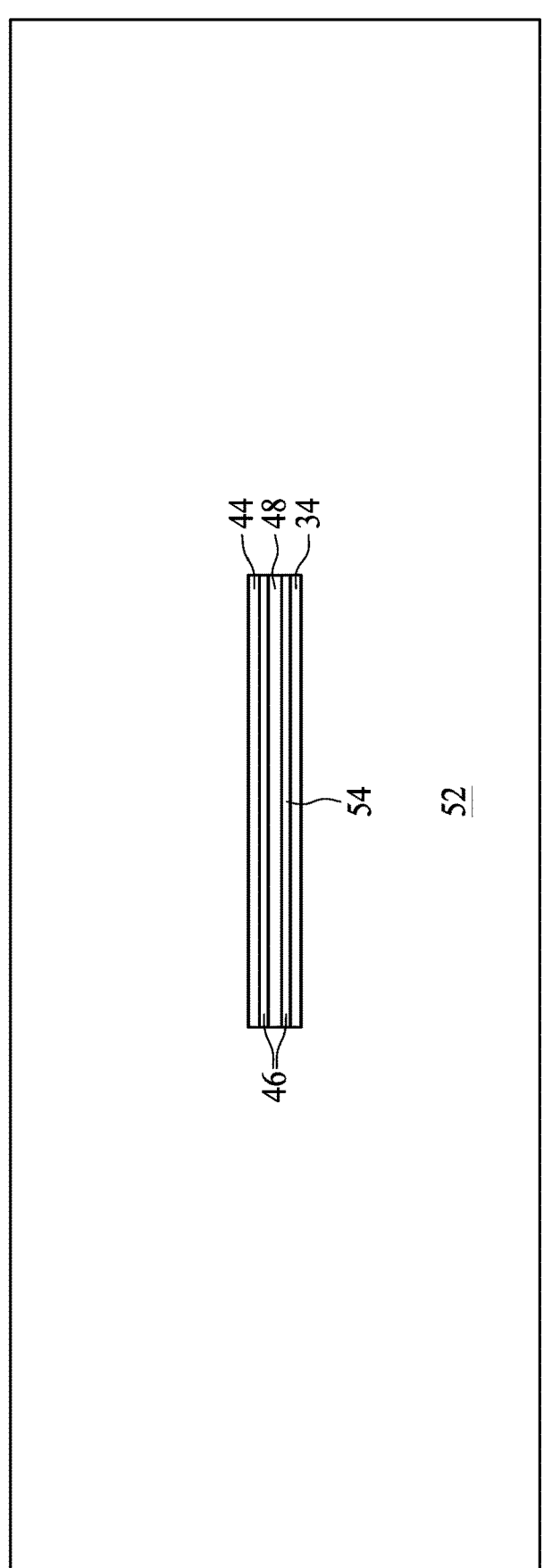

FIGS. 10A, 10B, and 10C illustrate the formation of a mask 52 with mask opening 54 used for cutting fins 24. For example, one or more mask layers are deposited over the replacement gate structures, gate spacers 34, CESL 38, ILD 40, and gate cut-fill structures 50, and the one or more mask layers are then patterned into the mask 52. In some examples, the one or more mask layers may include or be silicon nitride, silicon oxynitride, silicon carbide, silicon carbon nitride, the like, or a combination thereof, and may be deposited by CVD, PVD, ALD, or another deposition technique. The one or more mask layers may be patterned using photolithography and etch processes, as previously described. The mask opening 54 exposes at least a section of a replacement gate structure between a pair of gate cut-fill structures 50, which section of the replacement gate structure will be removed. As illustrated in FIG. 10A, the mask 52 overhangs a section of a replacement gate structure that is to be removed; although in some instances, the mask opening 54 may be aligned with sidewalls of gate cut-fill structures 50 defining the section of the replacement gate structure that is to be removed.

Figure 11A:
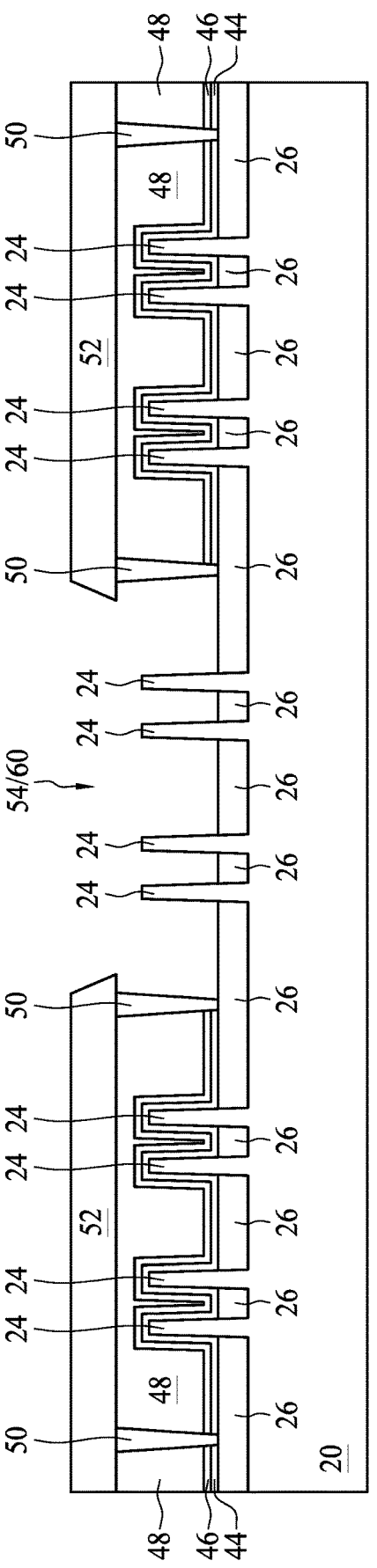
Figure 11B:
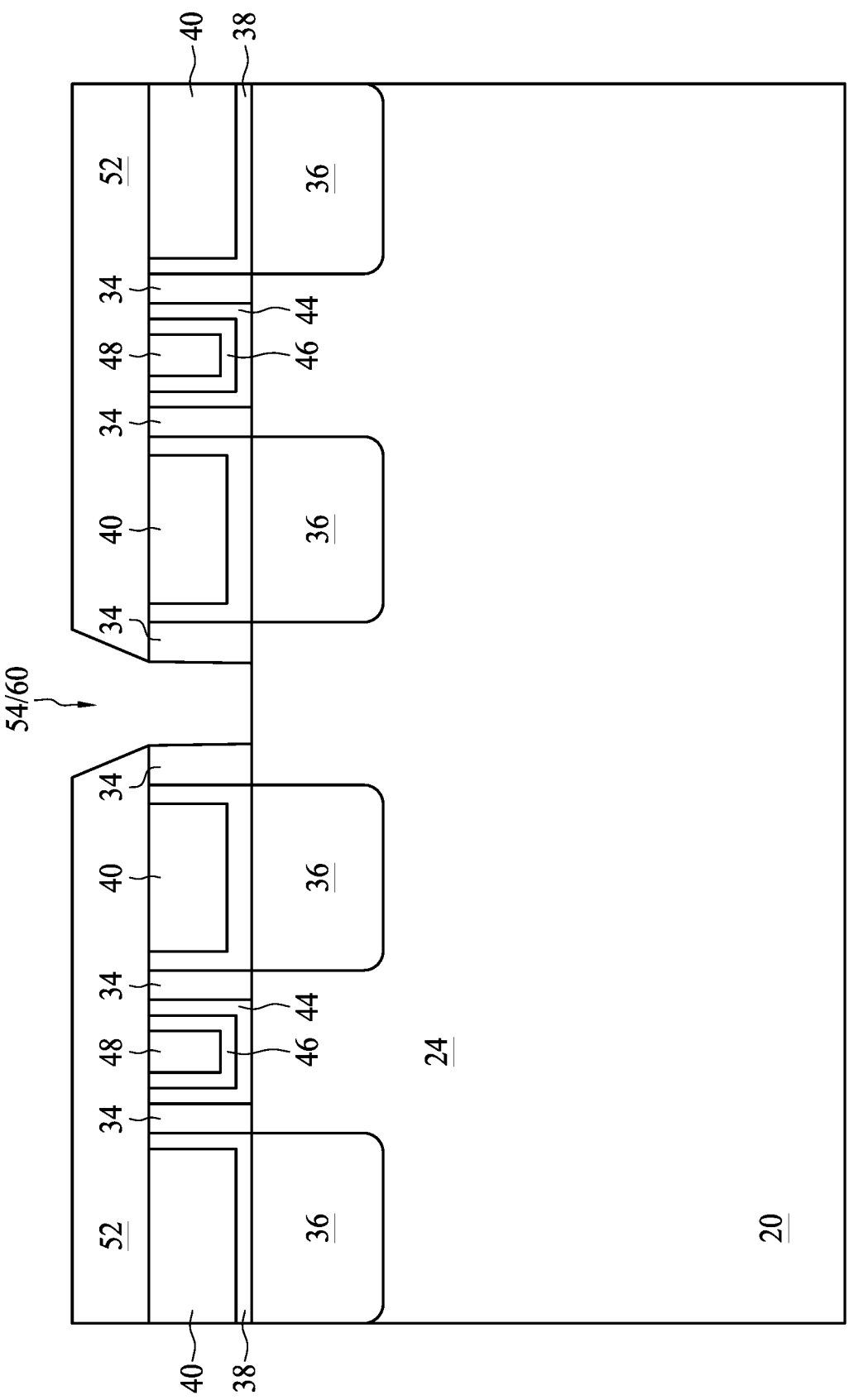
Figure 11C:
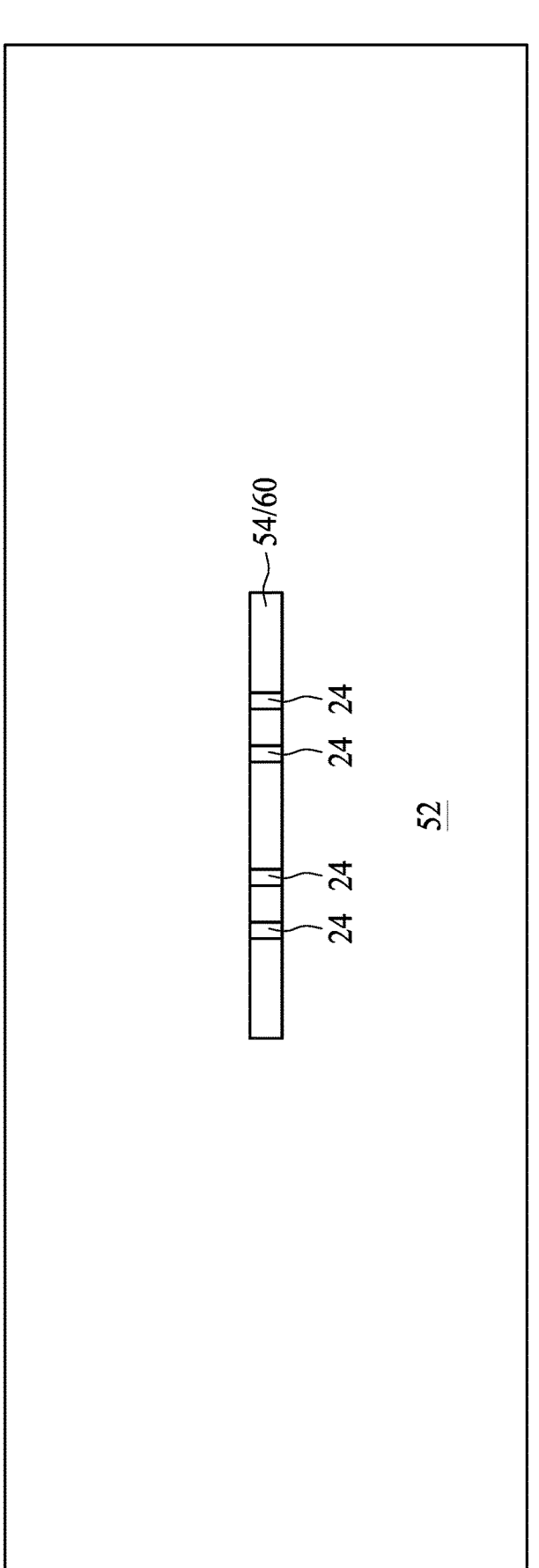

FIGS. 11A, 11B, and 11C illustrate the removal of the section of the replacement gate structure, at least a portion of which is exposed through the mask opening 54. The removal can be by one or more etch processes. The etch processes can be isotropic and selective of the materials of the gate electrode 48, one or more optional conformal layers 46, and gate dielectric layer 44.

For example, the one or more etch processes can be a wet etch process, such as including a sulfuring peroxide mix (SPM) (e.g., a mixture of $H_2SO_4$ and $H_2O_2$), a high temperature standard clean 1 (SC1) (e.g., a mixture of $NH_4OH$, $H_2O_2$, and $H_2O$), or another etch process. A temperature for a wet etch process using SPM may be in a range from about 60° C. to about 200° C., and a temperature for a wet etch process using a high temperature SC1 may be in a range from about 20° C. to about 80° C.

The one or more etch processes can also be a dry (e.g., plasma) etch process. For example, a plasma etch process may implement a low DC substrate bias (e.g., less than about 0.1 kV) or no substrate bias. The plasma etch process may include a RIE, NBE, ICP etch, the like, or a combination thereof. Example etchant gases that can be used for a plasma etch process include boron trichloride ($BCl_3$), silicon tetrachloride ($SiCl_4$), chlorine ($Cl_2$), other Cl-based gases, the like, or a combination thereof. A flow rate of the etchant gas(es) of a plasma etch process may be in a range from about 50 sccm to about 800 sccm. A power of a plasma etch process may be in a range from about 200 W to about 1,000 W. A pressure of a plasma etch process may be in a range from about 1 mTorr to about 80 mTorr.

With an isotropic etch selective to the materials of the gate electrode 48, one or more optional conformal layers 46, and gate dielectric layer 44, the section of the replacement gate structure that has at least a portion exposed through the mask opening 54 can be removed, even portions that may be underlying the mask 52, e.g., due to misalignment. The removal of the section of the replacement gate structure forms a gate cut opening 60 between the gate spacers 34 and gate cut-fill structures 50 along the section of the replacement gate structure that was removed. The gate cut opening 60 exposes portions of fins 24 where the fins 24 will be cut.

Figure 12A:
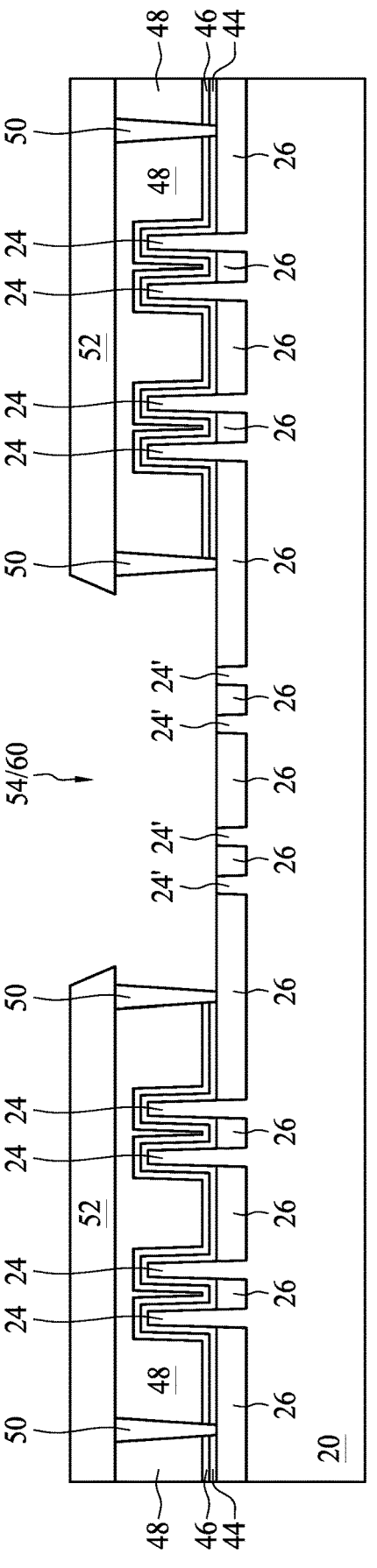
Figure 12B:
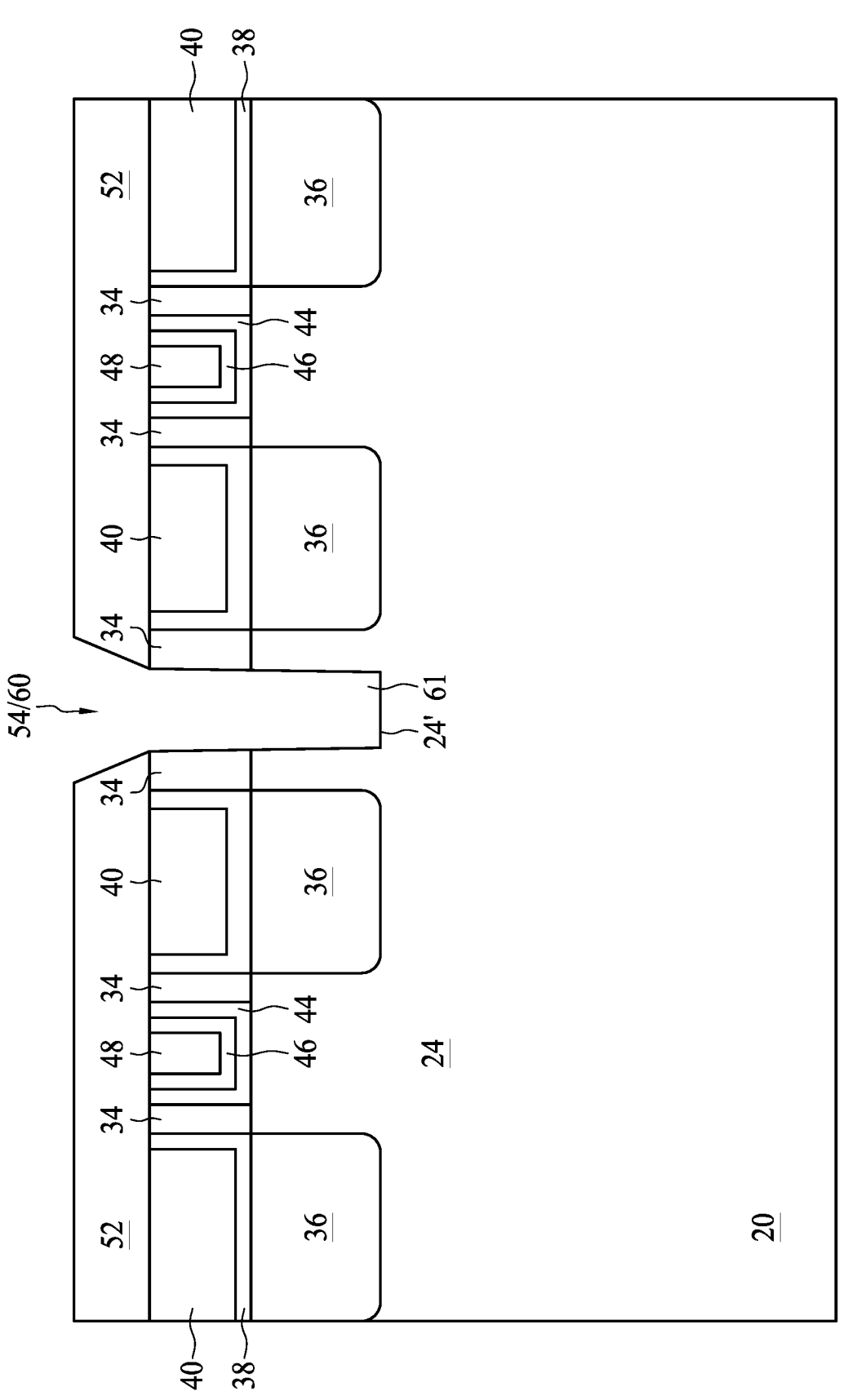
Figure 12C:
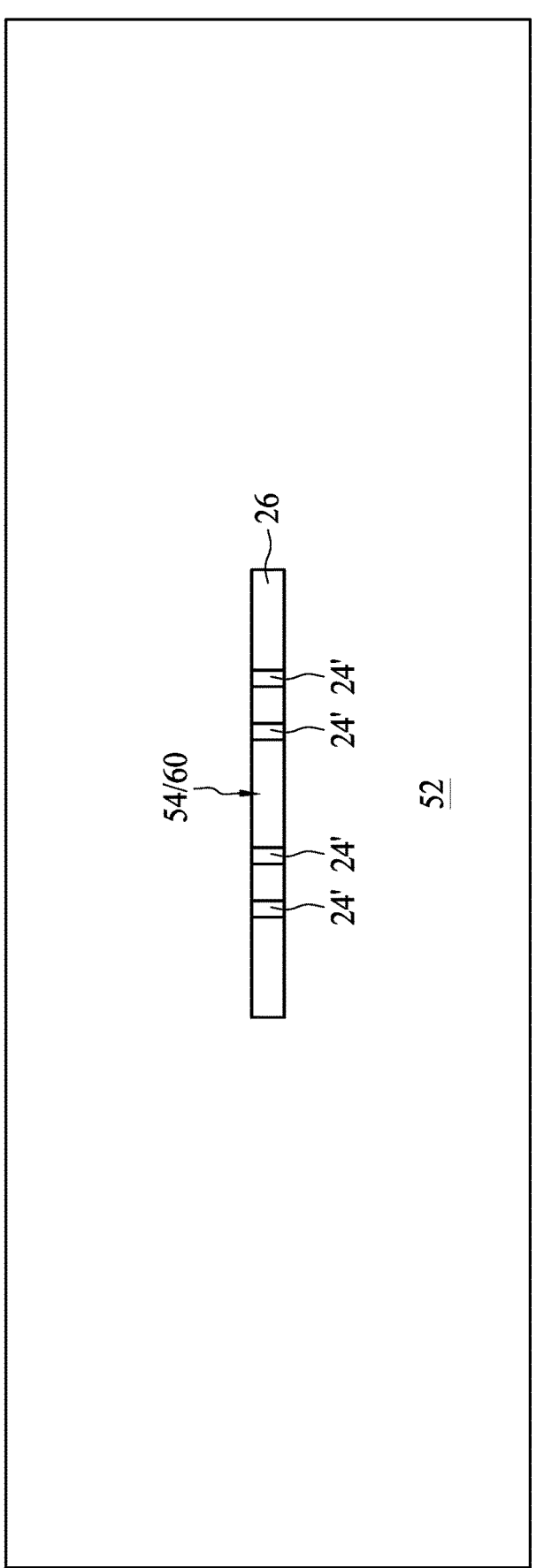

FIGS. 12A, 12B, and 12C illustrate the trimming of fins 24 exposed through the mask opening 54 through the mask 52 and exposed through the gate cut opening 60 where the section of the replacement gate structure was removed. The trimming forms trimmed fins 24' with a trim cut 61. The trimming can be by one or more etch processes. The etch process can be isotropic and/or anisotropic and selective of the material of the fins 24. For example, the etch process can be a dry (e.g., plasma) etch process. A plasma etch process can implement some DC substrate bias, such as in a range from about 0 kV to about 0.1 kV. The plasma etch process may include a RIE, NBE, ICP etch, the like, or a combination thereof. Example etchant gases that can be used in a plasma etch process include hydrogen bromide (HBr), chlorine ($Cl_2$), silicon tetrachloride ($SiCl_4$), boron trichloride ($BCl_3$), other chlorine-based gases, the like, or a combination thereof. A flow rate of the etchant gas(es) of a plasma etch process may be in a range from about 50 sccm to about 800 sccm. A power of a plasma etch process may be in a range from about 200 W to about 1,000 W. A pressure of a plasma etch process may be in a range from about 1 mTorr to about 80 mTorr.

In some examples, the top surfaces of the trimmed fins 24' are level with the top surfaces of respective neighboring isolation regions 26. The depth of the trim cut 61 can be less than, equal to, or greater than a depth of a recess in which the epitaxy source/drain region 36 is formed, where the depth of the recess is from a top surface of the fin 24. In some specific examples, the depth of the trim cut 61 is equal to or greater than the depth of a recess in which the epitaxy source/drain region 36 is formed.

Figure 13A:
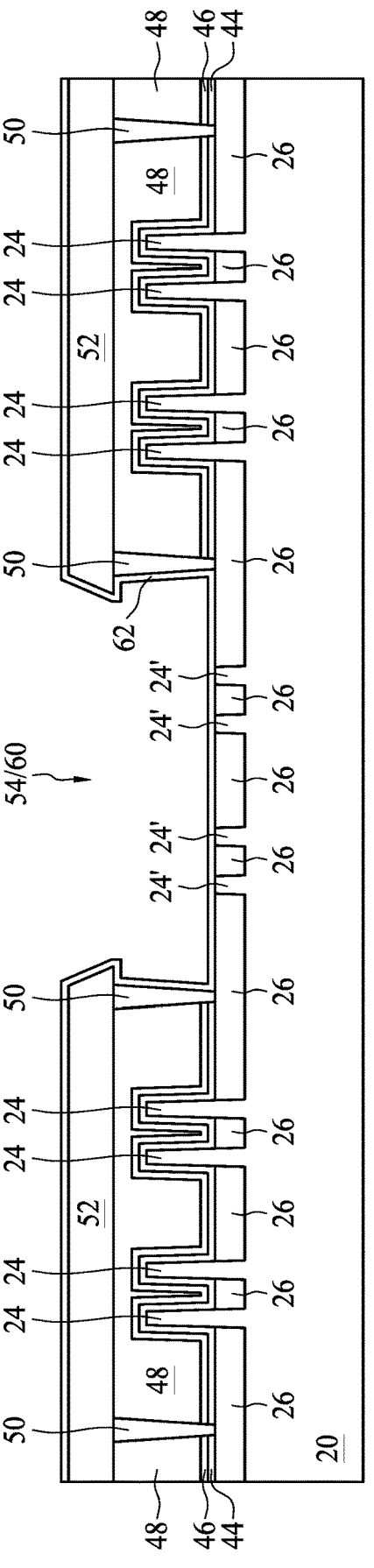
Figure 13B:
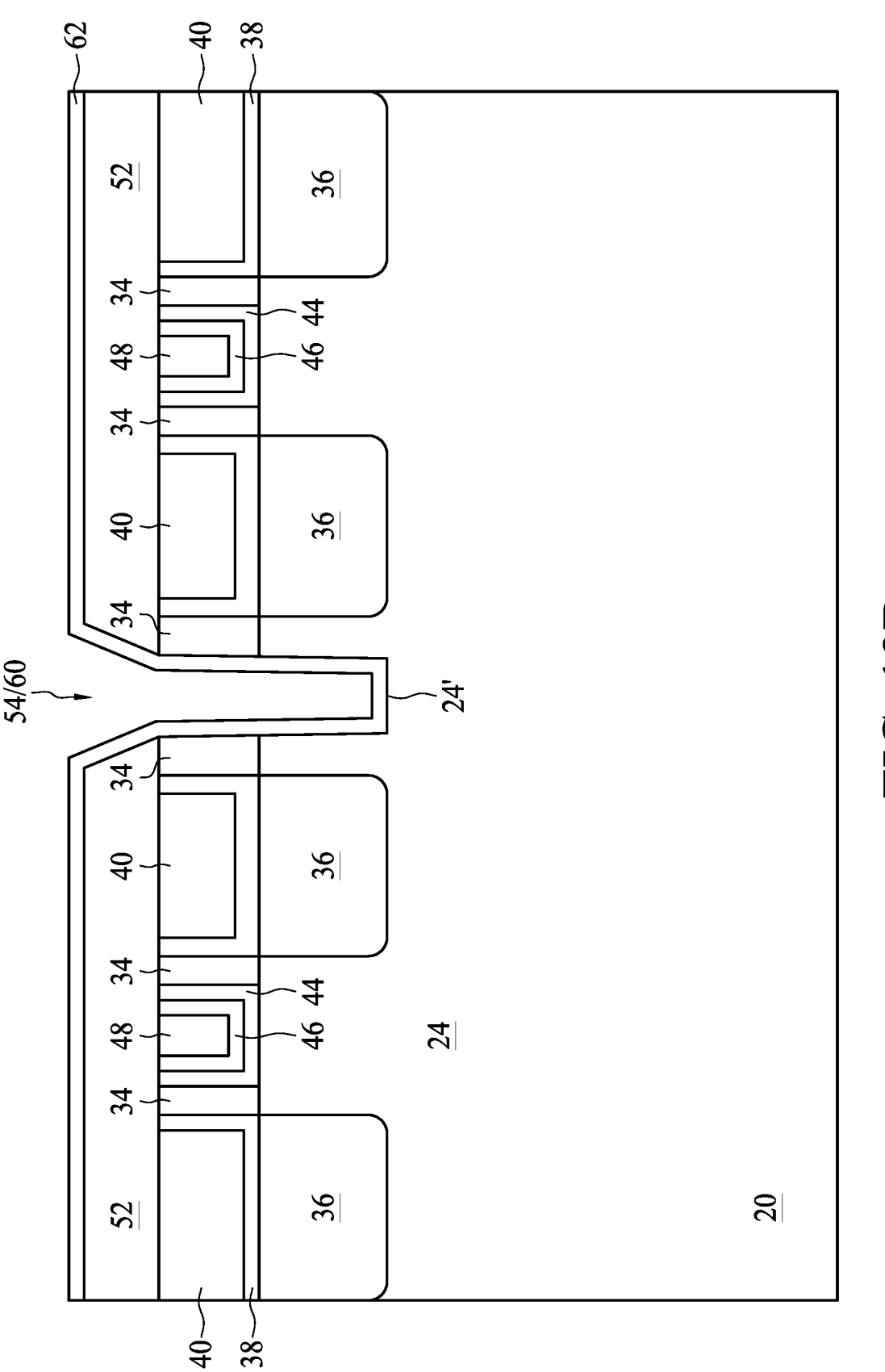
Figure 13C:
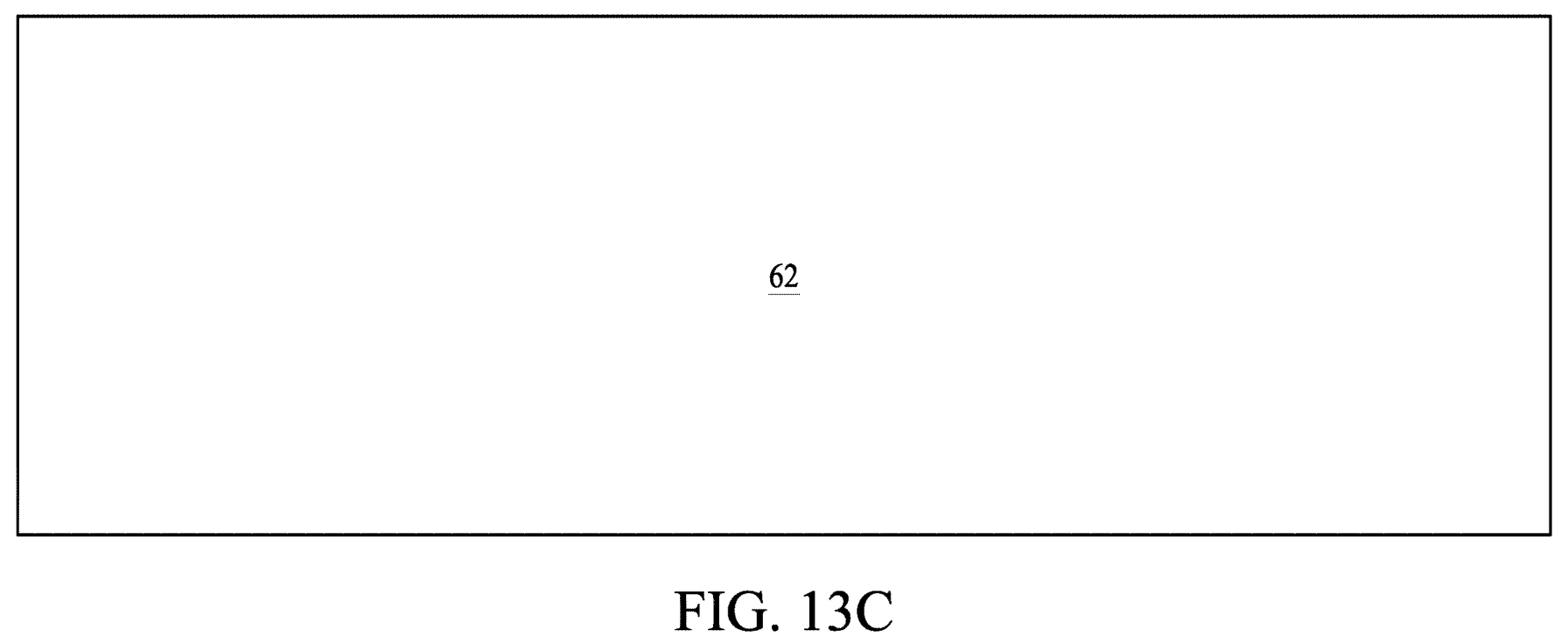

FIGS. 13A, 13B, and 13C illustrate the formation of a liner 62 in the gate cut opening 60. The liner 62 is conformally deposited in the gate cut opening 60, in the trim cut 61, and on the mask 52. For example, the liner 62 is conformally deposited on sidewalls of the gate spacers 34 and trimmed fins 24' (e.g., as shown in FIG. 13B), on top surfaces of the trimmed fins 24' and the isolation regions 26, and on sidewalls of the gate cut-fill structures 50 (e.g., as shown in FIG. 13A). The liner 62 can be or include silicon nitride, silicon oxide, silicon oxynitride, silicon carbon nitride, the like, or a combination thereof, and may be deposited by ALD, CVD, or another conformal deposition technique. In some embodiment, the liner 62 includes silicon oxide and is formed by flowing precursor gases, such as $SiCl_4$ and $O_2$, along with a carrier gas, such as Ar, into a processing chamber in which the intermediate structure is disposed therein. The flow rate of the $SiCl_4$ precursor may be less than about 100 sccm, the flow rate of the $O_2$ precursor may be less than about 100 sccm, and the flow rate of the carrier gas may range from about 50 sccm to about 500 sccm. In some embodiments, the liner 62 is formed prior to the trimming of the fins 24 described in FIGS. 12A-C.

Figure 14A:
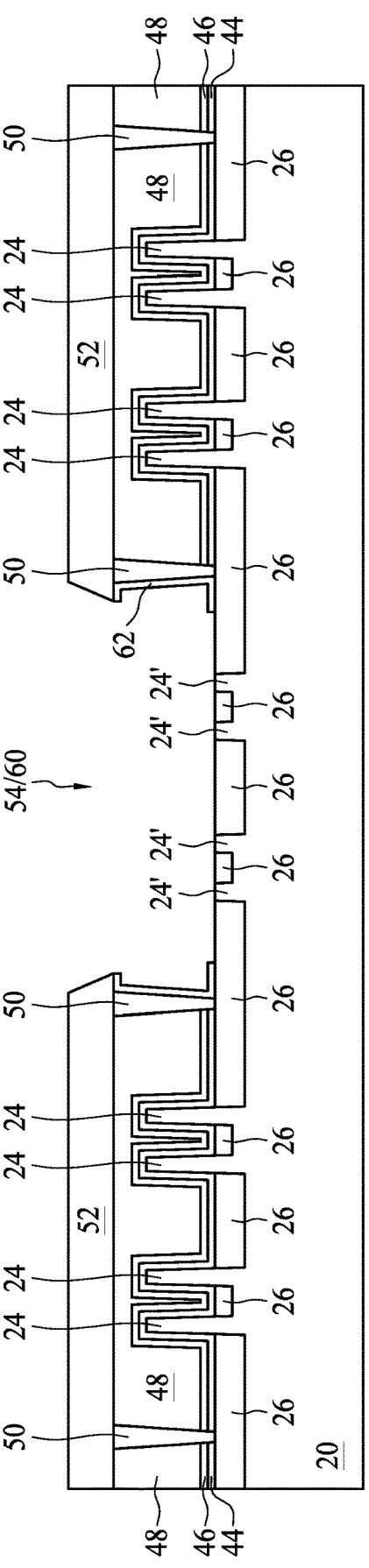
Figure 14B:
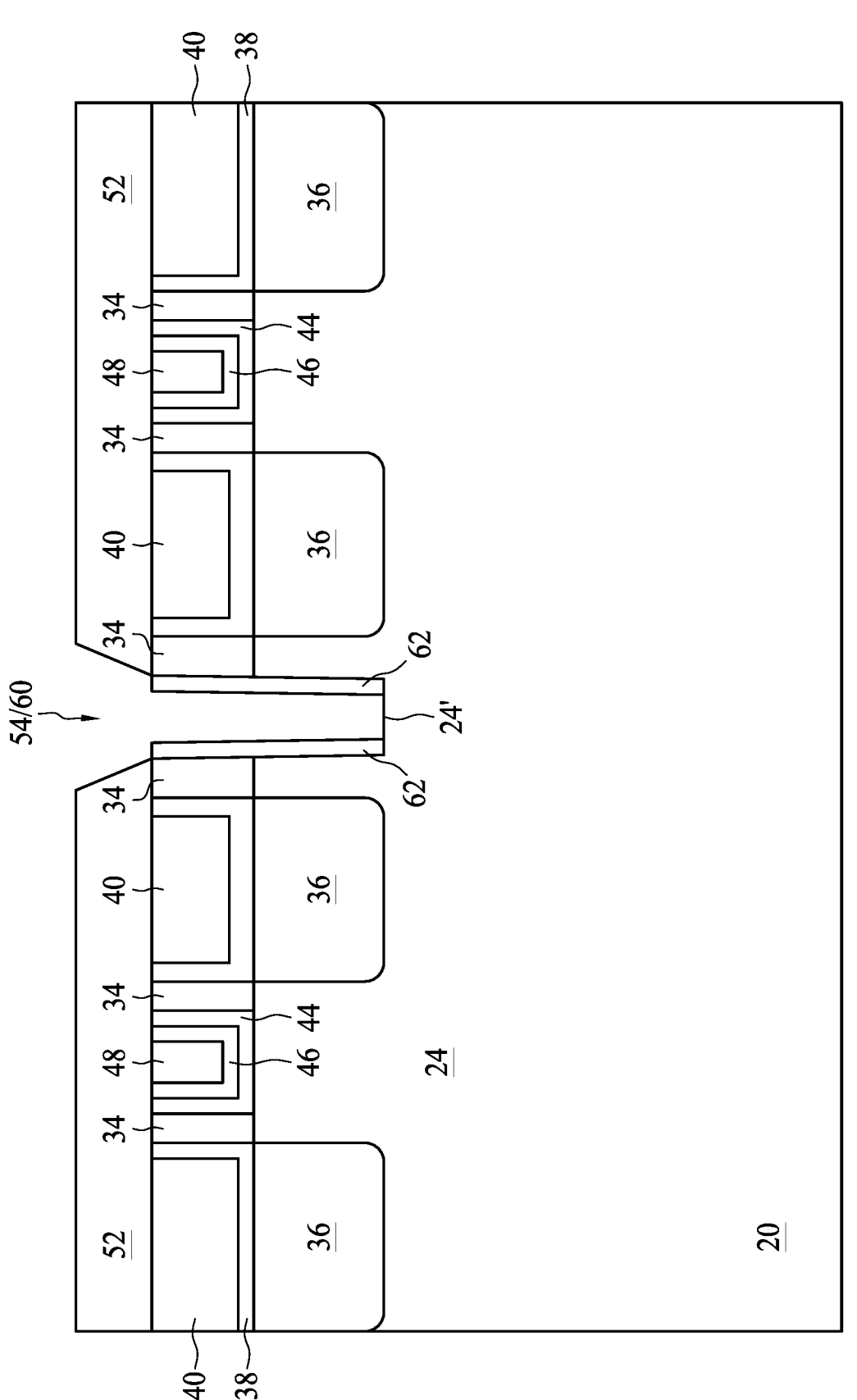
Figure 14C:
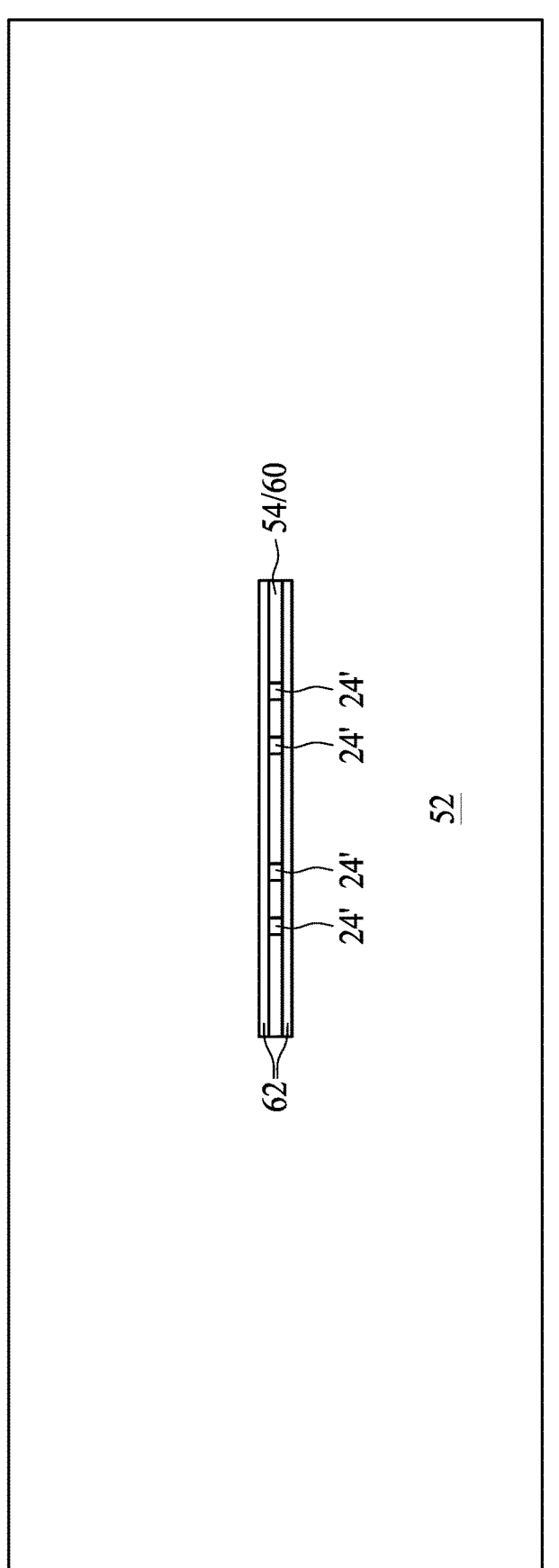

FIGS. 14A, 14B, and 14C illustrate a break through etch process performed on the liner 62 to expose the trimmed fins 24' and the isolation regions around the trimmed fins 24'. The break through etch process can be an anisotropic etch process, such as a dry (e.g., plasma) etch process. An anisotropic etch process can be a RIE, ICP, NBE, or the like. Example etchant gases can be or include chlorine ($Cl_2$), a chlorine-based gas, fluoroform ($CHF_3$), tetrafluoromethane ($CF_4$), a carbon-containing polymer (e.g., containing —$CH_2$, —$CH_3$, etc.), sulfur hexafluoride ($SF_6$), nitrogen trifluoride ($NF_3$), or the like, or a combination thereof. A flow rate of the etchant gas(es) of a plasma etch process may be in a range from about 50 sccm to about 800 sccm. A plasma etch process may implement a DC substrate bias greater than or equal to about 0.1 kV, such as in a range from about 0.1 kV to about 0.8 kV. A power of a plasma etch process may be in a range from about 200 W to about 1,000 W. A pressure of a plasma etch process may be in a range from about 1 mTorr to about 80 mTorr. In some embodiment, the etchants used in the break through etch process includes $CHF_3$, $N_2$, and $CH_4$. A carrier gas, such as Ar, is also used. The flow rate of $CHF_3$ may be less than about 200 sccm, the flow rate of $N_2$ may be less than about 200 sccm, and the flow rate of $CH_4$ may be less than about 50 sccm. The flow rate of the carrier gas may range from about 50 sccm to about 200 sccm.

The anisotropic etch process exposes the trimmed fins 24' and the isolation regions 26 around the trimmed fins 24' while permitting the liner 62 to remain along sidewalls of the fins 24 in the trim cut 61 and along sidewalls of the gate spacers 34, such as shown in FIG. 14B. The remaining portion of the liner formed on the sidewalls in the openings 54 and 60 may help shrink the critical dimension of a subsequently formed recess 64 (FIG. 15B), as shown in FIG. 14B. Portions of the liner 62 along sidewalls of the gate cut-fill structures 50 and beneath overhangs of the mask 52, also remain in the gate cut opening 60, as shown in FIG. 14A.

As described in FIG. 3A, the bottom of the trench formed between a pair of the fins 24 may be located at a level above the bottom of the trench formed between neighboring pairs of the fins 24. Thus, the isolation regions 26 disposed between a pair of trimmed fins 24' may be located at a level above the isolation regions 26 disposed between neighboring pairs of the fins 24, as shown in FIG. 14A. The portions of the semiconductor substrate 20 located under the isolation regions 26 may lead to current leakage, especially the portions of the semiconductor substrate 20 located under the isolation regions 26 located between the pair of the trimmed fins 24' due to higher dopant concentration. In order to reduce current leakage via the portions of the semiconductor substrate 20 located under the isolation regions 26, the portions of the semiconductor substrate 20 are removed and replaced with a dielectric material.

Figure 15A:
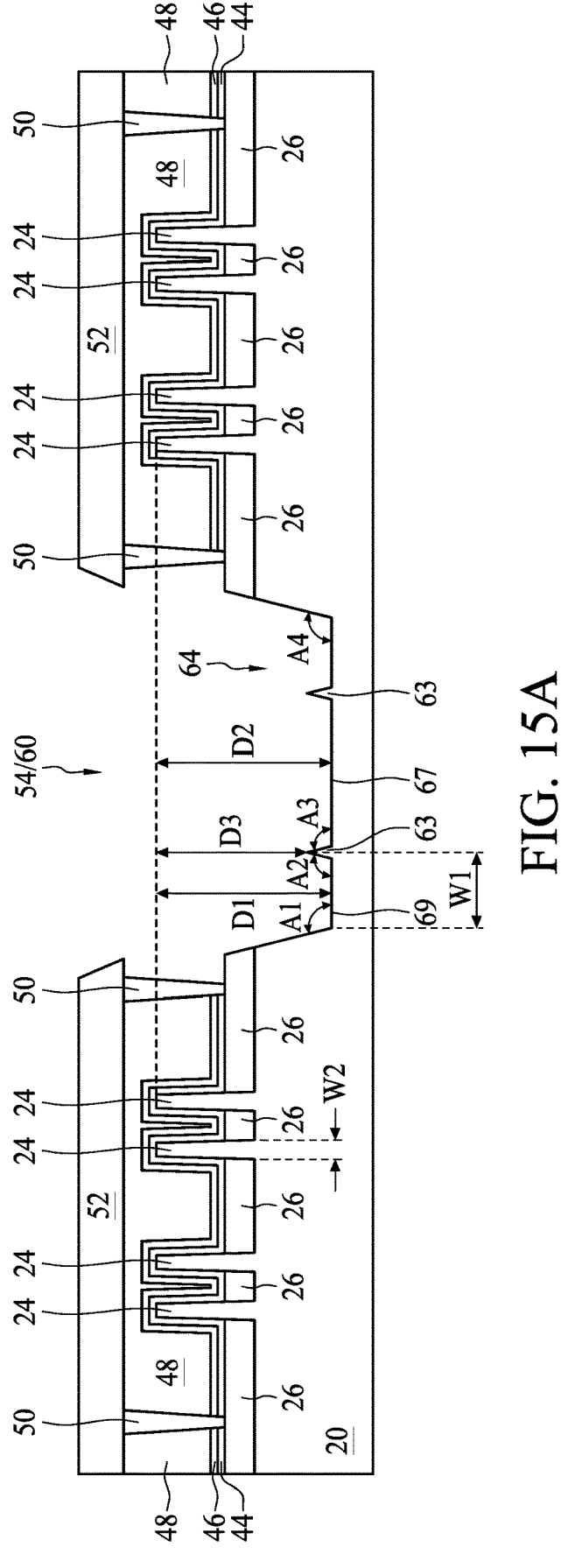
Figures 1, 15A:
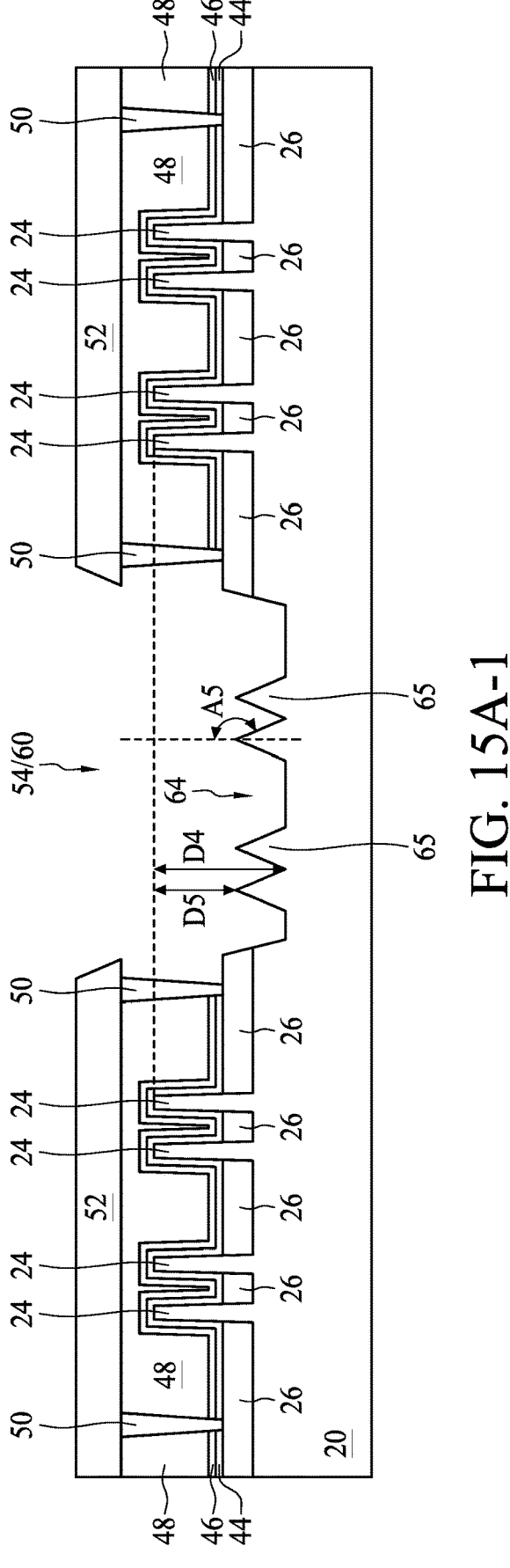
Figure 15B:
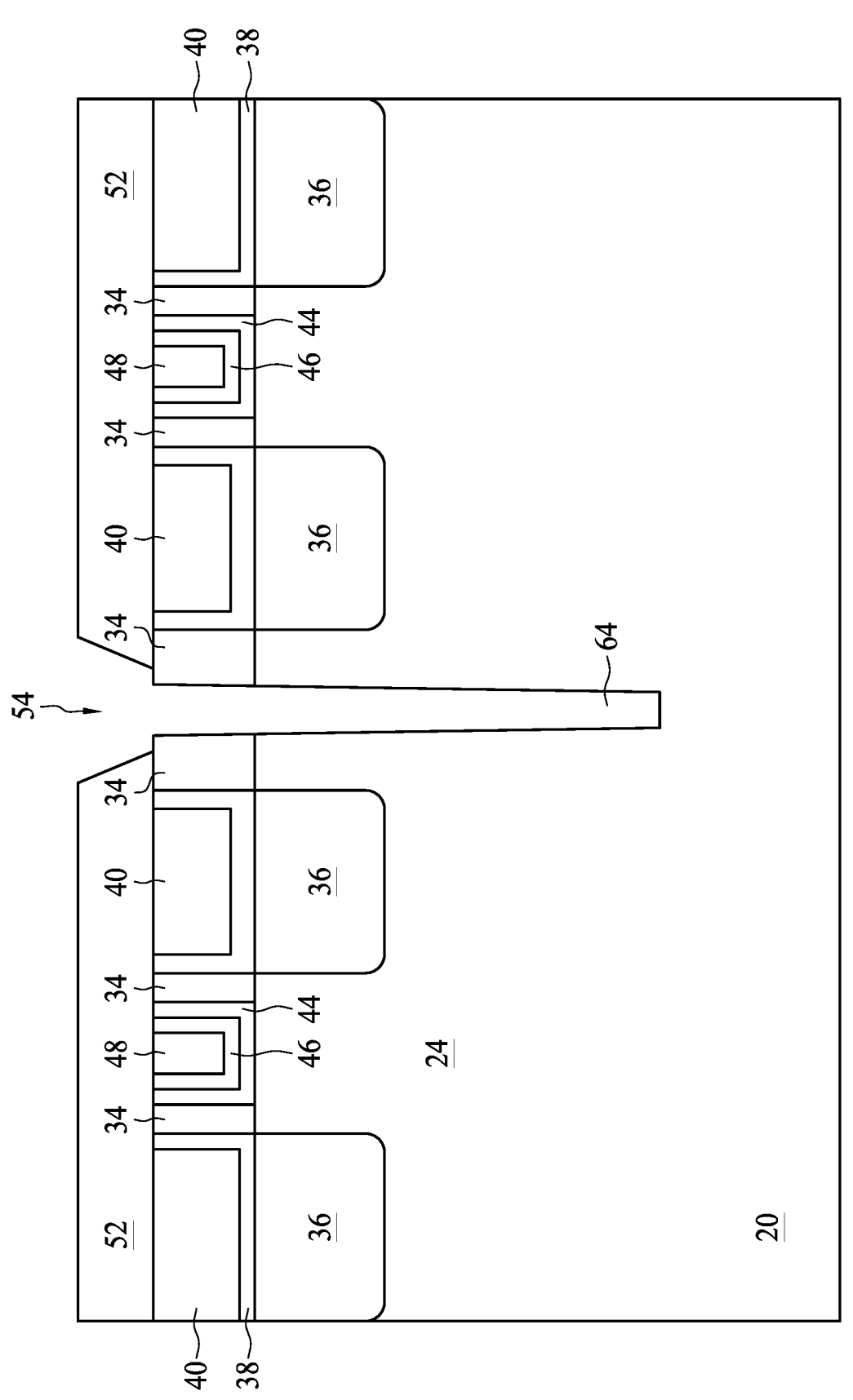
Figure 15C:
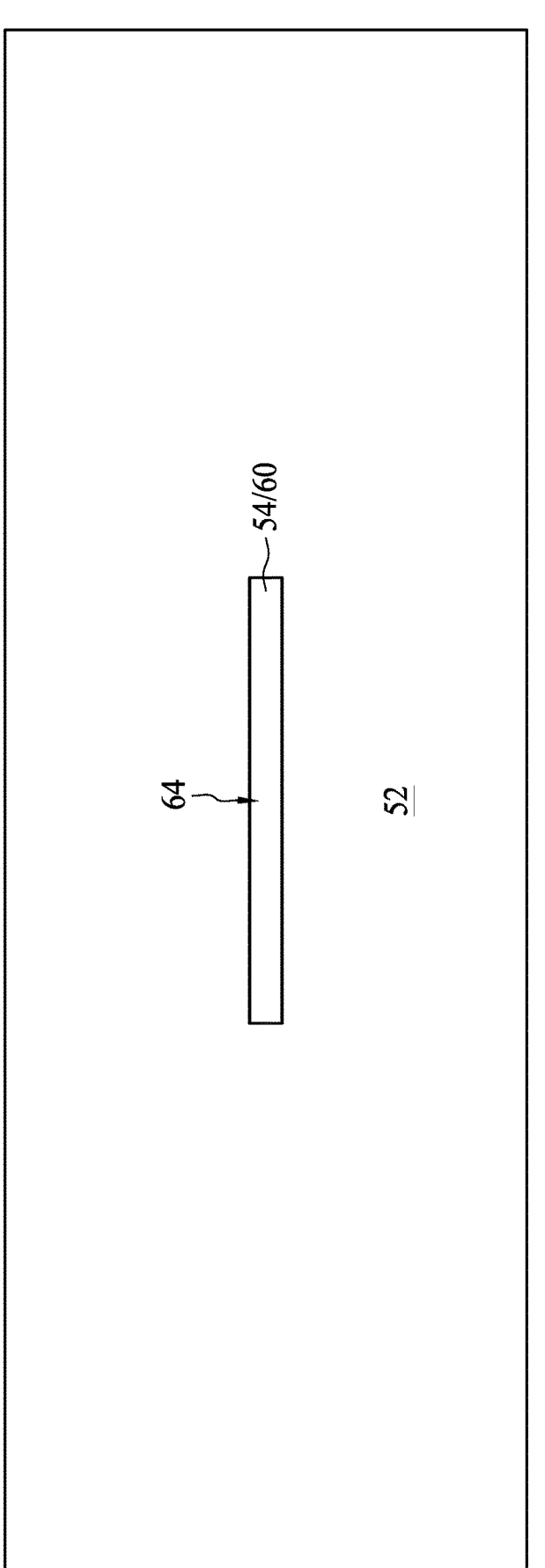

FIGS. 15A, 15B, and 15C illustrate the removal of the trimmed fins 24', the isolation regions 26 located around the trimmed fins 24', and the portions of the semiconductor substrate 20 located under the isolation regions 26. The remaining liner 62 may be also removed during the removal of the trimmed fins 24', the isolation regions 26, and the portions of the semiconductor substrate 20. The removal of the trimmed fins 24', the isolation regions 26 located around the trimmed fins 24', and the portions of the semiconductor substrate 20 located under the isolation regions 26 may be performed by multiple etch processes or multiple cycles of processes.

In some embodiments, multiple etch processes are performed. For example, a first etch process is performed to remove the semiconductor material of the trimmed fins 24', followed by a second etch process to remove the dielectric materials of the isolation regions 26 to expose the portions of the semiconductor substrate 20, and then a third etch process is performed to remove the exposed portions of the semiconductor substrate 20. Each of the first, second, and third etch process may be a selective etch process. The third etch process may be stopped when a depth D1 of the recess 64 reaches a predetermined depth. In some embodiments, a single etch process may be performed instead of the multiple etch processes. The single etch process may be a selective etch process utilizing one or more etchants that etches the semiconductor materials of the trimmed fins 24' and the semiconductor substrate 20 faster than the dielectric material of the isolation regions 26. In other words, the semiconductor materials of the of the trimmed fins 24' and the semiconductor substrate 20 have a higher etch rate, while the dielectric material of the isolation regions 26 has a lower etch rate in the single selective etch process.

In some embodiments, multiple cycles of processes are performed. For example, each cycle includes forming the liner 62, performing the break through etch process, performing a semiconductor etch process, and performing a clean process. The liner 62 may be formed by the same process described in FIGS. 13A-C. The break through etch process may be a dry etch process, and etchants such as $CHF_3$, $CH_4$, and $N_2$ are used. In some embodiments, the flow rate of $CHF_3$ is less than about 200 sccm, the flow rate of $CH_4$ is less than about 50 sccm, and the flow rate of $N_2$ is less than about 200 sccm. A carrier gas, such as Ar, may have a flow rate ranging from about 50 sccm to about 200 sccm. The break through etch process may remove some of the isolation regions 26 around the trimmed fins 24'. The semiconductor etch process may be a dry etch process, and etchants such as HBr and $O_2$ are used. In some embodiments, the flow rate of HBr is less than about 500 sccm, and the flow rate of $O_2$ is less than about 50 sccm. A carrier gas, such as Ar, may have a flow rate less than about 500 sccm. The clean process may be an ash process that cleans any by-product formed from the above mentioned etch processes. The ash process may use $O_2$ having a flow rate less than about 500 sccm. Multiple cycles of the above-mentioned processes may be performed to remove the trimmed fins 24', the isolation regions 26 located around the trimmed fins 24', and the portions of the semiconductor substrate 20 located under the isolation regions 26. The cycles stop when the depth D1 reaches the predetermined depth.

As shown in FIG. 15A, horns 63 may extend from the bottom of the recess 64 as a result of the processes described above. If the isolation regions 26 around the trimmed fins 24' are not removed, more horns may form on the sides of the isolation regions 26, leading to increased current leakage. By removing the isolation regions 26, the number of horns 63 is also reduced, which further reduces current leakage. Each horn 63 may be located between the pair of fins 24 that were removed.

In some embodiments, as shown in FIG. 15A, the depths D1, D2 are measured from the top of the fins 24 to the bottom of the recess 64. The depths D1 and D2 may be substantially the same or substantially different (the bottom of the recess 64 may not be flat as a result of the multiple etch processes or multiple cycles of processes). In some embodiments, the depth D1 ranges from about 150 nm to about 170 nm, and the depth D2 ranges from about 100 nm to about 170 nm. A depth D3 is measured from the top of the fins 24 to the top of the horn 63. In some embodiments, the depth D3 ranges from about 90 nm to about 120 nm.

As shown in FIG. 15A, various angles A1, A2, A3, A4 are formed. The angle A1 is formed between one sidewall of the recess 64 and the bottom of the recess 64, the angle A2 is formed between one sidewall of the horn 63 and the bottom of the recess 64, the angle A3 is formed between the other sidewall of the horn 63 and the bottom of the recess 64, and the angle A4 is formed between the other sidewall of the recess 64 and the bottom of the recess 64. In some embodiments, the angle A1 ranges from about 90 degrees to about 110 degrees, the angle A2 ranges from about 100 degrees to about 120 degrees, the angle A3 ranges from about 100 degrees to about 140 degrees, and the angle A4 ranges from about 80 degrees to about 110 degrees. In some embodiments, the angles A1, A2, A3, A4 are all obtuse angles.

As shown in FIG. 15A, the bottom of the recess 64 is a top surface 67 of the exposed portion of the semiconductor substrate 20. In some embodiments, the top surface 67 includes at least a portion 69 having a substantially flat cross-section, as shown in FIG. 15A. The portion 69 has a width W1 substantially greater than a width W2 of the fin 24. In some embodiments, the fin 24 has different widths, and the width W2 is the largest width of the fin 24. In some embodiments, the width W1 may be greater than two times the width W2. In some embodiments, the entire top surface 67 has a substantially flat cross-section (FIGS. 24C and 25C), and the width W1 may be multiple times the width W2. In some embodiments, the portion 69 may be substantially horizontal. For example, the portion 69 may be substantially parallel with a backside surface of the semiconductor substrate 20. In some embodiments, the portion 69 may be slanted. For example, the portion 69 may be angled with respect to the backside surface of the semiconductor substrate 20.

In some embodiments, a selective etch process is performed to remove the trimmed fins 24', the isolation regions 26 located around the trimmed fins 24', and the portions of the semiconductor substrate 20 located under the isolation regions 26. The resulting intermediate structure is shown in FIG. 15A-1. The selective etch process may be a plasma etch process that uses a combination of etchants that etches dielectric material faster than the semiconductor material. For example, the etchant may include $Cl_2$, $BCl_3$, HBr, $N_2$, $O_2$, $CO_2$, $SiCl_4$, $H_2$, $NF_3$, $CF_4$, $C_4F_6$, $C_4F_8$, $CHF_3$, $C_2H_2$, $CH_3F$, $CH_4$, Ar, He, or combinations thereof. The processing pressure may range from about 3 mTorr to about 300 mTorr, and the processing temperature may range from about 0 degrees Celsius to about 120 degrees Celsius. The source power may range from about 10 W to about 3000 W, the bias power may range from about 0 W to about 3000 W, and the etchant(s) may have flow rate(s) ranging from about 0 sccm to about 5000 sccm. In some embodiments, more fluorine containing etchants, such as $NF_3$, $CF_4$, $C_4F_6$, are used and/or less polymer based etchants, such as $N_2$, $O_2$, $CH_4$, in order to etch the isolation regions 26 at a faster rate than the trimmed fins 24' and the portions of the semiconductor substrate 20. As a result of the selective etch process, horns 65 are formed at the bottom of the recess 64. Unlike the horns 63, which are located between the pair of fins 24, each horn 65 is aligned with a corresponding fin 24 that was removed. By removing the isolation regions 26 in the recess 64, the number of horns 65 is reduced. As a result, current leakage is reduced.

As shown in FIG. 15A-1, a depth D4 is measured from the top of the fins 24 to the bottom of the recess 64. In some embodiments, the depth D4 ranges from about 10 nm to about 250 nm. A depth D5 is measured from the top of the fins 24 to the top of the horn 65. In some embodiments, the depth D5 is substantially less than the depth D4. The depth D5 may range from about 6 nm to about 190 nm. The side of the horn 65 may form an angle A5 with respect to an axis substantially perpendicular to a major surface of the semiconductor substrate 20. In some embodiments, the angle A5 is an obtuse angle and may range from about 95 degrees to about 165 degrees.

The different processes described in FIGS. 15A and 15A-1 result in reduced current leakage, because the portions of the semiconductor substrate 20 under the isolation regions 26 around the fins 24 that were removed are removed. Furthermore, the reduced current leakage may also come from a reduction in the number of horns, such as horns 63 or horns 65. The processes described in FIG. 15A are different from the process described in FIG. 15A-1. For example, as described in FIG. 15A, multiple etch processes or multiple cycles of processes are utilized to remove the trimmed fins 24', the isolation regions 26 located around the trimmed fins 24', and the portions of the semiconductor substrate 20 located under the isolation regions 26. Also as described in FIG. 15A, in some embodiments, a single selective etch process may be performed to remove the trimmed fins 24', the isolation regions 26 located around the trimmed fins 24', and the portions of the semiconductor substrate 20 located under the isolation regions 26, and the etch rate of the semiconductor materials of the trimmed fins 24' and the semiconductor substrate 20 is substantially faster than the etch rate of the dielectric material of the isolation regions 26. As described in FIG. 15A-1, a selective etch process is performed to remove the trimmed fins 24', the isolation regions 26 located around the trimmed fins 24', and the portions of the semiconductor substrate 20 located under the isolation regions 26. The selective etch process uses a combination of etchants that etches dielectric material faster than the semiconductor material. Even though the selective etch processes as described in FIGS. 15A, 15A-1 have different etch selectivity (high etch rate of semiconductor materials in FIG. 15A compared to high etch rate of dielectric material in FIG. 15A-1), both selective etch processes can lead to reduced current leakage.

Figure 16A:
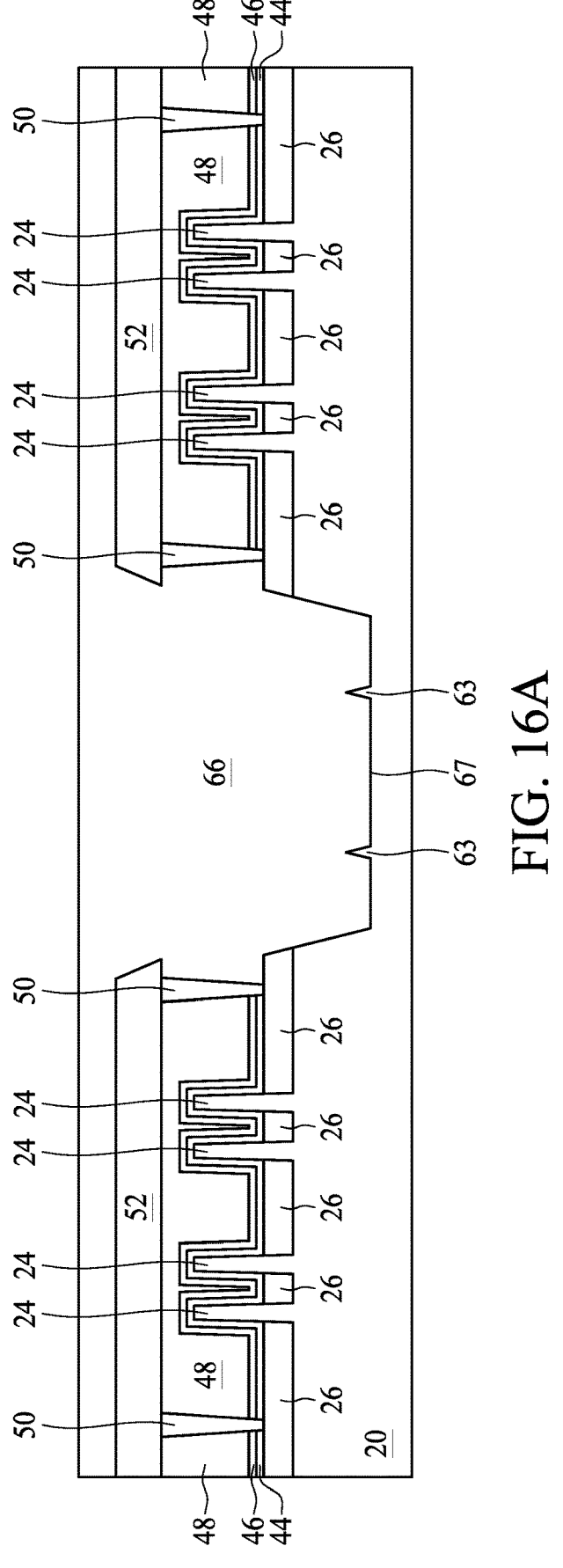
Figure 16B:
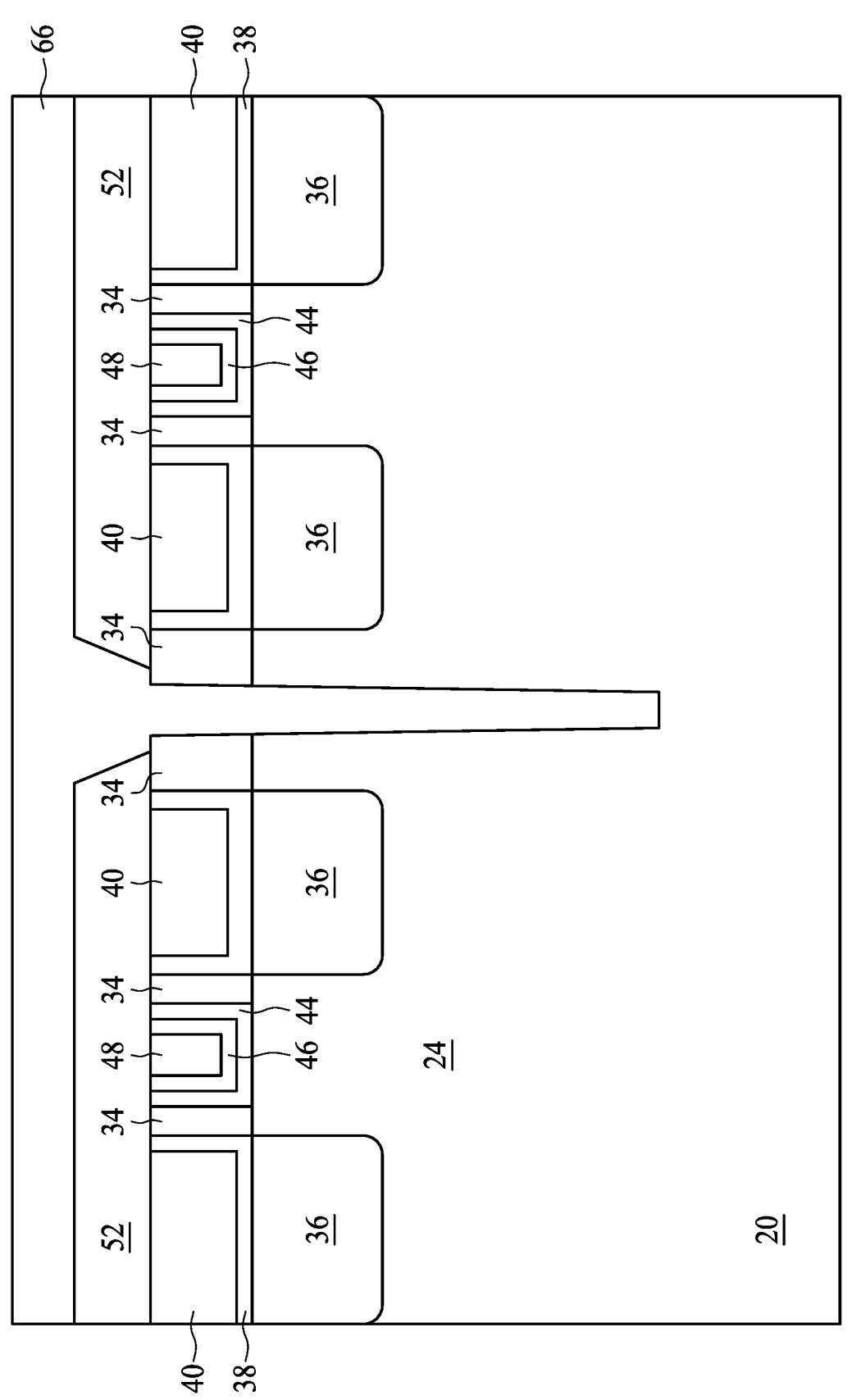
Figure 16C:
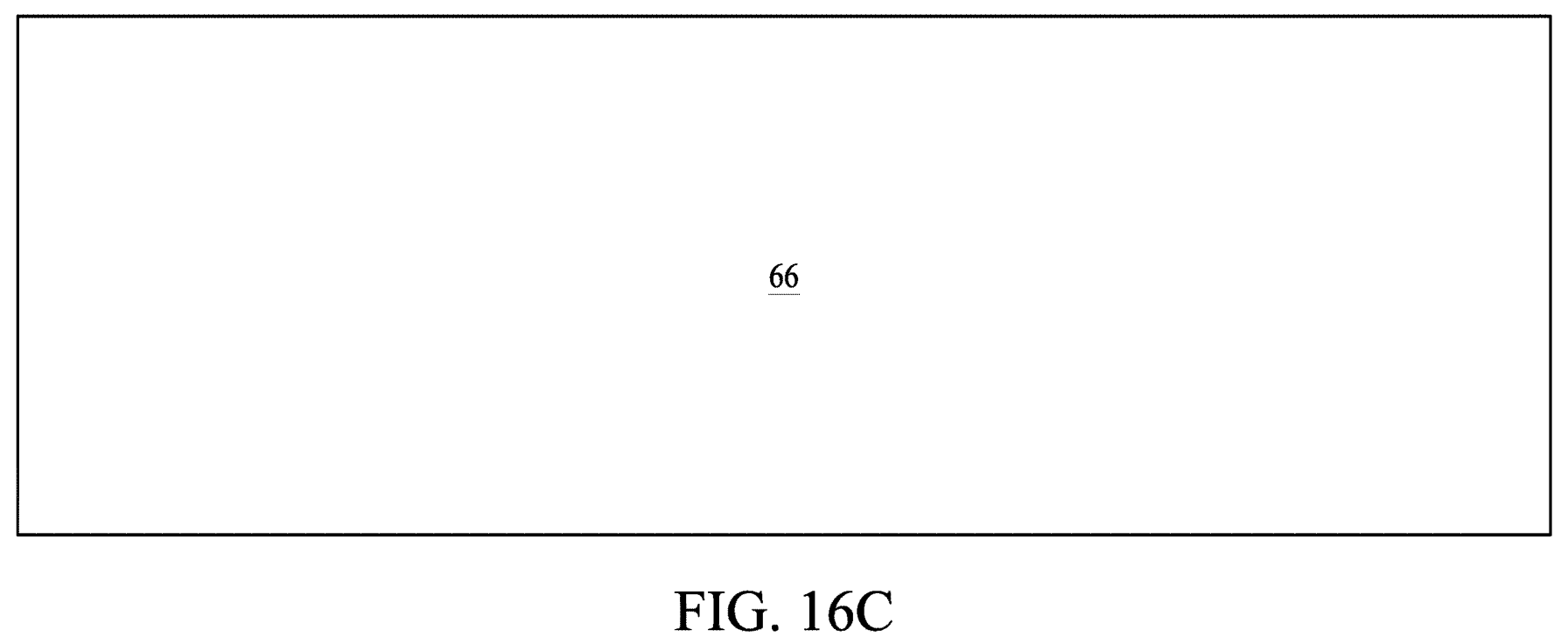

FIGS. 16A, 16B, and 16C illustrate the formation of a fill material 66 in the gate cut opening 60 where the section of the replacement gate structure was removed and in the recesses 64. The fill material 66 may be an insulating material. In some examples, fill material 66 may be a single insulating material, and in other examples, fill material 66 may include multiple different insulating materials, such as in a multi-layered configuration. The fill material 66 may include or be silicon oxide, silicon nitride, silicon oxynitride, silicon carbide, silicon carbon nitride, the like, or a combination thereof, and may be deposited by CVD, PVD, ALD, or another deposition technique.

As shown in FIG. 16A, the fill material 66 is in contact with the bottom of the recess 64, which is a top surface of the semiconductor substrate 20. One or more horns 63 (or horns 65) may extend from the top surface of the semiconductor substrate 20, and the fill material 66 surrounds the horns 63 (or horns 65). In some embodiments, the fill material 66 is in contact with all side surfaces of the horns 63 (or horns 65). In other words, the fill material 66 may surround the horns 63 (or horns 65). The fill material 66 is also in contact with the top surface 27 of the semiconductor substrate 20, the sidewalls of the semiconductor substrate 20, and the sidewalls of the isolation regions 26.

The processes described in FIGS. 1-16C illustrate the formation of gate cut-fill structures 50 and the fill material 66 in the gate electrode 48. In other words, the gate electrode 48 is formed first, and the gate cut-fill structures 50 and the fill material 66 are then formed in the gate electrode 48. In some embodiments, the gate cut-fill structures 50 and the fill material 66 are formed in the dummy gate 30. For example, openings are formed in the dummy gate 30 and the interfacial dielectrics 28, and the gate cut-fill structures 50 are formed in the openings. Then, openings and a recess, such as the openings 54 and 60 and the recess 64, are formed in the dummy gate and the interfacial dielectrics 28, and the fill material 66 is formed in the openings and the recess. After the formation of the gate cut-fill structures 50 and the fill material 66 in the dummy gate 30, the replacement gate process is performed, i.e., removing the dummy gate 30, and forming the gate dielectric layer 44, the one or more optional conformal layers 46, and the gate electrode 48. Because the gate cut-fill structures 50 and the fill material 66 are made of dielectric materials, the gate cut-fill structures 50 and the fill material 66 are not substantially affected during the removal of the dummy gate 30.

Figure 17A:
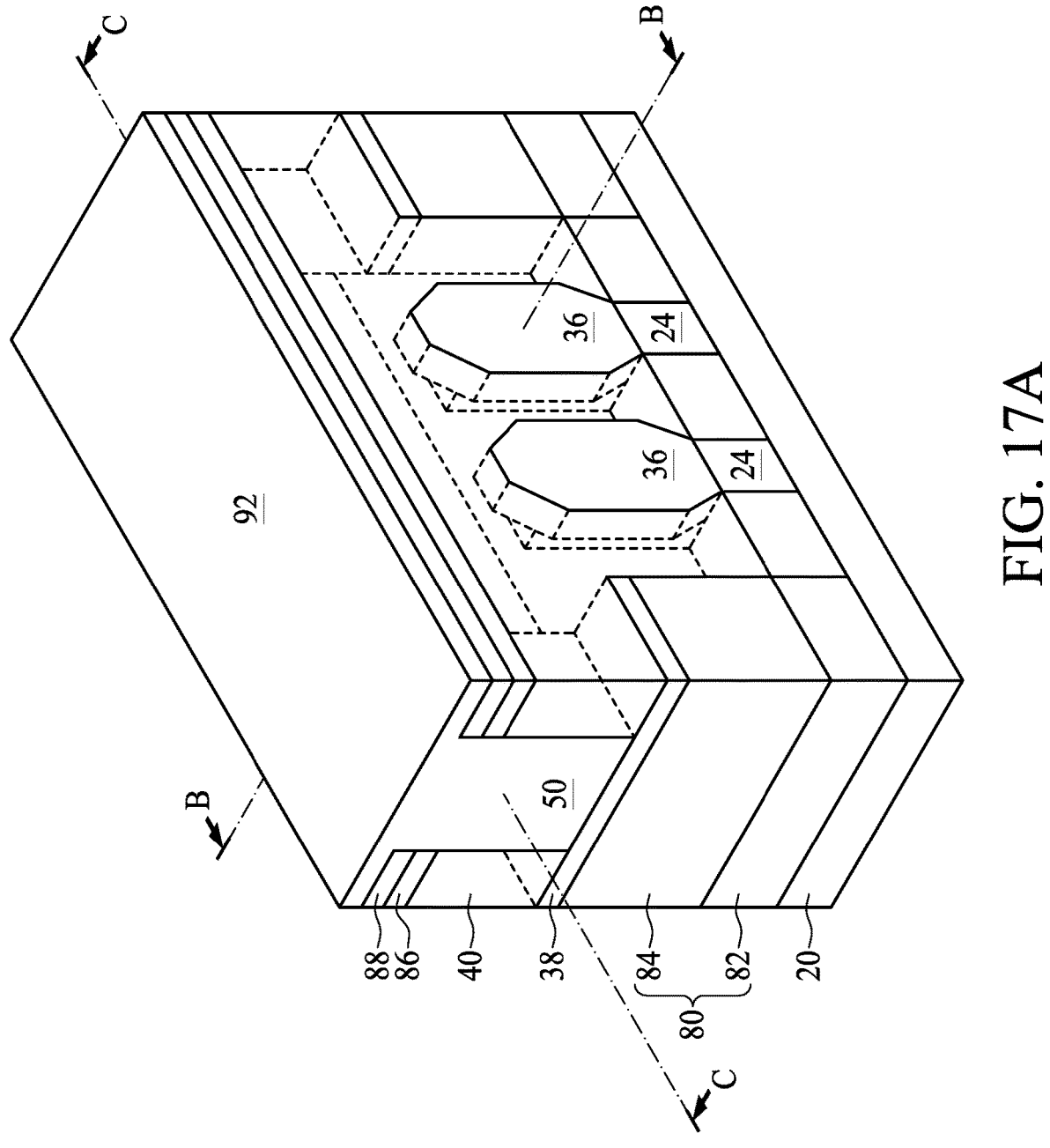

FIGS. 17A-21A are perspective views of respective intermediate structures at intermediate stages in an example process of forming a semiconductor device structure including one or more FinFETs, in accordance with some embodiments. FIGS. 17B-21B are cross-sectional views of respective intermediate structures at intermediate stages in the example process of FIGS. 17A-21A, in accordance with some embodiments. FIGS. 17C-21C are cross-sectional views of respective intermediate structures at intermediate stages in the example process of FIGS. 17A-21A, in accordance with some embodiments. FIG. 17A illustrates cross-sections B-B and C-C. The following figures (to FIGS. 21A-C) ending with a "B" designation illustrate cross-sectional views at various instances of processing corresponding to cross-section B-B, and the following figures (to FIGS. 21A-C) ending with a "C" designation illustrate cross-sectional views at various instances of processing corresponding to cross-section C-C. In some figures, some reference numbers of components or features illustrated therein may be omitted to avoid obscuring other components or features; this is for ease of depicting the figures.

Figure 17B:
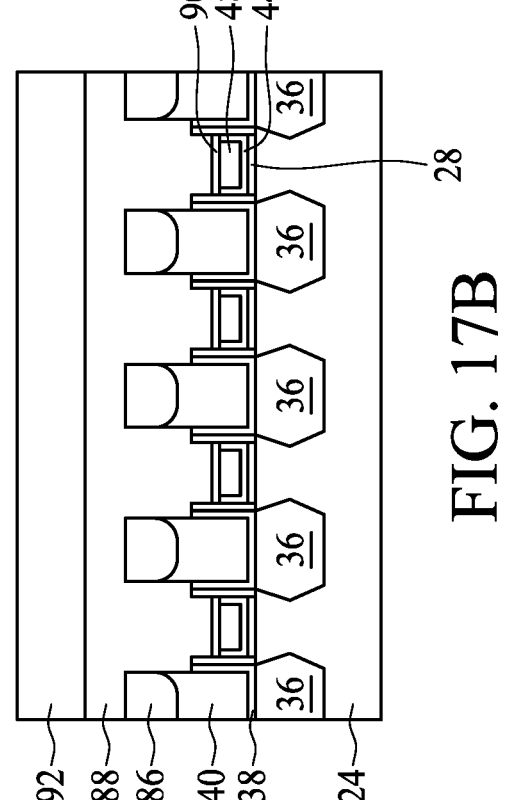
Figure 17C:
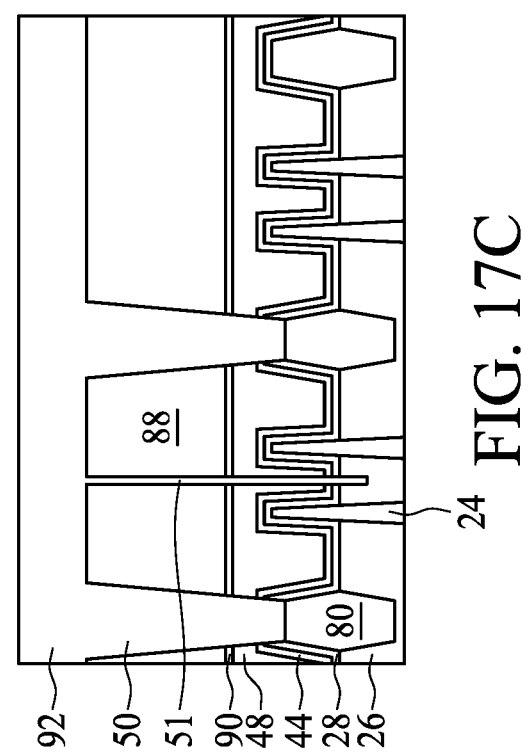
Figures 1, 17C:
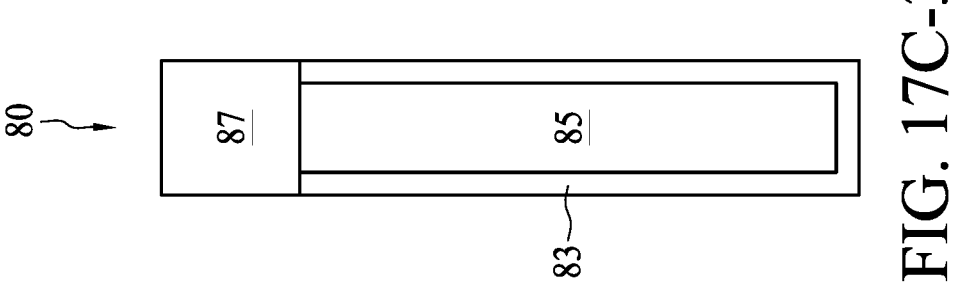
Figures 2, 17C:
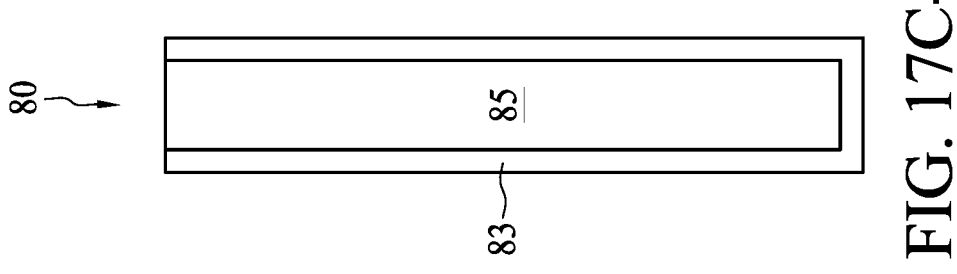

As shown in FIGS. 17A-C, the intermediate structure includes the semiconductor substrate 20, the fins 24 extending from the substrate 20, the source/drain regions 36 formed from the recessed fins 24, the CESL 38 formed over the source/drain regions 36, and the ILD 40 formed on the CESL 38. The intermediate structure further includes the interfacial dielectrics 28 formed on the fins 24, the gate dielectric layer 44 formed on the interfacial dielectrics 28, and the gate electrode 48 formed on the gate dielectric layer 44. In some embodiments, the gate electrode 48 is a work function metal. In some embodiments, dielectric features 80 are formed between source/drain regions 36 and extending into the channel regions, as shown in FIGS. 17A and 17C. In some embodiments, each dielectric feature 80 includes a lower portion 82 and an upper portion 84. In some embodiments, the lower portion 82 and the upper portion 84 include different dielectric materials. For example, the lower portion 82 may include SiN, and the upper portion 84 may include a high-k dielectric material. The dielectric feature 80 may include a different material or a different combination of materials and may have any suitable shape. The dielectric features 80 may be formed after forming the insulating material but prior to recessing the insulating material to form the isolation regions 26, as described in FIGS. 3A and 3B. For example, openings are formed in the insulating material, and the dielectric features 80 are formed in the openings. The materials of the dielectric features 80 may be different from the isolation regions 26.

Figures 3, 17C:
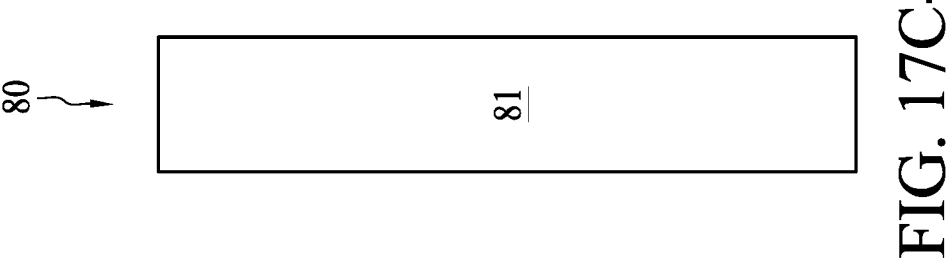

FIGS. 17C-1, 17C-2, 17C-3 illustrate various examples of the dielectric features 80. As shown in FIG. 17C-1, in some embodiments, the dielectric feature 80 includes a single dielectric material 81. The dielectric material 81 may include any suitable dielectric material. In some embodiments, the dielectric material 81 includes a material different from the material of the isolation regions 26. As shown in FIG. 17C-2, in some embodiments, the dielectric feature 80 includes a liner 83 and a fill 85 formed on the liner 83. The liner 83 may include silicon nitride, silicon carbonitride, or other suitable dielectric material. The fill 85 may include an oxide formed by FCVD or other suitable dielectric material. In some embodiments, the dielectric feature 80 includes the liner 83, the fill 85, and a cap 87 formed on the liner 83 and the fill 85, as shown in FIG. 17C-3. The cap 87 may include a high-k dielectric material, such as hafnium oxide or other suitable high-k dielectric material.

Referring back to FIGS. 17A and 17B, a hard mask 86 is formed on the ILD 40. The hard mask 86 may include a dielectric material having different etch selectivity from the ILD 40. In some embodiments, the hard mask 86 includes silicon nitride. The hard mask 86 may be formed by recessing the ILD 40, forming the hard mask 86 in the recess, and performing a planarization process to expose the dummy gate stack prior to the replacement gate process. In some embodiments, a conductive layer 90 is formed on the gate electrode 48, and a layer 88 is formed on the conductive layer 90. The conductive layer 90 may be a metal, such as a tungsten, for example fluorine-free tungsten. The layer 88 may include amorphous silicon.

As shown in FIGS. 17A and 17C, the gate cut-fill structures 50 are formed in the layer 88, the conductive layer 90, the gate electrode 48, the gate dielectric layer 44, and the interfacial dielectrics 28, and the gate cut-fill structures 50 are in contact with corresponding dielectric feature 80, as shown in FIGS. 17A and 17C. In some embodiments, a thin gate cut-fill structure 51 is formed at a location without the dielectric feature 80, and the thin gate cut-fill structure 51 extends into the isolation region 26, as shown in FIG. 17C. The gate cut-fill structure 51 may include the same material as the gate cut-fill structure 50 and may be formed by the same process as the gate cut-fill structure 50. A hard mask 92 is formed on the layer 88 and the gate cut-fill structures 50, 51. In some embodiments, the hard mask 92 and the gate cut-fill structures 50, 51 are monolithic. In other words, the hard mask 92 and the gate cut-fill structures 50, 51 are formed at the same time by the same process and include the same material. In some embodiments, the hard mask 92 is a separate layer formed on the layer 88 and the gate cut-fill structures 50, 51. The hard mask 92 may include a material different from the gate cut-fill structures 50, 51. The hard mask 92 may have a thickness ranging from about 60 nm to about 80 nm.

Figure 18A:
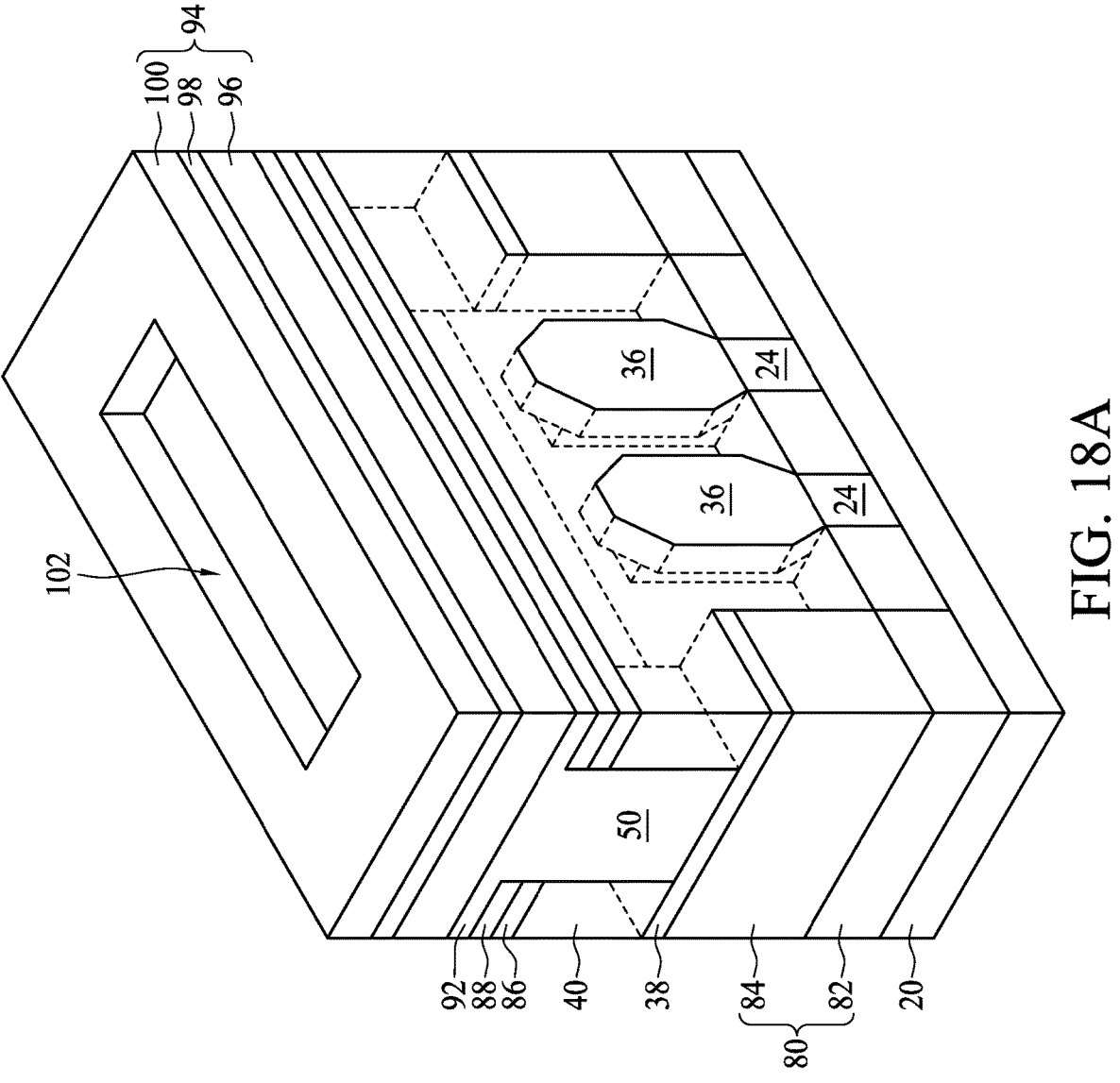
Figures 18B, 18C:
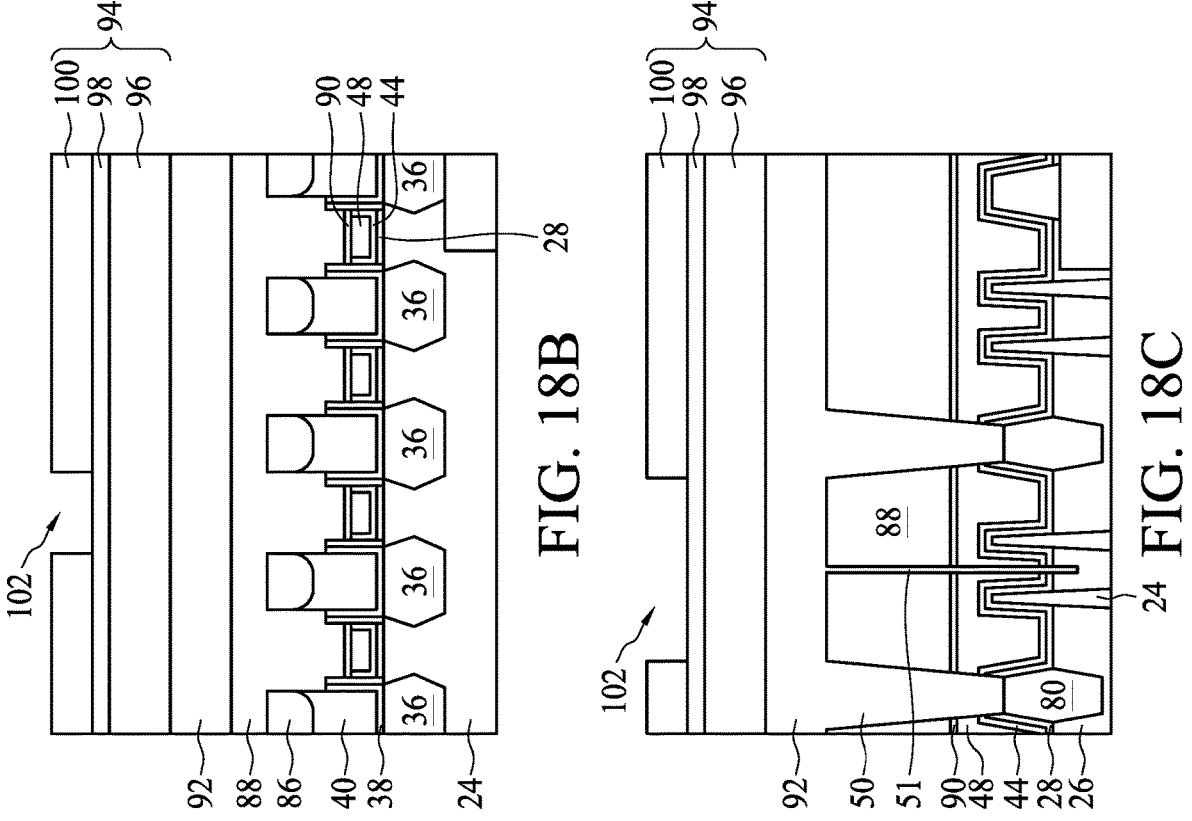

As shown in FIGS. 18A-C, a mask structure 94 is formed on the hard mask 92. In some embodiments, the mask structure 94 is a tri-layer photoresist. For example, the mask structure 94 may include a bottom layer 96 and a middle layer 98 disposed on the bottom layer 96. The bottom layer 96 and the middle layer 98 are made of different materials such that the optical properties and/or etching properties of the bottom layer 96 and the middle layer 98 are different from each other. In some embodiments, the bottom layer 96 may be a carbon layer, and the middle layer 98 may be a silicon-rich layer designed to provide an etch selectivity between the middle layer 98 and the bottom layer 96. The mask structure 94 further includes a photoresist layer 100 that may be a chemically amplified photoresist layer and can be a positive tone photoresist or a negative tone photoresist. The photoresist layer 100 may include a polymer, such as phenol formaldehyde resin, a poly(norbornene)-co-malaic anhydride (COMA) polymer, a poly(4-hydroxystyrene) (PHS) polymer, a phenol-formaldehyde (bakelite) polymer, a polyethylene (PE) polymer, a polypropylene (PP) polymer, a polycarbonate polymer, a polyester polymer, or an acrylate-based polymer, such as a poly (methyl methacrylate) (PMMA) polymer or poly (methacrylic acid) (PMAA). The photoresist layer 100 may be formed by spin-on coating. The photoresist layer 100 may be patterned to have an opening 102 formed therein.

Figure 19A:
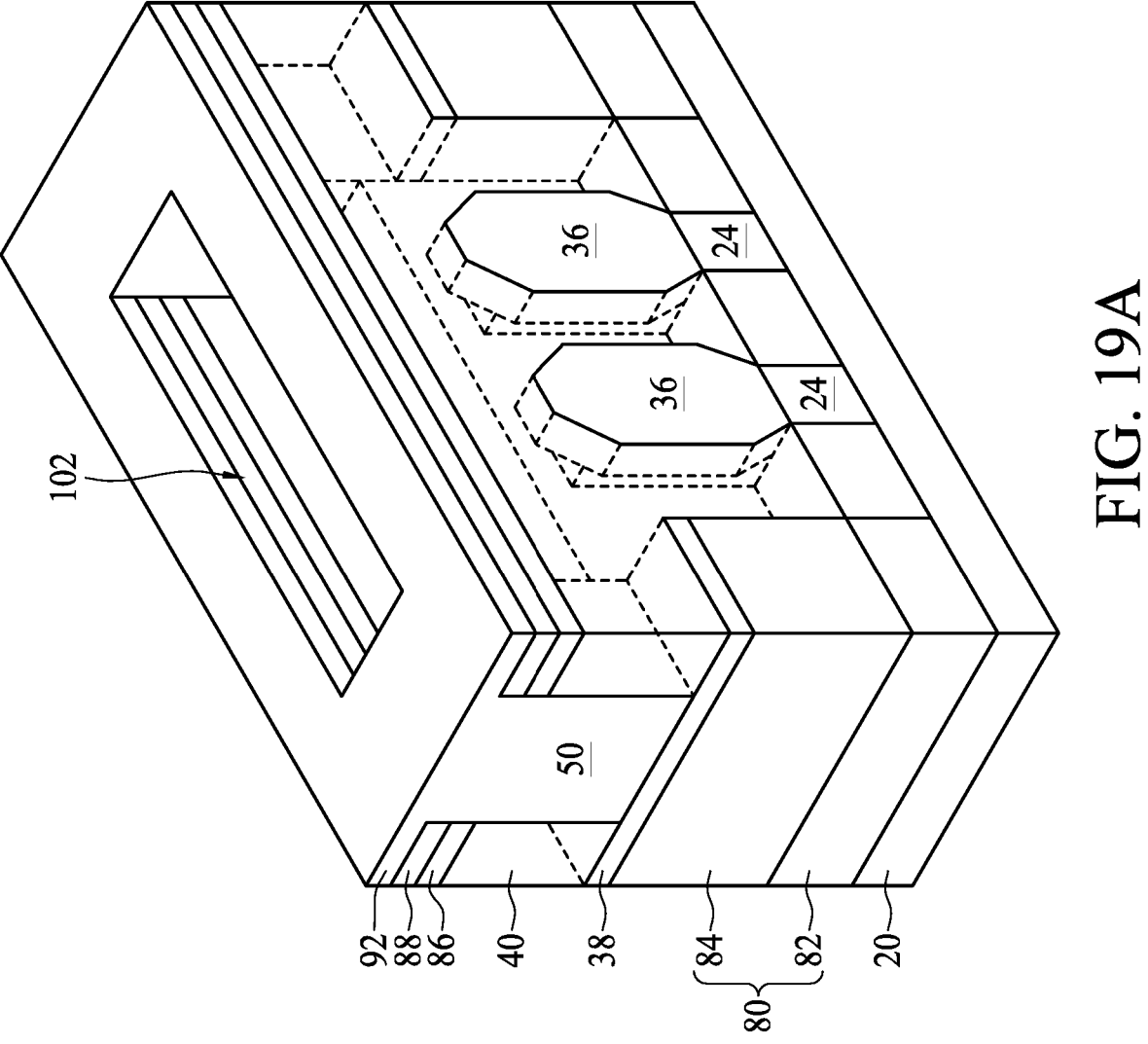
Figures 19B, 19C:
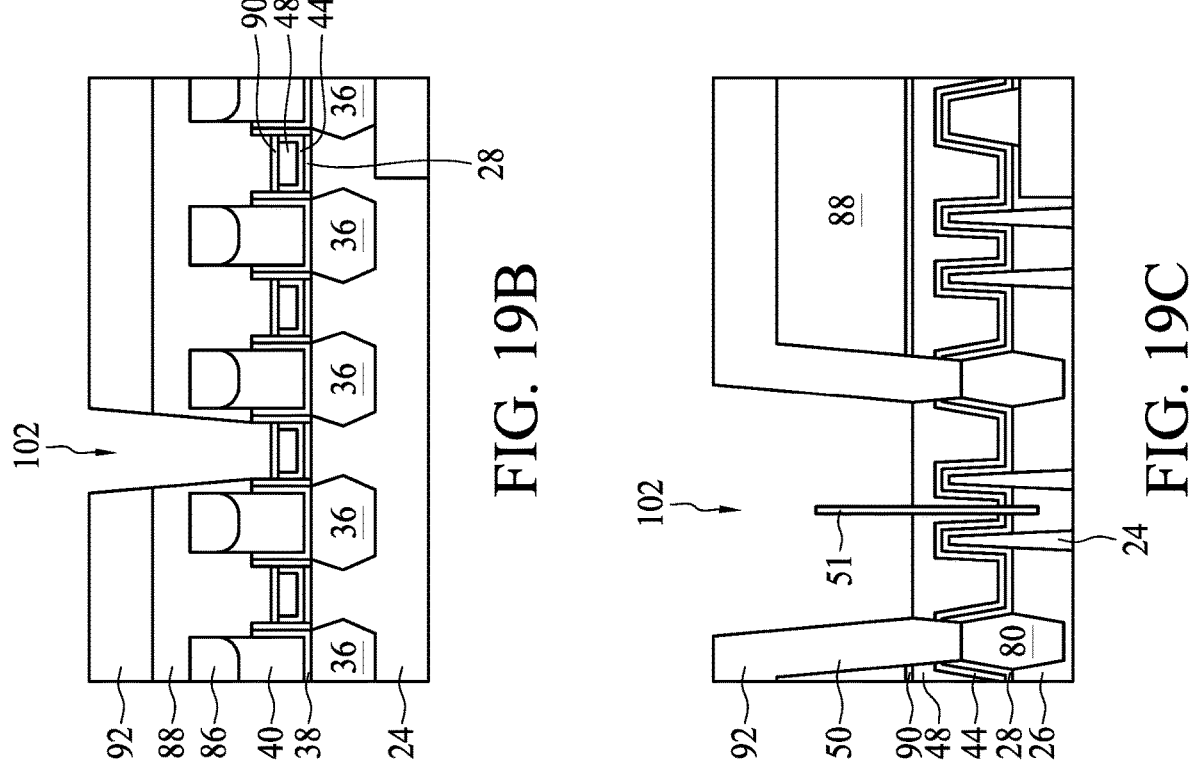

As shown in FIGS. 19A-C, the opening 102 is extended into the middle layer 98, the bottom layer 96, the hard mask 92, and the layer 88. The mask structure 94 may be removed after the opening 102 is extended into the layer 88. In some embodiments, the conductive layer 90 is also removed, and the gate electrode 48 is exposed in the opening 102. In some embodiments, a portion of the gate cut-fill structure 51 is removed, as shown in FIG. 19C.

Figure 20A:
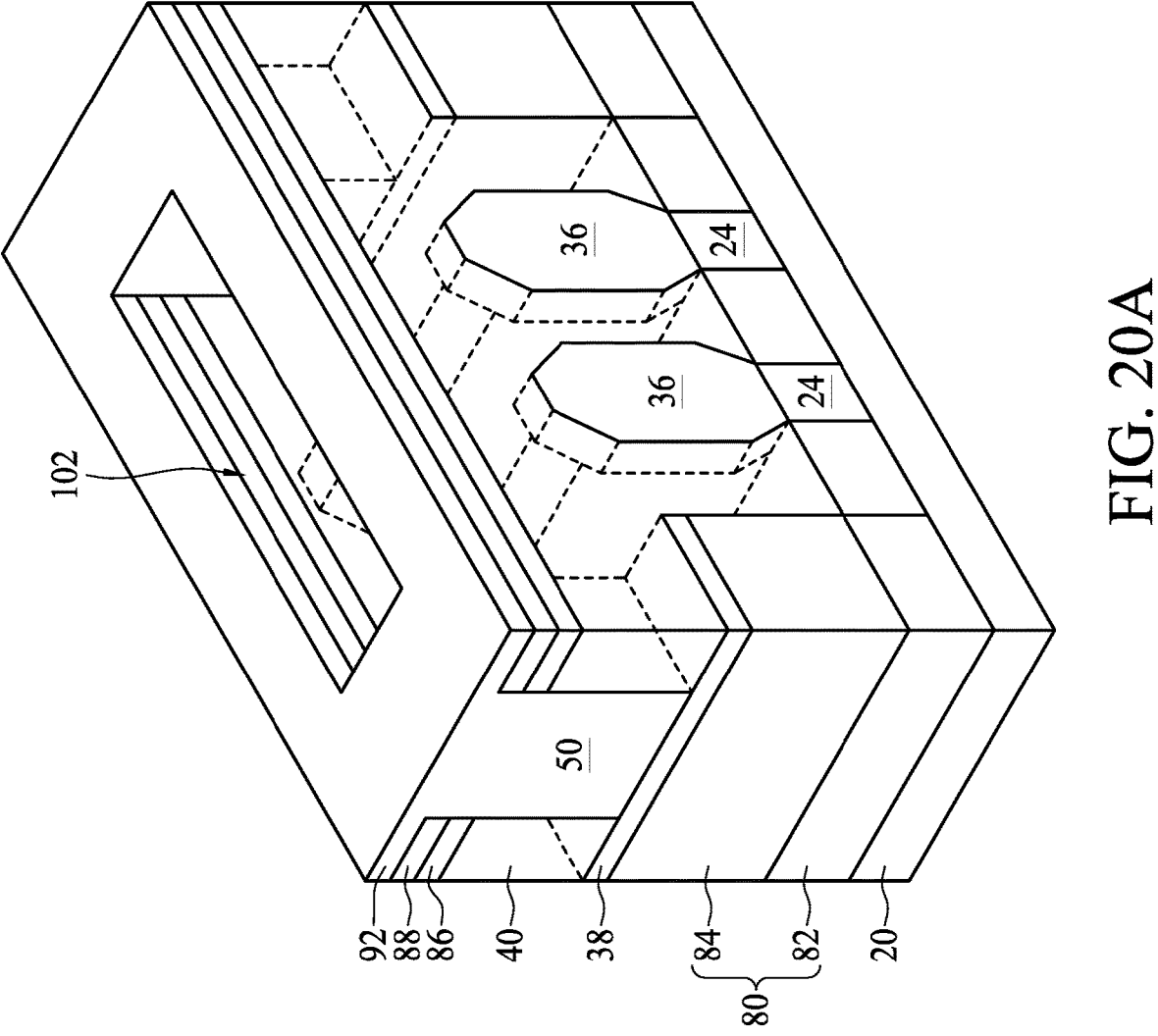
Figures 20B, 20C:
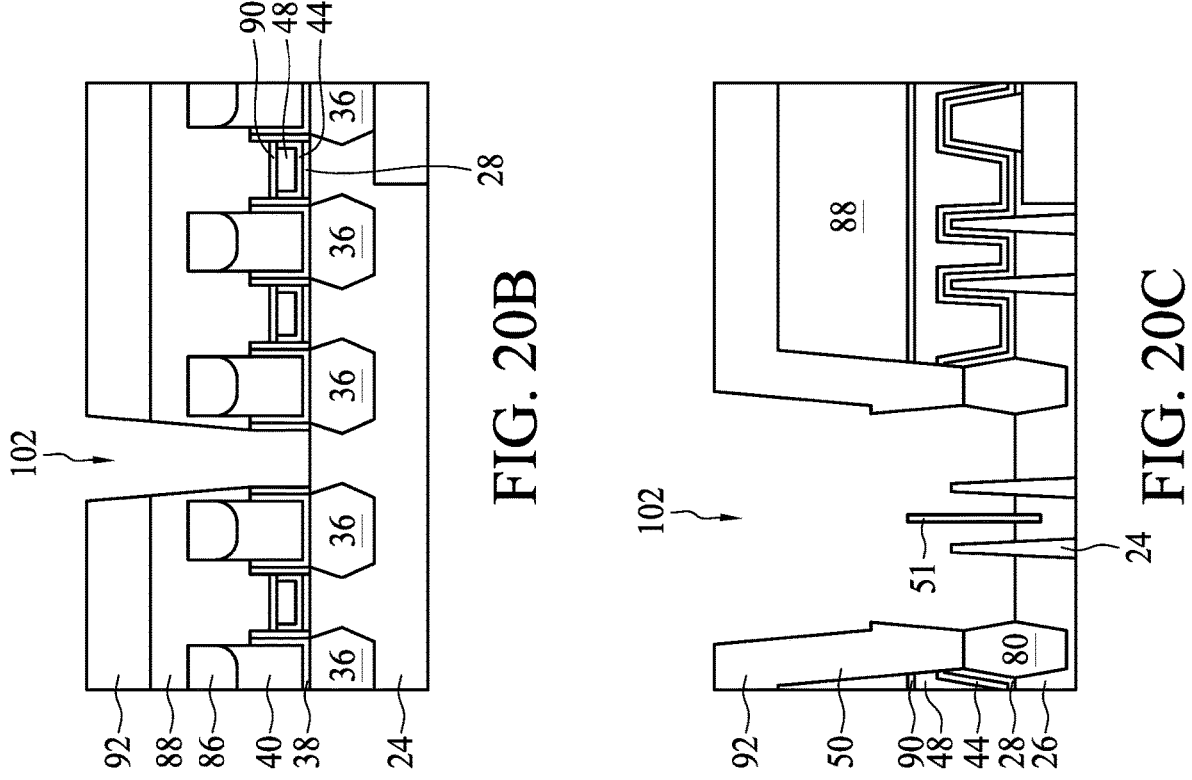

As shown in FIGS. 20A-C, the exposed gate electrode 48 is removed. In some embodiments, portions of the gate dielectric layer 44 and the interfacial dielectrics 28 are also removed, and one or more fins 24 are exposed in the opening 102. The exposed gate electrode 48, the portions of the gate dielectric layer 44, and the portions of the interfacial dielectrics 28 may be removed by the one or more etch processes described in FIGS. 11A-C. In some embodiments, a portion of the gate cut-fill structure 51 is removed, as shown in FIG. 20C. In some embodiments, the opening 102 may be the openings 54 and 60 shown in FIGS. 11A-C.

Figure 21A:
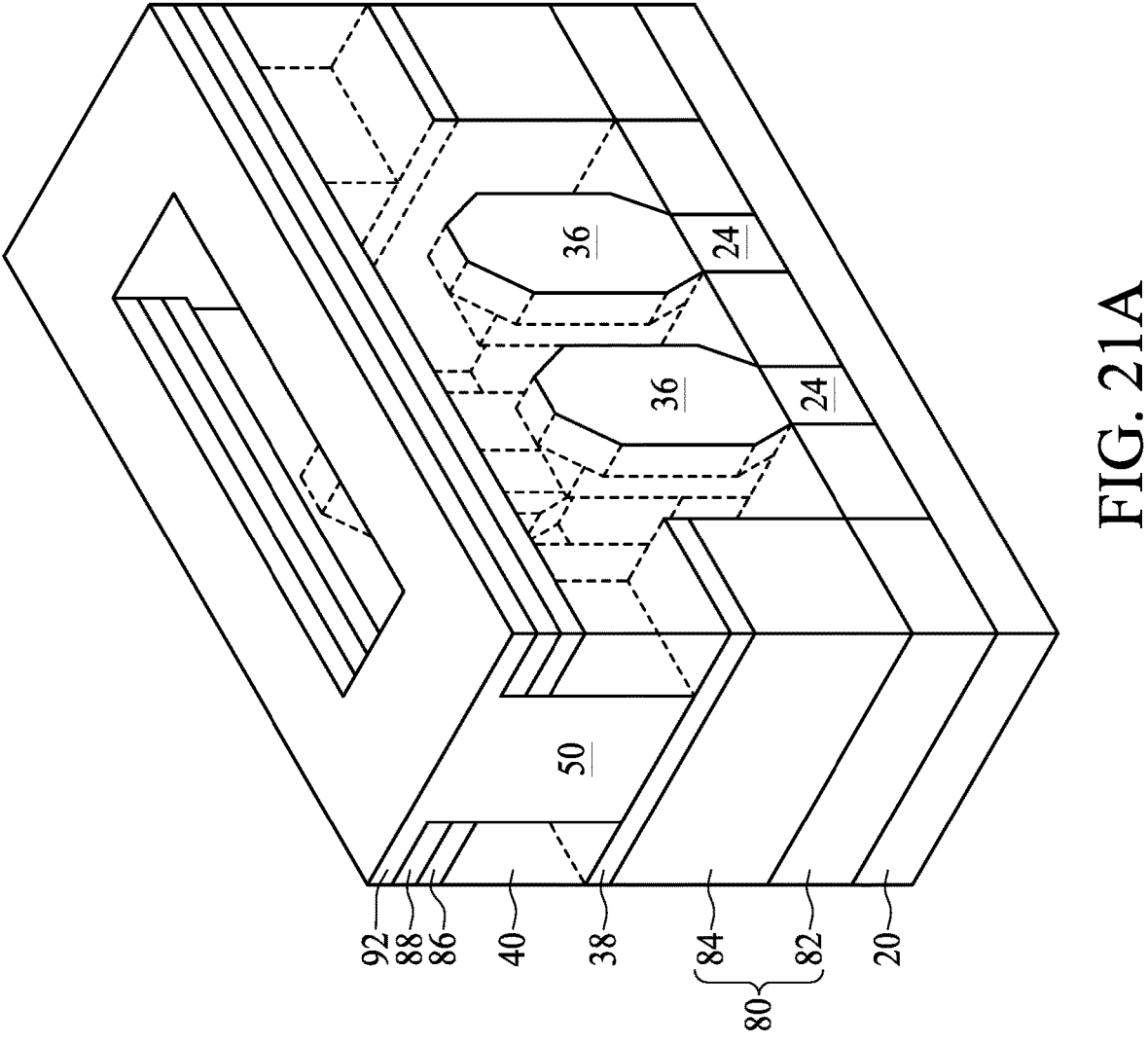
Figures 21B, 21C:
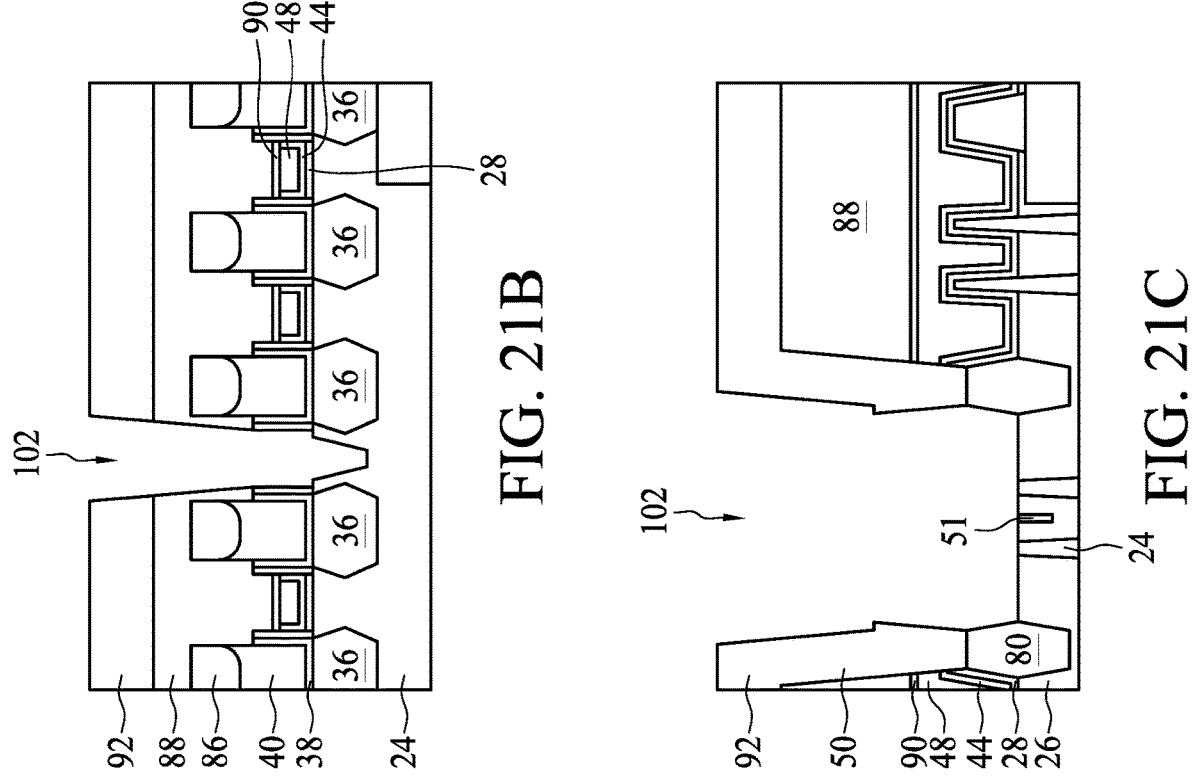

As shown in FIGS. 21A-C, the exposed portions of the fins 24 in the opening 102 are removed. The exposed portions of the fins 24 in the opening 102 may be removed by one or more etch processes. In some embodiments, the one or more etch processes may be the one or more etch processes to trim the fins 24 as described in FIGS. 12A-C. As shown in FIG. 21C, the exposed portion of the gate cut-fill structure 51 in the opening 102 is also removed.

Figures 22A, 22B:
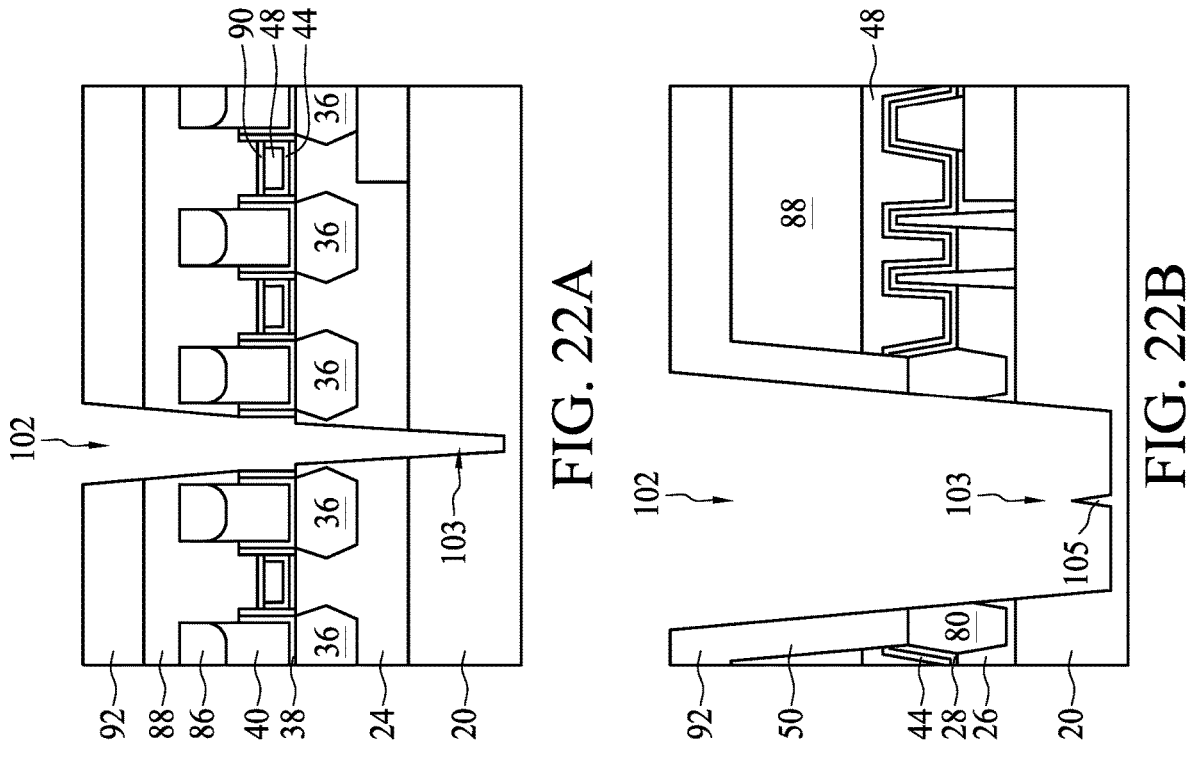
FIGS. 22A-B are cross-sectional views of the intermediate structure at one of the intermediate stages in the example process of FIGS. 17A-21A, in accordance with some embodiments.

FIGS. 22A-B are cross-sectional views of the intermediate structure at one of the intermediate stages in the example process of FIGS. 17A-21A, in accordance with some embodiments. FIG. 22A illustrates a cross-sectional view at one of various instances of processing corresponding to cross-section B-B of the intermediate structure shown in FIG. 17A, and FIG. 22B is a cross-sectional view at one of various instances of processing corresponding to cross-section C-C of the intermediate structure shown in FIG. 17A. As shown in FIGS. 22A-B, a recess 103 is formed in the opening 102. The recess 103 may be formed by the same process for forming the recess 64 as described in FIGS. 13A-15C. In other words, the remaining fins 24 in the opening 102, the isolation regions 26 around the remaining fins 24, and the portions of the semiconductor substrate 20 located under the isolation regions 26 are removed by the processes described in FIGS. 13A-C, 14A-C, and 15A-C. In some embodiments, the gate cut-fill structure 51 is also removed, as shown in FIG. 22B. In some embodiments, a horn 105 is formed at the bottom of the recess 103. The horn 105 extends from a top surface of the semiconductor substrate 20 in the recess 103. The horn 105 may be the horn 63 shown in FIG. 15A. By removing the isolation regions 26 and the portions of the semiconductor substrate 20 located under the isolation regions 26, current leakage is reduced. Furthermore, the reduced number of horns 105 also leads to reduced current leakage.

Figures 23A, 23B:
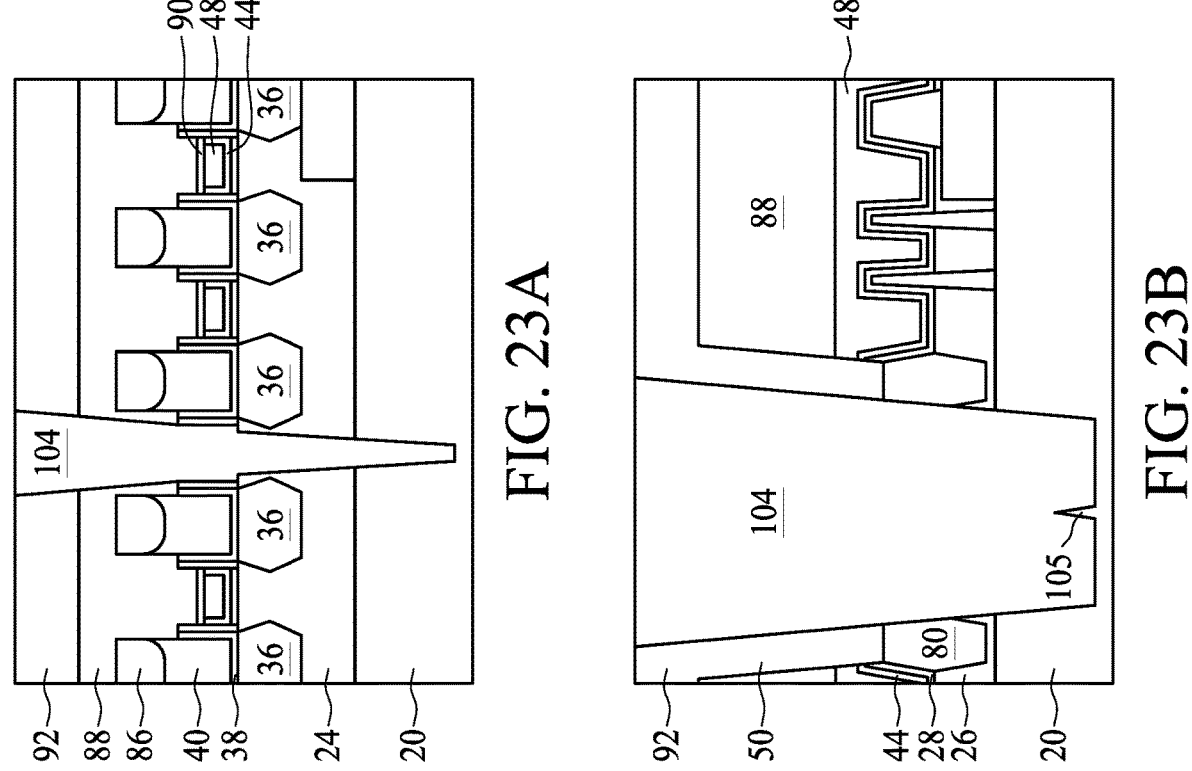
FIGS. 23A-B are cross-sectional views of the intermediate structure at one of the intermediate stages in the example process of FIGS. 17A-21A, in accordance with some embodiments.

As shown in FIGS. 23A-B, a fill material 104 is formed in the recess 103 and the opening 102. The fill material 104 may include the same material as the fill material 66 and may be formed by the same process as the fill material 66.

FIGS. 24A-D are cross-sectional views of respective intermediate structures at intermediate stages in the example process of FIGS. 17A-21A, in accordance with alternative embodiments. As shown in FIG. 24A, the opening 102 is formed, and one fin 24 is exposed in the opening 102, instead of two fins 24 shown in FIG. 20C. Next, as shown in FIG. 24B, the exposed portion of the fin 24 in the opening 102 is removed. The remaining fin 24 and the isolation regions 26 around the remaining fin 24 are removed to from the recess 103, as shown in FIG. 24C. As described in FIG. 15A, horns 63 (or horns 105) are located between pair of fins 24. Thus, there is no horn 63 (or horn 105) formed in the recess 103, because only one fin 24 was removed. Next, the fill material 104 is formed in the recess 103 and the opening 102. The processes for forming the opening 102 and the recess 103 shown in FIGS. 24A-C may be the same as the processes described in FIGS. 20A-22B.

Figures 25A, 25B, 25C, 25D:
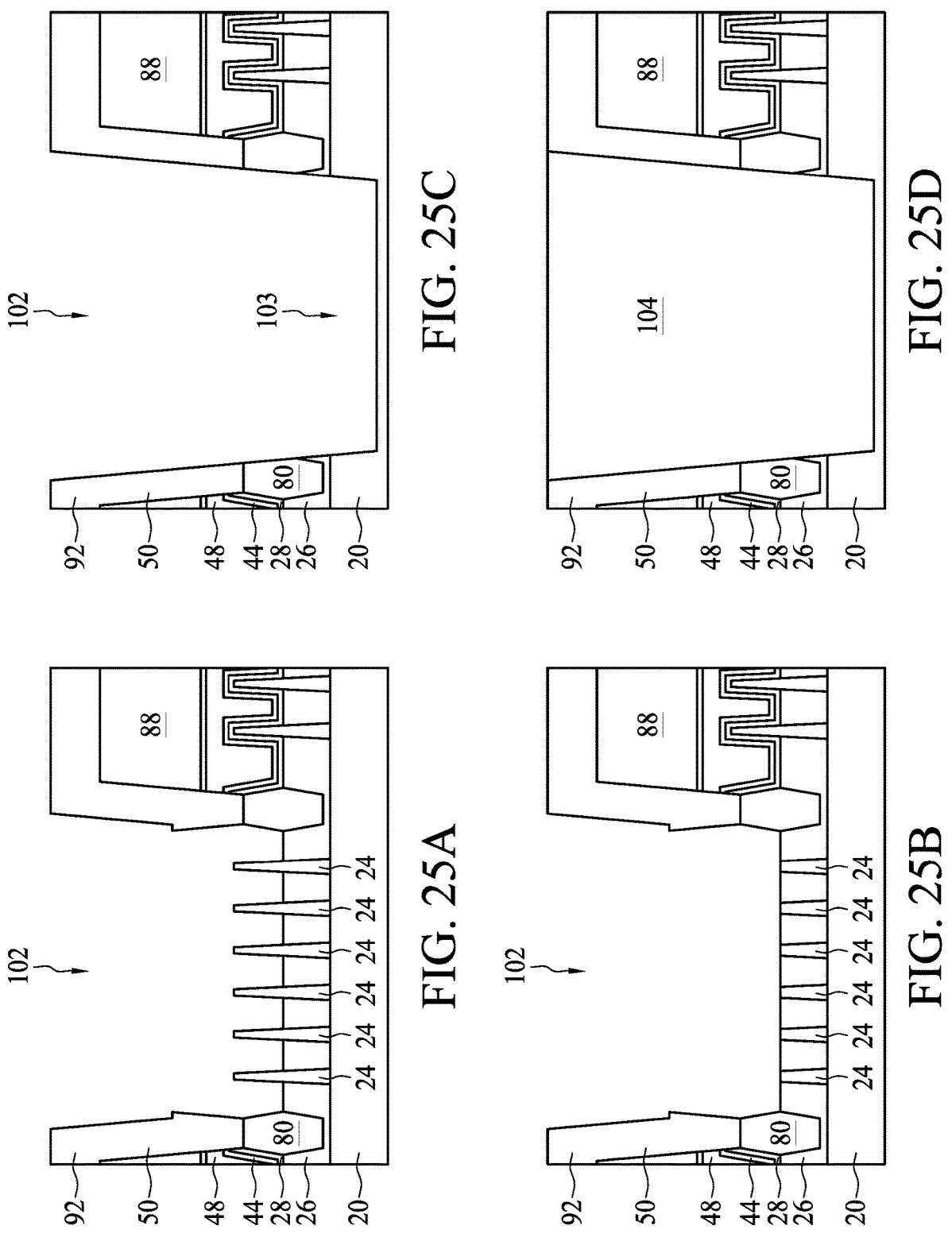
FIGS. 25A-D are cross-sectional views of respective intermediate structures at intermediate stages in the example process of FIGS. 17A-21A, in accordance with alternative embodiments.

FIGS. 25A-D are cross-sectional views of respective intermediate structures at intermediate stages in the example process of FIGS. 17A-21A, in accordance with alternative embodiments. As shown in FIG. 25A, the opening 102 is formed, and more than two fins 24 are exposed in the opening 102, instead of two fins 24 shown in FIG. 20C. In some embodiments, six fins 24 are exposed. The number of fins 24 exposed in the opening 102 may be any suitable number, such as one as shown in FIG. 24A, two as shown in FIG. 20C, or more than two as shown in FIG. 25A. Next, as shown in FIG. 25B, the exposed portions of the fins 24 in the opening 102 are removed. The remaining fins 24 and the isolation regions 26 around the remaining fins 24 are removed to from the recess 103, as shown in FIG. 25C. In some embodiments, when more than two fins 24 are removed, the horns 63 (or horn 105) may not be formed in the recess 103. Next, the fill material 104 is formed in the recess 103 and the opening 102. The processes for forming the opening 102 and the recess 103 shown in FIGS. 25A-C may be the same as the processes described in FIGS. 20A-22B.

The processes described in FIGS. 17A-25D illustrate the formation of gate cut-fill structures 50 and the fill material 104 in the gate electrode 48. In some embodiments, the gate cut-fill structures 50 and the fill material 104 are formed in the dummy gate 30.

Figure 26A:
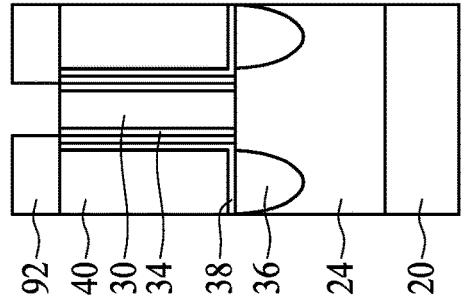
Figure 26B:
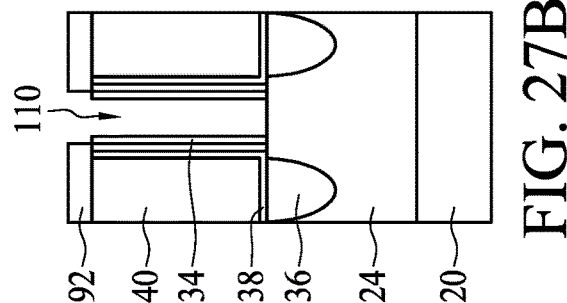

FIGS. 26A-29A are cross-sectional views of respective intermediate structures at intermediate stages in an example process, in accordance with some embodiments. FIGS. 26B-29B are cross-sectional views of respective intermediate structures at intermediate stages in the example process of FIGS. 26A-29A, in accordance with some embodiments. As shown in FIGS. 26A-B, the fins 24 are formed over the semiconductor substrate 20, isolation regions 26 are formed around the fins 24, the dielectric features 80 are formed in the isolation regions 26, the dummy gate 30 is formed over the dielectric features 80 and the fins 24, gate spacers 34 are formed along the sidewalls of the dummy gate 30, the source/drain regions 36 are formed on opposite sides of the dummy gate 30, the CESL 38 is formed on the source/drain regions 36, the ILD 40 is formed on the CESL 38, the gate cut-fill structures 50 are formed in the dummy gate 30, and the hard mask 92 is formed on the gate cut-fill structures 50. As shown in FIG. 26B, each gate spacer 34 includes two dielectric layers. An opening is formed in the hard mask 92, and a portion of the dummy gate 30 is exposed. Some features, such as interfacial dielectrics 28, are omitted from the FIGS. 26A-B for the purpose of clarity of the figures.

Figure 27A:
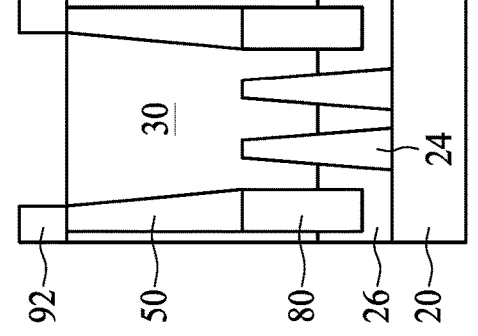
Figure 27B:
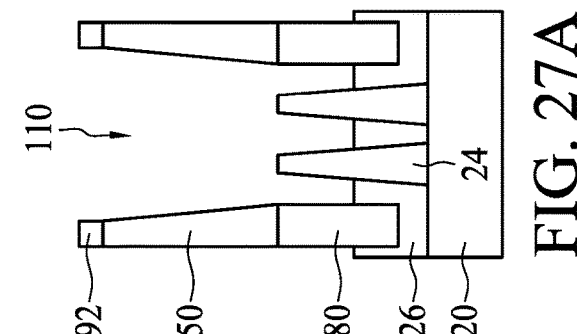

Next, as shown in FIGS. 27A-B, the exposed portion of the dummy gate 30 is removed, and an opening 110 is formed between adjacent gate cut-fill structures 50. The removal of the exposed portion of the dummy gate 30 may be performed by any suitable process. In some embodiments, a selective etch process is performed to remove the portion of the dummy gate 30, while the hard mask 92, the gate cut-fill structures 50, the fins 24, and the isolation regions 26 are not substantially affected. One or more fins 24 (two are shown) are exposed in the opening 110.

As shown in FIGS. 28A-B, the exposed fins 24 are trimmed to form the trimmed fins 24'. The exposed fins 24 may be trimmed by any suitable process. In some embodiments, the processes described in FIG. 12A are performed to form the trimmed fins 24'. Next, as shown in FIGS. 29A-B, portions of the trimmed fins 24' and the isolation regions 26 around the trimmed fins 24' are removed to form a recess 112. The recess 112 may be formed by the same processes that form the recess 64 as described in FIG. 15A-1. The trimmed fins 24' may be completed removed, or a portion of each trimmed fin 24' may remain, as shown in FIG. 29A. As described above, the remaining trimmed fins 24', which may be the horns 65 (FIG. 15A-1), may help to reduce current leakage.

Subsequent processes, such as forming the fill material 66 in the opening 110 and the recess 112, removing the remaining portions of the dummy gate 30, and forming the gate electrode 48, may be performed.

The present disclosure provides a method for forming a semiconductor device structure. The method includes removing a portion of a gate electrode 48 (or dummy gate 30) to expose one or more fins 24, trimming the one or more fins 24, and removing the trimmed fins 24', the isolation regions 26 around the trimmed fins 24, and portions of the semiconductor substrate 20 located under the isolation regions 26 that were removed. Some embodiments may achieve advantages. For example, by removing the isolation regions 26 and the portions of the semiconductor substrate 20 located thereunder, current leakage is reduced. Furthermore, the number of horns 63 (or horns 65) are reduced as a result of the removal of the isolation regions 26, which further reduces current leakage.

An embodiment is a semiconductor device structure. The structure includes a fin disposed over a semiconductor substrate, and the fin has a first width. The structure further includes an isolation region disposed around the fin, a gate electrode disposed over the fin and the isolation region, and a fill material disposed in the gate electrode. The fill material is in contact with a top surface of a portion of the semiconductor substrate, the top surface has at least a portion having a substantially flat cross-section, and the portion of the top surface has a second width substantially greater than the first width.

Another embodiment is a method. The method includes forming a plurality of fins from a semiconductor substrate, forming isolation regions around each fin of the plurality of fins, depositing a gate electrode over the plurality of fins, removing a portion of the gate electrode to expose one or more fins of the plurality of fins, trimming the exposed one or more fins of the plurality of fins to form one or more trimmed fins, removing the one or more trimmed fins, removing the isolation regions around the one or more trimmed fins, and removing portions of the semiconductor substrate located under the removed isolation regions.

A further embodiment is a method. The method includes forming a plurality of fins from a semiconductor substrate, forming isolation regions around each fin of the plurality of fins, depositing a dummy gate over the plurality of fins, removing a portion of the dummy gate to expose one or more fins of the plurality of fins, trimming the exposed one or more fins of the plurality of fins to form one or more trimmed fins, and performing a selective etch process to remove at least a portion of the one or more trimmed fins, the isolation regions around the one or more trimmed fins, and portions of the semiconductor substrate located under the removed isolation regions. The selective etch process etches the isolation regions at a faster rate than the one or more trimmed fins and the portions of the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
   forming a plurality of fins from a semiconductor substrate;
   forming isolation regions around each fin of the plurality of fins;
   depositing a gate electrode over the plurality of fins;
   removing a portion of the gate electrode to expose one or more fins of the plurality of fins;
   trimming the exposed one or more fins of the plurality of fins to form one or more trimmed fins;
   removing the one or more trimmed fins;
   removing the isolation regions around the one or more trimmed fins; and
   removing portions of the semiconductor substrate located under the removed isolation regions, wherein the removing the one or more trimmed fins, the removing the isolation regions around the one or more trimmed fins, and the removing the portions of the semiconductor substrate located under the removed isolation regions are performed by multiple cycles of processes, and each cycle of the multiple cycles of processes comprises forming a liner, performing a break through etch process, performing a semiconductor etch process, and performing a clean process.

2. The method of claim 1, wherein the removing the one or more trimmed fins, the removing the isolation regions around the one or more trimmed fins, and the removing the portions of the semiconductor substrate located under the removed isolation regions are performed by multiple etch processes.

3. The method of claim 2, wherein the multiple etch processes comprise a first selective etch process, a second selective etch process, and a third selective etch process.

4. The method of claim 1, comprising forming two gate cut-fill structures in the gate electrode, wherein the portion of the gate electrode is located between the two gate cut-fill structures.

5. The method of claim 1, further comprising forming dielectric features in the isolation regions.

6. A method, comprising:
   forming a plurality of fins from a semiconductor substrate;
   forming isolation regions around each fin of the plurality of fins;
   depositing a gate electrode over the plurality of fins;
   forming two gate cut-fill structures in the gate electrode;
   removing a portion of the gate electrode located between the two gate cut-fill structures to expose one or more fins of the plurality of fins;
   trimming the exposed one or more fins of the plurality of fins to form one or more trimmed fins, wherein top surfaces of the one or more trimmed fins are level with a top surface of one of the isolation regions; and
   forming a recess by removing the one or more trimmed fins, portions of the isolation regions around the one or more trimmed fins, and portions of the semiconductor substrate, wherein horns extends from a bottom of the recess.

7. The method of claim 6, wherein the recess is formed by multiple etch processes.

8. The method of claim 6, wherein the recess is formed by a selective etch process.

9. The method of claim 8, wherein the selective etch process etches the isolation regions at a faster rate than the one or more trimmed fins and the portions of the semiconductor substrate.

10. The method of claim 6, further comprising forming a liner on the sidewalls of the two gate cut-fill structures.

11. The method of claim 10, wherein the forming of the liner comprises:
   depositing the liner on the one or more trimmed fins, the portions of the isolation regions, and the sidewalls of the two gate cut-fill structures; and
   performing a break through etch process on the liner.

12. The method of claim 6, wherein the horns are located below the removed one or more trimmed fins.

13. The method of claim 6, wherein the horns are located between the removed one or more trimmed fins.

14. A method, comprising:
   forming two fins from a semiconductor substrate;
   forming an isolation region between the two fins;
   depositing a gate electrode over the two fins;
   removing a portion of the gate electrode to expose the two fins;
   trimming the two fins, wherein top surfaces of remaining portions of the two fins are level with a top surface of the isolation region;
   removing the remaining portions of the two fins;
   removing the isolation region; and
   removing portions of the semiconductor substrate, wherein a recess is formed in the semiconductor substrate, and one or more horns are formed at a bottom of the recess.

15. The method of claim 14, wherein the one or more horns comprise a single horn located between the removed two fins.

16. The method of claim 14, wherein the one or more horns comprise two horns aligned with the removed two fins.

17. The method of claim 14, wherein the removing the remaining portions of the two fins, the removing the isolation region, and the removing the portions of the semiconductor substrate are performed by multiple cycles of processes.

18. The method of claim 17, wherein each cycle of the multiple cycles of processes comprises forming a liner, performing a break through etch process, performing a semiconductor etch process, and performing a clean process.

19. The method of claim 14, wherein the removing the remaining portions of the two fins, the removing the isolation region, and the removing the portions of the semiconductor substrate are performed by a selective etch process.

20. The method of claim 19, wherein the selective etch process etches the isolation region at a faster rate than the remaining portions of the two fins and the portions of the semiconductor substrate.

* * * * *